US011086219B2

(12) United States Patent
Tanigaki et al.

(10) Patent No.: US 11,086,219 B2
(45) Date of Patent: Aug. 10, 2021

(54) NEGATIVE-TYPE PHOTOSENSITIVE RESIN COMPOSITION, CURED FILM, DISPLAY DEVICE THAT INCLUDES THE CURED FILM, AND PRODUCTION METHOD THEREFOR

(71) Applicant: TORAY INDUSTRIES, INC., Tokyo (JP)

(72) Inventors: Yugo Tanigaki, Otsu (JP); Daisuke Sakii, Otsu (JP); Satoshi Kamemoto, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 464 days.

(21) Appl. No.: 16/075,864

(22) PCT Filed: Mar. 15, 2017

(86) PCT No.: PCT/JP2017/010324
§ 371 (c)(1),
(2) Date: Aug. 6, 2018

(87) PCT Pub. No.: WO2017/169763
PCT Pub. Date: Oct. 5, 2017

(65) Prior Publication Data

US 2018/0356729 A1 Dec. 13, 2018

(30) Foreign Application Priority Data

Mar. 30, 2016 (JP) ............................ JP2016-066990

(51) Int. Cl.

| | |
|---|---|
| ***G03F 7/027*** | (2006.01) |
| ***G03F 7/032*** | (2006.01) |
| ***G03F 7/037*** | (2006.01) |
| ***H01L 51/50*** | (2006.01) |
| ***G03F 7/075*** | (2006.01) |
| ***G03F 7/105*** | (2006.01) |
| ***G03F 7/00*** | (2006.01) |
| ***H01L 27/32*** | (2006.01) |
| ***G03F 7/004*** | (2006.01) |
| ***H05B 33/22*** | (2006.01) |
| *H05K 3/28* | (2006.01) |

(52) U.S. Cl.
CPC ............ *G03F 7/037* (2013.01); *G03F 7/0007* (2013.01); *G03F 7/0046* (2013.01); *G03F 7/0047* (2013.01); *G03F 7/027* (2013.01); *G03F 7/032* (2013.01); *G03F 7/0757* (2013.01); *G03F 7/105* (2013.01); *H01L 27/3262* (2013.01); *H01L 51/50* (2013.01); *H05B 33/22* (2013.01); *H05K 3/287* (2013.01)

(58) Field of Classification Search
CPC ........ G03F 7/0007; G03F 7/027; G03F 7/028; G03F 7/031; G03F 7/032; G03F 7/033; G03F 7/034; G03F 7/037; G03F 7/105; G02B 5/201; G02B 5/223; G02F 1/133514; G02F 1/133516
USPC ........................... 430/7, 281.1; 349/106, 110
See application file for complete search history.

(56) References Cited

U.S. PATENT DOCUMENTS

| | | | | |
|---|---|---|---|---|
| 2004/0180286 | A1 | 9/2004 | Nagoya et al. | |
| 2010/0084172 | A1 | 4/2010 | Funaki et al. | |
| 2012/0141937 | A1 | 6/2012 | Lin et al. | |
| 2012/0161088 | A1 | 6/2012 | Choi et al. | |
| 2014/0353557 | A1 | 12/2014 | Yu et al. | |
| 2015/0028272 | A1* | 1/2015 | Tseng | G02F 1/133512 252/586 |
| 2015/0116234 | A1 | 4/2015 | Nasu et al. | |
| 2015/0132583 | A1 | 5/2015 | Pokorny et al. | |
| 2015/0153646 | A1* | 6/2015 | Hsieh | G03F 7/0388 252/586 |
| 2016/0139309 | A1 | 5/2016 | Hsu et al. | |
| 2017/0204215 | A1* | 7/2017 | Kurimoto | B32B 27/08 |

FOREIGN PATENT DOCUMENTS

| | | | |
|---|---|---|---|
| JP | 2003-280196 | A | 10/2003 |
| JP | 2009-133971 | A | 6/2009 |
| JP | 2010-106167 | A | 5/2010 |
| JP | 2012-212114 | A | 11/2012 |
| JP | 2013-213864 | A | 10/2013 |
| JP | 2014-122926 | A | 7/2014 |
| JP | 2016-98377 | A | 5/2016 |
| JP | 2017-78856 | A | 4/2017 |
| TW | 201227173 | A1 | 7/2012 |
| WO | WO 2008/132842 | A1 | 11/2008 |

OTHER PUBLICATIONS

International Search Report for PCT/JP2017/010324 (PCT/ISA/210) dated May 16, 2017.
Written Opinion of the International Searching Authority for PCT/JP2017/010324 (PCT/ISA/237) dated May 16, 2017.

* cited by examiner

*Primary Examiner* — John A McPherson
(74) *Attorney, Agent, or Firm* — Birch, Stewart, Kolasch & Birch, LLP

(57) ABSTRACT

To provide a negative-type photosensitive resin composition that is highly sensitive and capable of formation of a low-taper pattern shape and that is capable of providing a cured film that is excellent in heat resistance. A negative-type photosensitive resin composition contains an (A) alkali-soluble resin, a (B) radical polymerizable compound, and a (C) photo initiator, the negative-type photosensitive resin composition being characterized in that the (A) alkali-soluble resin contains one or more species of resins selected from a (A-1) polyimide, a (A-2) polybenzoxazole, a (A-3) polyimide precursor, a (A-4) polybenzoxazole precursor, a (A-5) polysiloxane, and a (A-6) cardo based resin, and that the (B) radical polymerizable compound contains a compound having five ethylenic unsaturated bond groups in a (B-1) molecule, in an amount within the range of 51 to 99 mass %.

20 Claims, 3 Drawing Sheets

[Fig. 1]
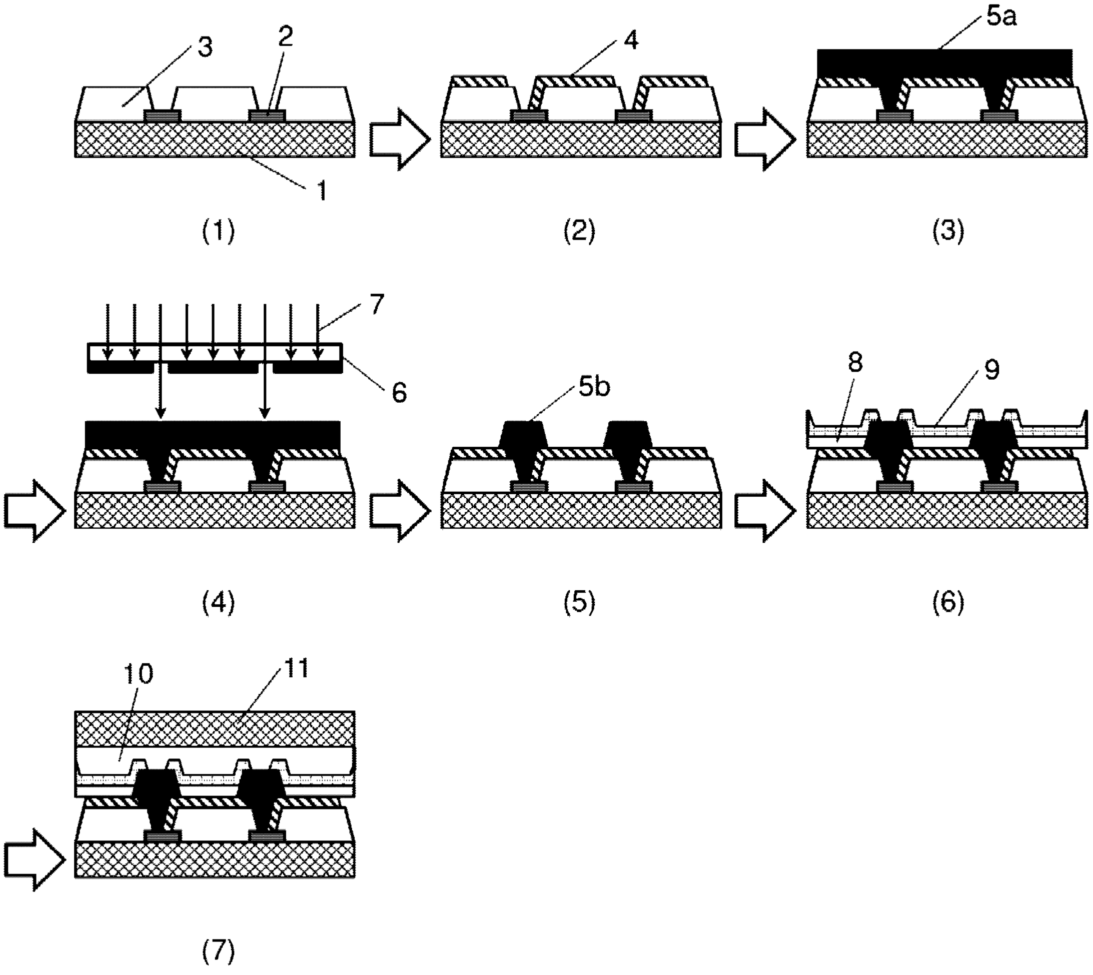

[Fig. 2]
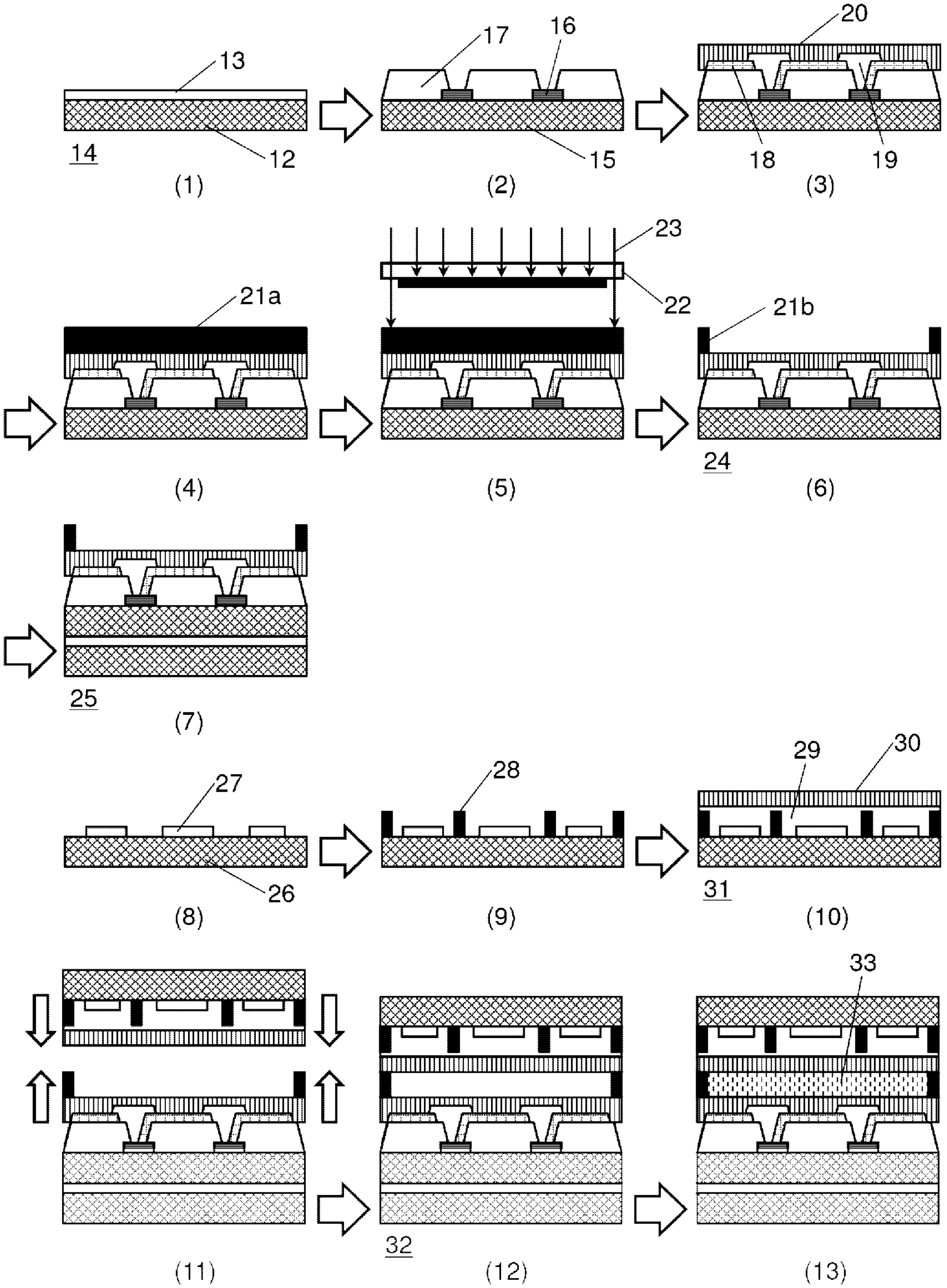

[Fig. 3]
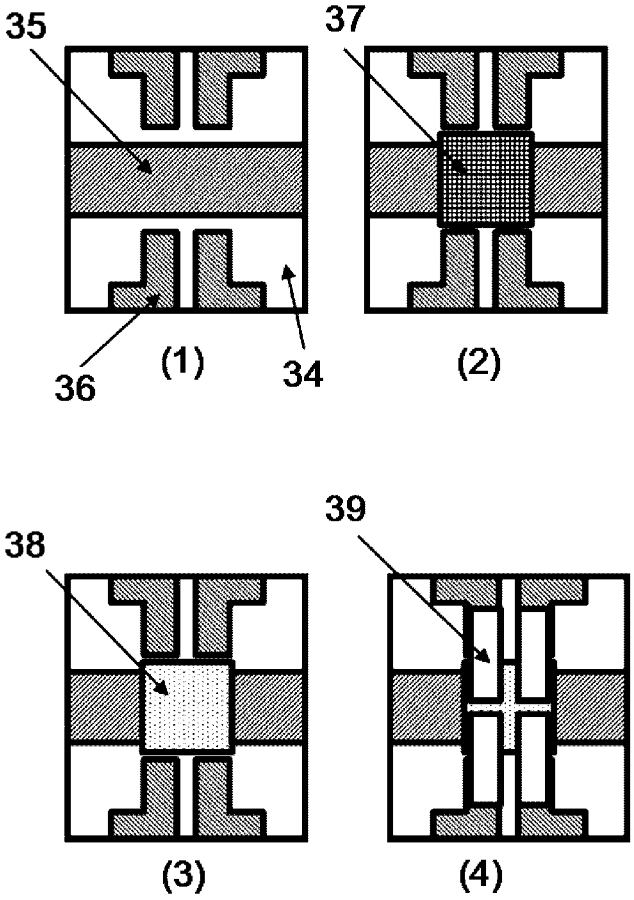

NEGATIVE-TYPE PHOTOSENSITIVE RESIN COMPOSITION, CURED FILM, DISPLAY DEVICE THAT INCLUDES THE CURED FILM, AND PRODUCTION METHOD THEREFOR

TECHNICAL FIELD

The present invention relates to a negative-type photosensitive resin composition, a cured film that uses it, a display device, and a production method for the display device.

BACKGROUND ART

Recent years have seen, in display devices, such as smartphones, tablet PCs, and televisions, which include thin-type displays, development of many products that employ organic electroluminescence (hereinafter, "EL") displays.

Generally, an organic EL display includes transparent electrodes of indium tin oxide (hereinafter, "ITO") on a light extraction side of the light-emitting elements and includes metal electrodes of an alloy of magnesium and silver, or the like, on a side of the light-emitting elements that is not the light extraction side. Furthermore, in order to separate the pixels of the light-emitting elements from each other, an insulation layer called pixel-separating layer is formed between the layers of the transparent electrodes and the metal electrodes. The transparent electrodes and the metal electrodes are generally formed as films by sputtering. In order to prevent break of transparent electrodes or metal electrodes that have been formed as films, the pixel-separating layer is required to have a low-taper pattern shape.

The organic EL display is a self-luminous element that emits light by using energy based on recombination of electrons injected from a cathode and positive holes injected from an anode. Therefore, when there exist a substance that inhibits movement of electrons or positive holes, a substance that forms an energy level that inhibits recombination of electrons and positive holes, etc., there occur effects such as decrease in the light emission efficiency of light-emitting elements, deactivation of a light-emitting material, etc., leading to decreases in the service life of the light-emitting elements. Because the pixel-separating layer is formed at a position adjacent to the light-emitting elements, degassing and outflow of ion components from the pixel-separating layer can be causes of reduced service life of organic EL displays. Therefore, the pixel-separating layer is required to have high heat resistance.

Further, when a photosensitive resin composition is used for a pixel-separating layer, the coating for forming the layer is carried out mainly by slit coating. In recent years, the sizes of substrates have been progressively increased to increase production. As the substrate size increases, it becomes necessary to reduce the exposure time in the exposure step which has great effect on production takt. Therefore, the pixel-separating layer is required to be of a highly sensitive photosensitive resin composition.

As a method for obtaining a highly sensitive photosensitive resin composition, a method that uses a negative-type photosensitive resin composition can be cited (refer to, e.g., Patent Document 1). Generally in negative-type photosensitive mechanisms, active elements produced at the time of pattern exposure diffuse in the film, so that it can be said that the negative-type photosensitive mechanisms require less exposure energy and are more advantageous for increases in sensitivity than the positive-type photosensitive mechanisms. Furthermore, since a negative-type photosensitive resin composition contains a radical polymerizable compound, a composition obtained by mixing compositions different from each other in the number of ethylenic unsaturated bond groups has been proposed in order to achieve desired characteristics (refer to, e.g., Patent Document 2).

PRIOR ART DOCUMENTS

Patent Documents

Patent Document 1: International Publication WO 2004-109403 Pamphlet

Patent Document 2: International Publication WO 2013-084883 Pamphlet

SUMMARY OF THE INVENTION

Problems to be Solved by the Invention

However, in negative-type photosensitive mechanisms, rectangular or reverse taper shaped patterns are likely to be formed and therefore obtaining a low-taper pattern shape has been difficult.

Therefore, a negative-type photosensitive resin composition that is highly sensitive and capable of formation of a low-taper pattern shape and formation of a cured film excellent in heat resistance has been demanded.

The present inventors focused their attention on a radical polymerizable compound as a component that significantly affects characteristics in a negative-type photosensitive mechanism. As for the radical polymerizable compound, the number of ethylenic unsaturated bond groups in the compound affects the reactivity of the compound and the post-reaction crosslink density and influences the post-reaction physical property thereof.

In the negative-type photosensitive mechanism, use of a radical polymerizable compound having a great number of ethylenic unsaturated bond groups and a high reactivity provides a more highly sensitive composition. Furthermore, use of a radical polymerizable compound having a small number of ethylenic unsaturated bond groups and fewer crosslinking points provides a less hardened pattern, which facilitates the flow of the pattern in subsequent heating treatment, so that a low-taper pattern shape can be obtained. The present inventors, after consideration, found that in the case where radical polymerizable compounds having different numbers of ethylenic unsaturated bond groups are used in combination, there are appropriate numbers of bond groups and an appropriate combination ratio that achieve both excellent sensitivity and excellent pattern shape. On the other hand, none of known related heat-resistant photosensitive resin compositions achieve both a favorable sensitivity and a favorable pattern shape due to combined use of radical polymerizable compounds having different numbers of ethylenic unsaturated bond groups and therefore none of them has sufficient properties for use as a material that forms a pixel-separating layer in an organic EL display.

Therefore, an object of the present invention is to provide a negative-type photosensitive resin composition that is highly sensitive and capable of formation of a low-taper pattern shape and that is capable of providing a cured film that is excellent in heat resistance.

Means for Solving the Problems

The negative-type photosensitive resin composition of the present invention is a negative-type photosensitive resin composition that contains an (A) alkali-soluble resin, a (B) radical polymerizable compound, and a (C) photo initiator, characterized in that the (A) alkali-soluble resin contains one or more species of resins selected from a (A-1) polyimide, a (A-2) polybenzoxazole, a (A-3) polyimide precursor, a (A-4) polybenzoxazole precursor, a (A-5) polysiloxane, and a (A-6) cardo based resin and that the (B) radical polymerizable compound contains a compound having five ethylenic unsaturated bond groups in a (B-1) molecule, in an amount within a range of 51 to 99 mass %.

Advantageous Effects of the Invention

According to the negative-type photosensitive resin composition of the present invention, it is possible to obtain a cured film that is highly sensitive, capable of formation of a low-taper pattern shape, and excellent in heat resistance.

BRIEF DESCRIPTION OF THE DRAWINGS

FIG. 1 is a process diagram illustrating an example of a production process for an organic EL display that uses a cured film of the negative-type photosensitive resin composition of the present invention.

FIG. 2 is a process diagram illustrating an example of a production process for a liquid crystal display that uses a cured film of the negative-type photosensitive resin composition of the present invention.

FIG. 3 is a schematic diagram of an organic EL display device used for light emission characteristic evaluation.

DESCRIPTION OF PREFERRED EMBODIMENTS

The negative-type photosensitive resin composition of the present invention is a negative-type photosensitive resin composition that contains an (A) alkali-soluble resin, a (B) radical polymerizable compound, and a (C) photo initiator, characterized in that the (A) alkali-soluble resin contains one or more species of resins selected from a (A-1) polyimide, a (A-2) polybenzoxazole, a (A-3) polyimide precursor, a (A-4) polybenzoxazole precursor, a (A-5) polysiloxane, and a (A-6) cardo based resin and that the (B) radical polymerizable compound contains a compound having five ethylenic unsaturated bond groups in a (B-1) molecule, in an amount within the range of 51 to 99 mass %.

<(A) Alkali-Soluble Resin>

The negative-type photosensitive resin composition of the present invention contains an (A) alkali-soluble resin. As the (A) resin, one or more species of resins selected from the (A-1) polyimide, the (A-2) polybenzoxazole, the (A-3) polyimide precursor, the (A-4) polybenzoxazole precursor, the (A-5) polysiloxane, and the (A-6) cardo based resin is contained.

The (A-1) polyimide, the (A-2) polybenzoxazole, the (A-3) polyimide precursor, the (A-4) polybenzoxazole precursor, the (A-5) polysiloxane, and the (A-6) cardo based resin in the present invention may each be either a single resin or a copolymer of single resins.

<(A-1) Polyimide and (A-3) Polyimide Precursor>

As the (A-3) polyimide precursor, for example, those obtained by reacting a tetracarboxylic acid, a corresponding tetracarboxylic dianhydride, a corresponding tetracarboxylic acid diester dichloride, or the like with a diamine, a corresponding diisocyanate compound, a corresponding trimethylsilylated diamine, or the like can be cited. The (A-3) polyimide precursor has a tetracarboxylic acid and/or its derivative residue and also has a diamine and/or its derivative residue. As the (A-3) polyimide precursor, for example, a polyamic acid, a polyamic acid ester, a polyamic acid amide, or a polyisoimide can be cited.

As the (A-1) polyimide, for example, those obtained by dehydrating cyclization of the polyamic acid, the polyamic acid ester, the polyamic acid amide, or the polyisoimide mentioned above due to heating or reaction using an acid or a base can be cited. The (A-1) polyimide has a tetracarboxylic acid and/or its derivative residue and has a diamine and/or its derivative residue.

The (A-3) polyimide precursor is a thermosetting resin and, when subjected to high-temperature thermosetting and therefore dehydrating cyclization, forms high heat-resistant imide bonds, thus providing a (A-1) polyimide. Therefore, containing in the resin composition the (A-1) polyimide having high heat-resistant imide bonds can conspicuously improve the heat resistance of the cured film obtained. Therefore, the resin composition is suitable in the case where the cured film is used for a use that high heat resistance is required, and the like cases. Furthermore, since the (A-3) polyimide precursor is a resin that improves in heat resistance after dehydrating cyclization, the resin composition is suitable in the case where the resin composition is used for uses in which it is desired to achieve both favorable characteristics of the precursor structure prior to the dehydrating cyclization and favorable heat resistance of the cured film, and the like cases.

<(A-2) Polybenzoxazole and (A-4) Polybenzoxazole Precursor>

As the (A-2) polybenzoxazole, for example, those obtained by reacting a dicarboxylic acid, a corresponding dicarboxylic acid dichloride, a dicarboxylic acid active diester, or the like with a bisaminophenol compound as a diamine can be cited. The (A-2) polybenzoxazole has a dicarboxylic acid and/or its derivative residue and has a bisaminophenol compound and/or its derivative residue. As the (A-4) polybenzoxazole precursor, for example, polyhydroxy amides can be cited.

As the (A-2) polybenzoxazole, for example, those obtained by dehydrating cyclization of a dicarboxylic acid and, as a diamine, a bisaminophenol compound due to reaction using a polyphosphoric acid and those obtained by dehydrating cyclization of the aforementioned polyhydroxy amide due to heat or reaction using a phosphoric anhydride, a base, a carbodiimide compound, or the like can be cited. The (A-2) polybenzoxazle has a dicarboxylic acid and/or its derivative residue and has a bisaminophenol compound and/or its derivative residue.

The (A-4) polybenzoxazole precursor is a thermosetting resin and, when subjected to high-temperature thermosetting and therefore dehydrating cyclization, forms a high heat resistant and rigid benzoxazole ring, thus providing a (A-2) polybenzoxazole. Therefore, containing in the resin composition the (A-2) polybenzoxazole having a high heat resistant and rigid benzoxazole ring can conspicuously improve the heat resistance of the cured film obtained. Therefore, the resin composition is suitable in the case where the cured film is used for uses that require high heat resistance of the film, and the like cases. Furthermore, since the (A-4) polybenzoxazole precursor is a resin that improves in heat resistance after dehydrating cyclization, the resin composition is suitable in the case where the resin composition is used for uses in which it is desired to achieve both favorable characteristics of the precursor structure prior to the dehydrating cyclization and favorable heat resistance of the cured film, or the like cases.

<Tetracarboxylic Acid, Tricarboxylic Acid, Dicarboxylic Acid, and their Derivatives>

As a carboxylic acid and its derivative used to obtain the (A-1) polyimide, the (A-2) polybenzoxazole, the (A-3) polyimide precursor, or the (A-4) polybenzoxazole precursor, tetracarboxylic acids, tricarboxylic acids, dicarboxylic acids, and their derivatives can be cited.

As the tetracarboxylic acid, for example, aromatic tetracarboxylic acids, alicyclic tetracarboxylic acids, or aliphatic tetracarboxylic acids can be cited.

These tetracarboxylic acids may have, besides the oxygen atoms in the carboxy groups, heteroatoms that are not an oxygen atom.

As the aromatic tetracarboxylic acids and their derivatives, for example, 1,2,4,5-benzene tetracarboxylic acid (pyromellitic acid), 3,3',4,4'-biphenyl tetracarboxylic acid, 2,3,3',4'-biphenyl tetracarboxylic acid, 2,2',3,3'-biphenyl tetracarboxylic acid, 1,2,5,6-naphthalene tetracarboxylic acid, 1,4,5,8-naphthalene tetracarboxylic acid, 2,3,6,7-naphthalene tetracarboxylic acid, 3,3',4,4'-benzophenone tetracarboxylic acid, 2,2',3,3'-benzophenone tetracarboxylic acid, bis(3,4-dicarboxyphenyl)methane, bis(2,3-dicarboxyphenyl)methane, 1,1-bis(3,4-dicarboxyphenyl)ethane, 1,1-bis(2,3-dicarboxyphenyl)ethane, 2,2-bis(3,4-dicarboxyphenyl) propane, 2,2-bis(2,3-dicarboxyphenyl)propane, 2,2-bis[4-(3,4-dicarboxy phenoxy)phenyl]propane, 2,2-bis(3,4-dicarboxyphenyl)hexafluoropropane, 2,2-bis(2,3-dicarboxyphenyl)hexafluoropropane, bis(3,4-dicarboxyphenyl)sulfone, bis(3,4-dicarboxyphenyl)ether, 2,3,5,6-pyridine tetracarboxylic acid, or 3,4,9,10-perylene tetracarboxylic acid, compounds having a structure indicated below, such as N,N'-bis[5,5'-hexafluoropropane-2,2-diyl-bis(2-hydroxyphenyl)]bis(3,4-dicarboxybenzoic acid amide), their tetracarboxylic dianhydrides, their tetracarboxylic acid dichlorides, or their tetracarboxylic acid active diesters can be cited.

cyclopentane tetracarboxylic acid, 1,2,3,4-cyclobutane tetracarboxylic acid, or 2,3,4,5-tetrahydrofuran tetracarboxylic acid, or their tetracarboxylic dianhydrides, tetracarboxylic acid dichlorides, or tetracarboxylic acid active diesters can be cited.

As the aliphatic tetracarboxylic acid and its derivative, for example, butane-1,2,3,4-tetracarboxylic acid, or its tetracarboxylic dianhydride, tetracarboxylic acid dichloride or tetracarboxylic acid active diester can be cited.

As the dicarboxylic acids and their derivatives in the (A-2) polybenzoxazole and the (A-4) polybenzoxazole precursor, tricarboxylic acids and/or their derivatives may be used.

As the dicarboxylic acids and the tricarboxylic acids, for example, aromatic dicarboxylic acids, aromatic tricarboxylic acids, alicyclic dicarboxylic acids, alicyclic tricarboxylic acids, aliphatic dicarboxylic acids, or aliphatic tricarboxylic acids can be cited. These dicarboxylic acids and tricarboxylic acids may have, besides the oxygen atoms of the carboxy groups, heteroatoms that are not oxygen atoms.

As the aromatic dicarboxylic acids and their derivatives, for example, phthalic acid, isophthalic acid, terephthalic acid, 4,4'-dicarboxybiphenyl, 2,2'-bis(trifluoromethyl)-4,4'-dicarboxybiphenyl, 4,4'-benzophenone dicarboxylic acid, 2,2-bis(4-carboxyphenyl)hexafluoropropane, 2,2-bis(3-carboxyphenyl)hexafluoropropane, or 4,4'-dicarboxy diphenyl ether, or their dicarboxylic acid anhydrides, dicarboxylic acid chlorides, dicarboxylic acid active esters, or diformyl compounds can be cited.

The aromatic tricarboxylic acids and their derivatives, for example, 1,2,4-benzene tricarboxylic acid, 1,3,5-benzene tricarboxylic acid, 2,4,5-benzophenone tricarboxylic acid, 2,4,4'-biphenyl tricarboxylic acid, or 3,3',4'-tricarboxy diphenyl ether, or their tricarboxylic acid anhydrides, tricarboxylic acid chlorides, tricarboxylic acid active esters, or diformyl monocarboxylic acids can be cited.

[CHEM. 1]

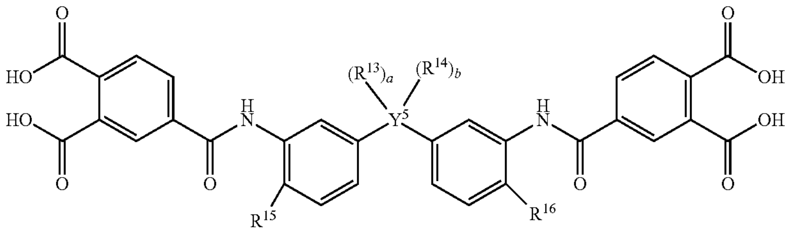

In the compounds having the foregoing structure, $Y^5$ represents a direct bond, an oxygen atom, or an alkylene chain having a carbon number of 1 to 4. In the case where $Y^5$ is a direct bond or an oxygen atom, a and b are 0. In the case where $Y^5$ is an alkylene chain having a carbon number of 1 to 4, $R^{13}$ and $R^{14}$ each independently represent a hydrogen, an alkyl group having a carbon number of 1 to 4, or an alkyl group which has 1 to 8 fluorine atoms and having a carbon number of 1 to 4. $R^{15}$ and $R^{16}$ each independently represent hydrogen, an alkyl group having a carbon number of 1 to 4, or a hydroxy group. a and b each independently represent an integer of 0 to 4. The alkylene chain and the alkyl group mentioned above may be either an unsubstituted product or a substitution product.

As the alicyclic tetracarboxylic acid and its derivative, for example, bicyclo[2.2.2]octane-7-ene-2,3,5,6-tetracarboxylic acid, 1,2,4,5-cyclohexane tetracarboxylic acid, 1,2,3,4-

As the alicyclic dicarboxylic acids and their derivatives, for example, 1,4-cyclohexane dicarboxylic acid or 1,2-cyclohexane dicarboxylic acid, or their dicarboxylic acid anhydrides, dicarboxylic acid chlorides, dicarboxylic acid active esters, or diformyl compounds can be cited.

As the alicyclic tricarboxylic acids and their derivatives, for example, 1,2,4-cyclohexane tricarboxylic acid or 1,3,5-cyclohexane tricarboxylic acid, or their tricarboxylic acid anhydrides, tricarboxylic acid chlorides, tricarboxylic acid active esters, or diformyl monocarboxylic acids can be cited.

As the aliphatic dicarboxylic acids and their derivatives, for example, hexane-1,6-dicarboxylic acid or succinic acid, or their dicarboxylic acid anhydrides, dicarboxylic acid chlorides, dicarboxylic acid active esters, or diformyl compounds can be cited.

As the aliphatic tricarboxylic acids and their derivatives, for example, hexane-1,3,6-tricarboxylic acid or propane-1, 2,3-tricarboxylic acid, or their tricarboxylic acid anhydrides, tricarboxylic acid chlorides, tricarboxylic acid active esters, or diformyl monocarboxylic acids can be cited.

<Diamine and its Derivatives>

As the diamine and its derivative, for example, aromatic diamines, bisaminophenol compounds, alicyclic diamines, alicyclic dihydroxy diamines, aliphatic diamines, or aliphatic dihydroxy diamines can be cited. These diamines and their derivatives may have heteroatoms, besides the nitrogen atoms and oxygen atoms of the amino groups and their derivatives.

As the aromatic diamines, the bisaminophenol compounds, and their derivatives, for example, m-phenylene diamine, p-phenylene diamine, 1,4-bis(4-aminophenoxy) benzene, 4,4'-diaminobiphenyl, bis(4-aminophenoxy) biphenyl, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-bis(trifluoromethyl)-4,4'-diaminobiphenyl, 3,3'-diamino-4,4'-biphenol, 1,5-naphthalene diamine, 2,6-naphthalene diamine, 9,9-bis(3-amino-4-hydroxyphenyl)fluorene, 3,4'-diaminodiphenylmethane, 4,4'-diaminodiphenylmethane, bis(3-amino-4-hydroxyphenyl)methane, 1,1-bis(3-amino-4-hydroxyphenyl)ethane, 2,2-bis(3-amino-4-hydroxyphenyl)propane, 2,2-bis(4-aminophenyl)hexafluoropropane, 2,2-bis(3-amino-4-hydroxyphenyl)hexafluoropropane, 3,4'-diaminodiphenyl sulfone, 4,4'-diaminodiphenyl sulfone, bis (4-aminophenoxy phenyl)sulfone, bis(3-aminophenoxy phenyl)sulfone, bis(3-amino-4-hydroxyphenyl)sulfone, 3,4'-diaminodiphenyl sulfide, 4,4'-diaminodiphenyl sulfide, 3,4'-diaminodiphenyl ether, 4,4'-diaminodiphenyl ether, bis[4-(4-aminophenoxy)phenyl]ether, bis(3-amino-4-hydroxyphenyl)ether, 3-sulfonic acid-4,4'-diaminodiphenyl ether, dimercapto phenylene diamine, compounds having a structure indicated below, such as N,N'-bis[5,5'-hexafluoropropane-2,2-diyl-bis(2-hydroxyphenyl)]bis(3-aminobenzoic acid amide), or their diisocyanate compounds or trimethylsilylated diamines can be cited.

[CHEM. 2]

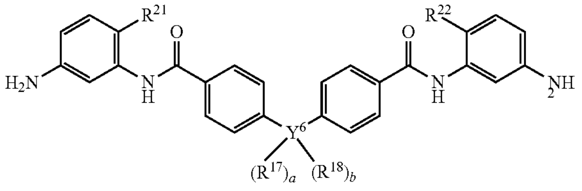

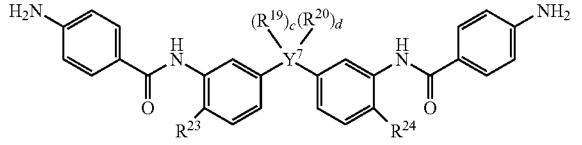

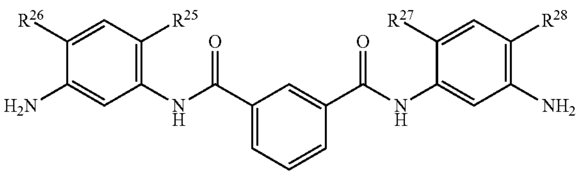

-continued

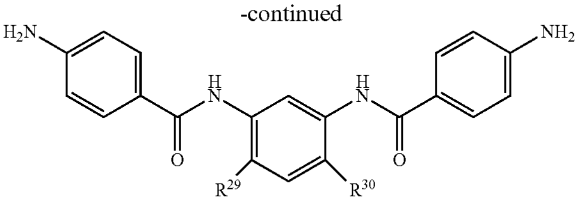

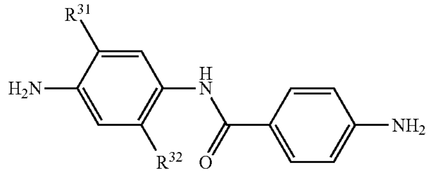

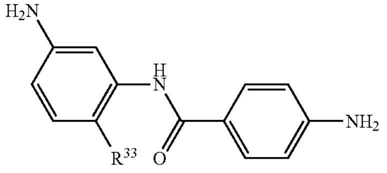

In the compounds having the foregoing structure, $Y^6$ and $Y^7$ each independently represent a direct bond, an oxygen atom, or an alkylene chain having a carbon number of 1 to 4. In the case where $Y^6$ and $Y^7$ is a direct bond or an oxygen atom, a, b, c, and d are 0. In the case where $Y^6$ and $Y^7$ are alkylene chains having a carbon number of 1 to 4, $R^{17}$ to $R^{20}$ each independently represent hydrogen, an alkyl group having a carbon number of 1 to 4, or an alkyl group which has 1 to 8 fluorine atoms and having a carbon number of 1 to 4. $R^{21}$ to $R^{33}$ each independently represent hydrogen, an alkyl group having a carbon number of 1 to 4, or a hydroxy group. a, b, c, and d each independently represent an integer of 0 to 4. The alkylene chains and the alkyl groups mentioned above may be either an unsubstituted product or a substitution product.

As the alicyclic diamines, the alicyclic dihydroxy diamine, and their derivatives, for example, compounds obtained by substituting one or more of hydrogen atoms of aromatic rings of the aromatic diamines and the bisaminophenol compounds with alkyl groups having a carbon number of 1 to 10, fluoroalkyl groups, or halogen atoms, 1,2-cyclohexane diamine, 1,4-cyclohexane diamine, bis(4-aminocyclohexyl)methane, 3,6-dihydroxy-1,2-cyclohexane diamine, 2,5-dihydroxy-1,4-cyclohexane diamine, or bis(3-hydroxy-4-aminocyclohexyl)methane, or their diisocyanate compounds or trimethylsilylated diamines can be cited.

As the aliphatic diamines, the aliphatic dihydroxy diamines, and their derivatives, for example, 1,6-hexamethylene diamine or 2,5-dihydroxy-1,6-hexamethylene diamine, or their diisocyanate compounds or trimethylsilylated diamines can be cited.

<Structural Unit Having Fluorine Atom>

It is preferable that the (A-1) polyimide, the (A-2) polybenzoxazole, the (A-3) polyimide precursor, and the (A-4) polybenzoxazole precursor in the (A) alkali-soluble resin contain a structural unit having a fluorine atom. The one or more species of resins selected from the (A-1) polyimide, the (A-2) polybenzoxazole, the (A-3) polyimide precursor, and the (A-4) polybenzoxazole precursor, because of containing a structural unit having a fluorine atom, improve in transparency and therefore can improve the sensitivity at the time of exposure. Furthermore, the one or more species of resins can provide a film surface with water repellency and can inhibit infiltration from the film surface at the time of alkaline development. The exposure mentioned herein means irradiation with chemical active rays (radiant rays); for example, visible light rays, ultraviolet ray, electron rays, X rays, etc. can be cited. From the viewpoint of being a generally-used light source, for example, a super high-pressure mercury lamp light source capable of radiating visible light rays or ultraviolet rays is preferable, and irradiation with j rays (313 nm wavelength), i rays (365 nm wavelength), h rays (405 nm wavelength), or g rays (436 nm wavelength) is more preferable. Hereinafter, exposure refers to irradiation with chemical active rays (radiant rays).

Furthermore, generally, in the case where the (A-1) polyimide, the (A-2) polybenzoxazole, the (A-3) polyimide precursor, or the (A-4) polybenzoxazole precursor is used, the solvent described below that is used to dissolve these resins needs to be a high-polarity solvent such as N-methyl-2-pyrrolidone, dimethyl sulfoxide, N,N-dimethylformamide, or γ-butyrolactone. However, as one or more species of resins selected from the (A-1) polyimide, the (A-2) polybenzoxazole, the (A-3) polyimide precursor, and the (A-4) polybenzoxazole precursor contains a structural unit having a fluorine atom, the solubility to solvents can be improved, so that these reins can be dissolved without using a high-polarity solvent.

As the structural unit having a fluorine atom which the (A-1) polyimide and/or the (A-3) polyimide precursor contains, a structural unit originating from a tetracarboxylic acid having a fluorine atom and/or a derivative thereof or a structural unit originating from a diamine having a fluorine atom and/or a derivative thereof can be cited as a structural unit originating from a carboxylic acid having a fluorine atom and/or a derivative thereof.

As the structural unit having a fluorine atom which the (A-2) polybenzoxazole and/or the (A-4) polybenzoxazole precursor contains, a structural unit originating from a dicarboxylic acid having a fluorine atom and/or a derivative thereof can be cited as a structural unit originating from a carboxylic acid having a fluorine atom and/or a derivative thereof, or a structural unit originating from a bisaminophenol compound having a fluorine atom and/or a derivative thereof can be cited as a structural unit originating from a diamine having a fluorine atom and/or a derivative thereof.

As the tetracarboxylic acids having fluorine atoms and their derivatives, for example, 2,2-bis(3,4-dicarboxyphenyl) hexafluoropropane, 2,2-bis(2,3-dicarboxyphenyl)hexafluoropropane, or N,N'-bis[5,5'-hexafluoropropane-2,2-diyl-bis (2-hydroxyphenyl)]bis(3,4-dicarboxybenzoic acid amide) and their tetracarboxylic dianhydrides, tetracarboxylic acid dichlorides, or tetracarboxylic acid active diesters can be cited.

As the dicarboxylic acids having fluorine atoms and their derivatives, for example, 2,2'-bis(trifluoromethyl)-4,4'-dicarboxybiphenyl, 2,2-bis(4-carboxyphenyl)hexafluoropropane, or 2,2-bis(3-carboxyphenyl)hexafluoropropane and their dicarboxylic acid anhydrides, dicarboxylic acid chlorides, dicarboxylic acid active esters, or diformyl compounds can be cited.

As the diamines or bisaminophenol compounds having fluorine atoms and their derivatives, for example, 2,2'-bis (trifluoromethyl)-4,4'-diaminobiphenyl, 2,2-bis(4-aminophenyl)hexafluoropropane, 2,2-bis(3-amino-4-hydroxyphenyl)hexafluoropropane, or N, N'-bis[5,5'-hexafluoropropane-2,2-diyl-bis(2-hydroxyphenyl)]bis(3-aminobenzoic acid amide) and their diisocyanate compounds or trimethylsilylated diamines can be cited.

From the viewpoint of improvement in sensitivity at the time of exposure, it is preferable that one or more species of resins selected from the (A-1) polyimide, the (A-2) polybenzoxazole, the (A-3) polyimide precursor, and the (A-4) polybenzoxazole precursor contain a structural unit originating from one or more species selected from a diamine having a fluorine atom, a diamine derivative having a fluorine atom, a bisaminophenol compound having a fluorine atom, and a bisaminophenol compound derivative having a fluorine atom, and it is more preferable that the one or more species of resins contain a structural unit originating from one or more species selected from a tetracarboxylic acid having a fluorine atom, a tetracarboxylic acid derivative having a fluorine atom, a dicarboxylic acid having a fluorine atom, and a dicarboxylic acid derivative having a fluorine atom, and it is even more preferable that the one or more species of resins contain both the structural units.

In one or more species of resins selected from the (A-1) polyimide, the (A-2) polybenzo-oxazole, the (A-3) polyimide precursor, and the (A-4) polybenzo-oxazole precursor, it is preferable that the content ratio of the structural unit originating from one or more species selected from a tetracarboxylic acid having a fluorine atom, a tetracarboxylic acid derivative having a fluorine atom, a dicarboxylic acid having a fluorine atom, and dicarboxylic acid derivative having a fluorine atom in the structural unit originating from the entire carboxylic acids and their derivatives be 30 mol % or greater, it is more preferable that the content ratio be 50 mol % or greater, and it is even more preferable that the content ratio be 70 mol % or greater. When the content ratio thereof is within the range mentioned above, the sensitivity at the time of exposure can be improved. On the other hand, it is preferable that the content ratio thereof be 100 mol % or less, and it is more preferable that the content ratio thereof be 95 mol % or less. When the content ratio thereof is within the range mentioned above, the pattern adhesion can be improved.

In one or more species of resins selected from the (A-1) polyimide, the (A-2) polybenzo-oxazole, the (A-3) polyimide precursor, and the (A-4) polybenzo-oxazole precursor, it is preferable that the content ratio of the structural unit originating from one or more species selected from a diamine having a fluorine atom, a diamine derivative having a fluorine atom, a bisaminophenol compound having a fluorine atom, and a bisaminophenol compound derivative having a fluorine atom in the structural unit originating from the entire amines and their derivatives be 30 mol % or greater, and it is more preferable that the content ratio thereof be 50 mol % or greater, and it is even more preferable that the content ratio be 70 mol % or greater. When the content ratio thereof is within the range mentioned above, the sensitivity at the time of exposure can be improved. On the other hand, it is preferable that the content ratio thereof be 100 mol % or less, and it is more preferable that the content ratio thereof be 95 mol % or less. When the content ratio thereof is within the range mentioned above, the pattern adhesion can be improved.

<Structural Unit Originating from One or More Species Selected from Tetracarboxylic Acid Having Fluorine Atom, Tetracarboxylic Acid Derivative Having Fluorine Atom, Dicarboxylic Acid Having Fluorine Atom, and Dicarboxylic Acid Derivative Having Fluorine Atom>

It is preferable that the (A-1) polyimide and/or the (A-3) polyimide precursor contain, as a structural unit originating from a tetracarboxylic acid having a fluorine atom and its derivative, a structural unit represented by general formula (9) and/or a structural unit represented by general formula (10).

[CHEM. 3]

(9)

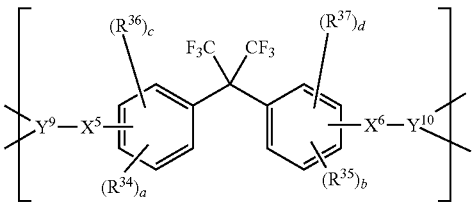

(10)

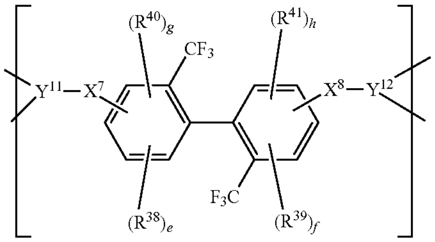

In general formulas (9) and (10), $R^{34}$, $R^{35}$, $R^{38}$ and $R^{39}$ each independently represent a substituent represented by general formula (48) mentioned below or general formula (49) mentioned below, $R^{36}$, $R^{37}$, $R^{40}$ and $R^{41}$ each independently represent an alkyl group having a carbon number of 1 to 10, a cycloalkyl group having a carbon number of 4 to 10, an aryl group having a carbon number of 6 to 15, a phenolic hydroxyl group, a sulfonic acid group, or a mercapto group. $X^5$ to $X^8$ each independently represent a direct bond, an oxygen atom, or a bond represented by general formula (11). In the case where $X^5$ to $X^8$ are a direct bond, $Y^9$ to $Y^{12}$ each independently represent a direct bond, an alkylene chain having a carbon number of 1 to 10, a cycloalkylene chain having a carbon number of 4 to 10, an arylene chain having a carbon number of 6 to 15. In the case where $X^5$ to $X^8$ is an oxygen atom or a bond represented by general formula (11), $Y^9$ to $Y^{12}$ each independently represent an alkylene chain having a carbon number of 1 to 10, a cycloalkylene chain having a carbon number of 4 to 10, or an arylene chain having a carbon number of 6 to 15. a to d each independently represent an integer of 0 to 4, e to h each independently represent an integer of 0 to 3, $0 \le a+c \le 4$, $0 \le b+d \le 4$, $0 \le e+g \le 3$, and $0 \le f+h \le 3$. In general formulas (9) and (10), it is preferable that $R^{36}$, $R^{37}$, $R^{40}$ and $R^{41}$ each independently be an alkyl group having a carbon number of 1 to 6, a cycloalkyl group having a carbon number of 4 to 7, an aryl group having a carbon number of 6 to 10, a phenolic hydroxyl group, a sulfonic acid group, or a mercapto group. It is preferable that $Y^9$ to $Y^{12}$ each independently be a direct bond, an alkylene chain having a carbon number of 1 to 6, a cycloalkylene chain having a carbon number of 4 to 7, or an arylene chain having a carbon number of 6 to 10. The alkyl group, the cycloalkyl group, the aryl group, the alkylene chain, the cycloalkylene chain, and the arylene chain mentioned above may be either an unsubstituted product or a substitution product.

[Chem. 4]

(48)

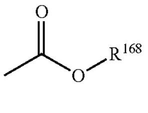

-continued (49)

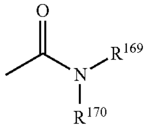

(11)

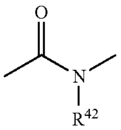

In general formulas (48) and (49), $R^{168}$ to $R^{170}$ each independently represent hydrogen, an alkyl group having a carbon number of 1 to 10, an acyl group having a carbon number of 2 to 6, or an aryl group having a carbon number of 6 to 15. In general formulas (48) and (49), it is preferable that $R^{168}$ to $R^{170}$ each independently be hydrogen, an alkyl group having a carbon number of 1 to 6, an acyl group having a carbon number of 2 to 4, or an aryl group having a carbon number of 6 to 10. In general formula (11), $R^{42}$ represents hydrogen, an alkyl group having a carbon number of 1 to 10, an acyl group having a carbon number of 2 to 6, or an aryl group having a carbon number of 6 to 15. In general formula (11), it is preferable that $R^{42}$ be hydrogen, an alkyl group having a carbon number of 1 to 6, an acyl group having a carbon number of 2 to 4, or an aryl group having a carbon number of 6 to 10. The alkyl group, the acyl group, and the aryl group mentioned above may be either an unsubstituted product or a substitution product.

It is preferable that the (A-2) polybenzoxazole and/or the (A-4) polybenzoxazole precursor contain, as a structural unit originating from a dicarboxylic acid having a fluorine atom or its derivative, a structural unit represented by general formula (12) and/or a structural unit represented by general formula (13).

[Chem. 5]

(12)

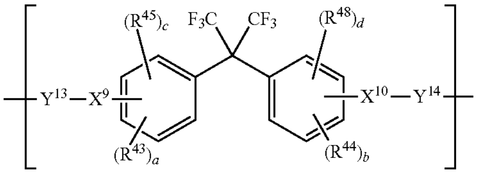

(13)

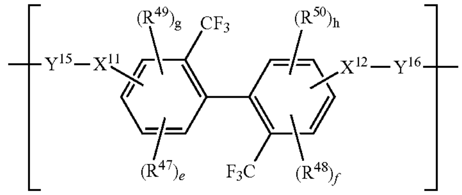

In general formulas (12) and (13), $R^{43}$, $R^{44}$, $R^{47}$ and $R^{48}$ each independently represent a substituent represented by general formula (48) mentioned above or general formula (49) mentioned above, $R^{45}$, $R^{46}$, $R^{49}$ and $R^{50}$ each independently represent an alkyl group having a carbon number of 1 to 10, a cycloalkyl group having a carbon number of 4 to 10, an aryl group having a carbon number of 6 to 15, a phenolic hydroxyl group, a sulfonic acid group, or a mercapto group. $X^9$ to $X^{12}$ each independently represent a direct bond, an oxygen atom, or a bond represented by general formula (11) mentioned above. In the case where $X^9$ to $X^{12}$ are direct bonds, $Y^{13}$ to $Y^{16}$ each independently represent a direct bond, an alkylene chain having a carbon number of 1 to 10, a cycloalkylene chain having a carbon number of 4 to 10, or an arylene chain having a carbon number of 6 to 15. In the case where $X^9$ to $X^{12}$ are oxygen atoms or bonds represented by general formula (11) mentioned above, $Y^{13}$ to $Y^{16}$ each independently represent an alkylene chain having a carbon number of 1 to 10, a cycloalkylene chain having a carbon number of 4 to 10, or an arylene chain having a carbon number of 6 to 15. a to d each independently represent an integer of 0 to 4, e to h each independently represent an integer of 0 to 3, $0 \leq a+c \leq 4$, $0 \leq b+d \leq 4$, $0 \leq e+g \leq 3$, and $0 \leq f+h \leq 3$. In general formulas (12) and (13), it is preferable that $R^{45}$, $R^{46}$, $R^{49}$ and $R^{50}$ each independently be an alkyl group having a carbon number of 1 to 6, a cycloalkyl group having a carbon number of 4 to 7, an aryl group having a carbon number of 6 to 10, a phenolic hydroxyl group, a sulfonic acid group, or a mercapto group. It is preferable that $Y^{13}$ to $Y^{16}$ each independently be a direct bond, an alkylene chain having a carbon number of 1 to 6, a cycloalkylene chain having a carbon number of 4 to 7, or an arylene chain having a carbon number of 6 to 10. The alkyl group, the cycloalkyl group, the aryl group, the alkylene chain, the cycloalkylene chain, and the arylene chain may be either an unsubstituted product or a substitution product.

<Structural Unit Originating from One or More Species Selected from Diamine Having Fluorine Atom, Diamine Derivative Having Fluorine Atom, Bisaminophenol Compound Having Fluorine Atom, and Bisaminophenol Compound Derivative Having Fluorine Atom>

It is preferable that the (A-1) polyimide and/or the (A-3) polyimide precursor contain, as a structural unit originating from a diamine having a fluorine atom and its derivative, a structural unit represented by general formula (14) and/or a structural unit represented by general formula (15).

[CHEM. 6]

(14)

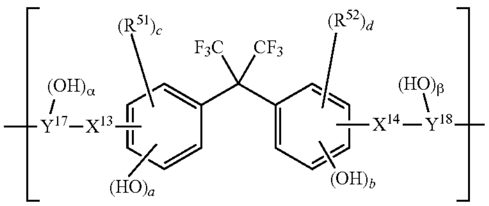

(15)

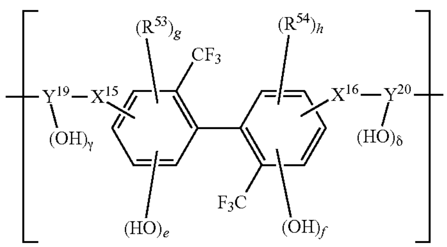

In general formulas (14) and (15), $R^{51}$ to $R^{54}$ each independently represent an alkyl group having a carbon number of 1 to 10, a cycloalkyl group having a carbon number of 4 to 10, an aryl group having a carbon number of 6 to 15, a sulfonic acid group, a carboxy group, or a mercapto group. $X^{13}$ to $X^{16}$ each independently represent a direct bond, an oxygen atom, or a bond represented by general formula (11) mentioned above. In the case where $X^{13}$ to $X^{16}$ are direct bonds, $Y^{17}$ to $Y^{20}$ each independently represent a direct bond, an alkylene chain having a carbon number of 1 to 10, a cycloalkylene chain having a carbon number of 4 to 10, or an arylene chain having a carbon number of 6 to 15. In the case where $X^{13}$ to $X^{16}$ are oxygen atoms or bonds represented by general formula (11), $Y^{17}$ to $Y^{20}$ each independently represent an alkylene chain having a carbon number of 1 to 10, a cycloalkylene chain having a carbon number of 4 to 10, or an arylene chain having a carbon number of 6 to 15. a to d and a to 6 each independently represent an integer of 0 to 4, e to h each independently represent an integer of 0 to 3, $0 \leq a+c \leq 4$, $0 \leq b+d \leq 4$, $0 \leq e+g \leq 3$, and $0 \leq f+h \leq 3$. In the case where $Y^{17}$ to $Y^{20}$ are direct bonds, $\alpha$ to $\delta$ are 0. In general formulas (14) and (15), it is preferable that $R^{51}$ to $R^{54}$ each independently be an alkyl group having a carbon number of 1 to 6, a cycloalkyl group having a carbon number of 4 to 7, an aryl group having a carbon number of 6 to 10, a sulfonic acid group, a carboxy group, or a mercapto group. It is preferable that $Y^{17}$ to $Y^{20}$ each independently be a direct bond, an alkylene chain having a carbon number of 1 to 6, a cycloalkylene chain having a carbon number of 4 to 7, or an arylene chain having a carbon number of 6 to 10. It is preferable that a and b each independently be 1 to 4 and it is preferable that e and f each independently be 1 to 3. The alkyl group, the cycloalkyl group, the aryl group, the alkylene chain, the cycloalkylene chain, and the arylene chain mentioned above may be either an unsubstituted product or a substitution product.

It is preferable that the (A-2) polybenzoxazole and/or the (A-4) polybenzoxazole precursor contain as a structural unit originating from a bisaminophenol compound having a fluorine atom and its derivative, a structural unit represented by general formula (16) and/or a structural unit represented by general formula (17).

[Chem. 7]

(16)

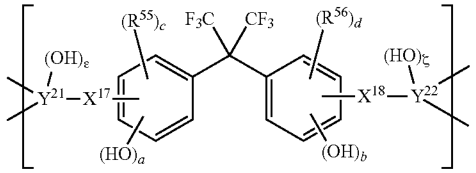

(17)

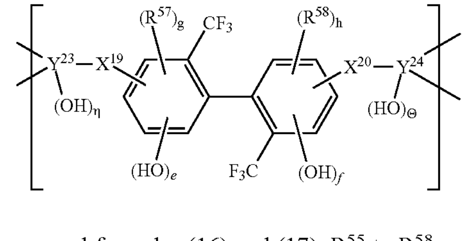

In general formulas (16) and (17), $R^{55}$ to $R^{58}$ each independently represent an alkyl group having a carbon number of 1 to 10, a cycloalkyl group having a carbon number of 4 to 10, an aryl group having a carbon number of 6 to 15, a sulfonic acid group, a carboxy group, or a mercapto group. $X^{17}$ to $X^{20}$ each independently represent a direct bond, an oxygen atom, or a bond represented by general formula (11) mentioned above. In the case where $X^{17}$ to $X^{20}$ are direct bonds, $Y^{21}$ to $Y^{24}$ each independently represent a direct bond, an alkylene chain having a carbon number of 1 to 10, a cycloalkylene chain having a carbon number of 4 to 10, or an arylene chain having a carbon number of 6 to 15. In the case where $X^{17}$ to $X^{20}$ are oxygen atoms or bonds represented by general formula (11) mentioned above, $Y^{21}$ to $Y^{24}$ each independently represent an alkylene chain having a carbon number of 1 to 10, a cycloalkylene chain having a carbon number of 4 to 10, or an arylene chain having a carbon number of 6 to 15. a to d and $\epsilon$ to $\theta$ each independently represent an integer of 0 to 4, e to h each independently represent an integer of 0 to 3, $0 \leq a+c \leq 4$, $0 \leq b+d \leq 4$, $0 \leq e+g \leq 3$, and $0 \leq f+h \leq 3$. In the case where $Y^{21}$ to $Y^{24}$ are direct bonds, $\epsilon$ to $\theta$ are 0. In general formulas (16) and (17), it is preferable that $R^{55}$ to $R^{58}$ each independently be an alkyl group having a carbon number of 1 to 6, a cycloalkyl group having a carbon number of 4 to 7, an aryl group having a carbon number of 6 to 10, a sulfonic acid group, a carboxy group, or a mercapto group. It is preferable that $Y^{21}$ to $Y^{24}$ each independently be a direct bond, an alkylene chain having a carbon number of 1 to 6, a cycloalkylene chain having a carbon number of 4 to 7, or an arylene chain having a carbon number of 6 to 10. It is preferable that a and b each independently be 1 to 4 and it is preferable that e and f each independently be 1 to 3. The alkyl group, the cycloalkyl group, the aryl group, the alkylene chain, the cycloalkylene chain, and the arylene chain mentioned above may be either an unsubstituted product or a substitution product.

<Structural Unit Originating from Diamine Having Silyl Group or Siloxane Bond and its Derivative>

It is preferable that the one or more species of resins selected from the (A-1) polyimide, the (A-2) polybenzo-oxazole, the (A-3) polyimide precursor, and the (A-4) poly-benzo-oxazole precursor contain a structural unit originating from a diamine having a silyl group or a siloxane bond and/or a derivative of the diamine. As the one or more species of resins selected from the (A-1) polyimide, the (A-2) polybenzo-oxazole, the (A-3) polyimide precursor, and the (A-4) polybenzo-oxazole precursor contains a structural unit originating from a diamine having a silyl group or a siloxane bond and/or a derivative of the diamine, the interaction at an interface between the cured film of the resin composition and a base substrate increases, so that the adhesion with the base substrate and the chemical resistance of the cured film can be improved.

As the diamine having a silyl group or a siloxane bond and its derivative, for example, 1,3-bis(3-aminopropyl)tetramethyl disiloxane or 1,9-bis(4-aminophenyl)octamethyl pentasiloxane can be cited.

<Structural Unit Originating from Amine Having Oxyalkylene Structure and its Derivative>

It is preferable that the one or more species of resins selected from the (A-1) polyimide, the (A-2) polybenzo-oxazole, the (A-3) polyimide precursor, and the (A-4) poly-benzo-oxazole precursor contain a structural unit originating from an amine having an oxyalkylene structure and/or a derivative of the amine. As the one or more species of resins selected from the (A-1) polyimide, the (A-2) polybenzo-oxazole, the (A-3) polyimide precursor, and the (A-4) poly-benzo-oxazole precursor contains a structural unit originating from an amine having an oxyalkylene structure and/or a derivative of the amine, a low-taper pattern shape can be obtained and the mechanical characteristic of a cured film can be improved.

In the case where a cross section of the insulation layer has a low taper shape, even a process of carrying out film formation of an organic thin film layer and a second electrode subsequently to insulation layer formation will smooth formation of these films at their boundary portions, so that film thickness nonuniformity resulting from level differences or the like can be reduced and therefore a light emitting device having stable characteristics can be obtained. From the viewpoint of inhibiting the electric field concentration at an edge portion of an electrode, it is preferable that the taper angle be 60° or less, and it is more preferable that the taper angle be 50° or less, and it is even more preferable that the taper angle be 40° or less, and it is particularly preferable that the taper angle be 30° or less. Furthermore, from a viewpoint that an organic EL display element can be provided highly densely, it is preferable that the taper angle be 1° or greater, it is more preferable that the taper angle be 5° or greater, and it is even more preferable that the taper angle be 10° or greater.

As the amine having an oxyalkylene structure and a derivative of the amine, a diamine having an oxyalkylene structure or a triamine having an oxyalkylene structure and/or their derivatives are preferable.

As the diamine having an oxyalkylene structure and its derivative, for example, "JEFFAMINE" (registered trademark) D-230, D-400 of the same, D-2000 of the same, D-4000 of the same, HK-511 of the same, ED-600 of the same, ED-900 of the same, ED-2003 of the same, EDR-148 of the same, EDR-176 of the same, SD-231 of the same, SD-401 of the same, SD-2001 of the same, THF-100 of the same, THF-140 of the same, THF-170 of the same, XTJ-582 of the same, XTJ-578 of the same, XTJ-542 of the same, XTJ-548 of the same, or XTJ-559 of the same, or "ELASTAMINE" (registered trademark) RP-405, RP-409 of the same, RP-2005 of the same, RP-2009 of the same, RT-1000 of the same, RE-600 of the same, RE-900 of the same, RE-2000 of the same, HE-150 of the same, HE-180 of the same, HE-1700 of the same, HT-1700 of the same, RE1-1000 of the same, RE1-2005 of the same, RE1-2007 of the same, RP3-400 of the same, or RP3-5000 of the same (all of which are made by HUNTSMAN) can be cited.

As the triamine having an oxyalkylene structure and its derivative, for example, "JEFFAMINE" (registered trademark) T-403, T-3000 of the same, T-5000 of the same, and ST-404 of the same (all of which are made by HUNTSMAN) can be cited.

In one or more species of resins selected from the (A-1) polyimide, the (A-2) polybenzo-oxazole, the (A-3) polyimide precursor, and the (A-4) polybenzo-oxazole precursor, it is preferable that content ratio of a structural unit originating from an amine having an oxyalkylene structure and/or a derivative of the amine in a structural unit originating from the entire amines and their derivatives be 1 mol % or greater, and it is more preferable that the content ratio thereof be 5 mol % or greater, and it is even more preferable that the content ratio thereof be 10 mol % or greater. When the content ratio thereof is within the range mentioned above, a low-taper pattern shape can be obtained and the mechanical characteristic of a cured film can be improved. On the other hand, it is preferable that the content ratio thereof be 60 mol % or less, and it is more preferable that the content ratio thereof be 50 mol % or less, and it is even more preferable that the content ratio thereof be 40 mol % or less. When the content ratio thereof is within the range mentioned above, the heat resistance of the cured film can be improved.

<End-Capping Agent>

The one or more species of resins selected from the (A-1) polyimide, the (A-2) polybenzo-oxazole, the (A-3) polyimide precursor, and the (A-4) polybenzo-oxazole precursor may each have an end of the resin sealed by an end-capping agent such as a monoamine, a dicarboxylic anhydride, a monocarboxylic acid, a monocarboxylic acid chloride, or a monocarboxylic acid active ester. As the resin end is sealed by an end-capping agent, it is possible to improve the storage stability of a coating liquid of a resin composition that contains the one or more species of resins selected from the (A-1) polyimide, the (A-2) polybenzo-oxazole, the (A-3) polyimide precursor, and the (A-4) polybenzo-oxazole precursor.

As the monoamine for use as an end-capping agent, for example, 5-amino-8-hydroxy quinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 3-amino-4,6-dihydroxy pyrimidine, 2-aminophenol, 3-aminophenol, 4-aminophenol, 2-aminothiophenol, 3-aminothiophenol, or 4-aminothiophenol can be cited.

As the dicarboxylic anhydride for use as an end-capping agent, for example, phthalic anhydride, maleic anhydride, succinic anhydride, 5-norbornene-2,3-dicarboxylic anhydride, cyclohexane dicarboxylic anhydride, or 3-hydroxy phthalic anhydride can be cited.

As the monocarboxylic acid and the monocarboxylic acid chloride for use as an end-capping agent, for example, benzoic acid, 3-carboxy phenol, 4-carboxy phenol, 3-carboxy thiophenol, 4-carboxy thiophenol, 1-hydroxy-7-carboxy naphthalene, 1-hydroxy-6-carboxy naphthalene, 1-hydroxy-5-carboxy naphthalene, 1-mercapto-7-carboxy naphthalene, 1-mercapto-6-carboxy naphthalene, 1-mercapto-5-carboxy naphthalene, 3-carboxy benzene sulfonic aid, 4-carboxy benzene sulfonic aid, and their monocarboxylic acid chlorides, or monocarboxylic acid chlorides of terephthalic acid, phthalic acid, maleic acid, cyclohexane dicarboxylic acid, 1,5-dicarboxy naphthalene, 1,6-dicarboxy naphthalene, 1,7-dicarboxy naphthalene, 2,6-dicarboxy naphthalene can be cited.

As the monocarboxylic acid active ester for use as an end-capping agent, for example, monocarboxylic acid active ester compounds obtained by reaction of the aforementioned acid chlorides with N-hydroxybenzotriazole or N-hydroxy-5-norbornene-2,3-dicarboxy imide can be cited.

The content ratio of the structural unit originating from various carboxylic acids or amines and their derivatives in the (A-1) polyimide, the (A-2) polybenzo-oxazole, the (A-3) polyimide precursor, and/or the (A-4) polybenzo-oxazole precursor can be determined by a combination of $^{1}$H-NMR, $^{13}$C-NMR, $^{15}$N-NMR, IR, TOF-MS, a chemical element analysis method, ash content measurement, etc.

<Physical Properties of (A-1) Polyimide, (A-2) Polybenzo-Oxazole, (A-3) Polyimide Precursor, or (A-4) Polybenzo-Oxazole Precursor>

It is preferable that, in one or more species of resins selected from the (A-1) polyimide, the (A-2) polybenzo-oxazole, the (A-3) polyimide precursor, and the (A-4) polybenzo-oxazole precursor, the number of repetitions n of the structural unit be 5 or greater, and it is more preferable that the number n be 10 or greater, and it is even more preferable that the number n be 15 or greater. When the number of repetitions n is within the range mentioned above, the post-development resolution can be improved. On the other hand, it is preferable that the number of repetitions n be 1,000 or less, and it is more preferable that the number n be 500 or less, and it is even more preferable that the number n be 100 or less. When the number of repetitions n is within the range mentioned above, the leveling property at the time of coating application and the pattern workability with an alkaline developer can be improved.

It is preferable that the weight-average molecular weight (hereinafter, "Mw") of the one or more species of resins selected from the (A-1) polyimide, the (A-2) polybenzo-oxazole, the (A-3) polyimide precursor, and the (A-4) polybenzo-oxazole precursor, in terms of polystyrene measured by gel permeation chromatography (hereinafter, "GPC"), be 1,000 or greater, and it is more preferable that the Mw be 3,000 or greater, and it is even more preferable that the Mw be 5,000 or greater. When the Mw thereof is within the range mentioned above, the post-development resolution can be improved. On the other hand, it is preferable that the Mw thereof be 500,000 or less, and it is more preferable that the Mw be 300,000 or less, and it is even more preferable that the Mw be 100,000 or less. When the Mw thereof is within the range mentioned above, the leveling property at the time of coating application and the pattern workability with an alkaline developer can be improved.

Furthermore, it is preferable that the number-average molecular weight (hereinafter, "Mn") be 1,000 or greater, and it is more preferable that the Mn be 3,000 or greater, and it is even more preferable that the Mn be 5,000 or greater. When the Mn thereof is within the range mentioned above, the post-development resolution can be improved. On the other hand, it is preferable that the Mn thereof be 500,000 or less, and it is more preferable that the Mn be 300,000 or less, and it is even more preferable that the Mn be 100,000 or less. When the Mn thereof is within the range mentioned above, the leveling property at the time of coating application and the pattern workability with an alkaline developer can be improved.

The Mw and Mn of the (A-1) polyimide, the (A-2) polybenzo-oxazole, the (A-3) polyimide precursor, or the (A-4) polybenzo-oxazole precursor can be easily measured as values in terms of polystyrene by GPC, a light scattering method, an X-ray small angle scattering method, etc. The number of repetitions n of the structural unit in the (A-1) polyimide, the (A-2) polybenzo-oxazole, the (A-3) polyimide precursor, or the (A-4) polybenzo-oxazole precursor can be determined as n=Mw/M where M is the molecular weight of the structural unit and Mw is the weight-average molecular weight of the resin.

It is preferable that the alkali dissolution speed of the one or more species of resins selected from the (A-1) polyimide, the (A-2) polybenzo-oxazole, the (A-3) polyimide precursor, and the (A-4) polybenzo-oxazole precursor be 50 nm/min or greater, and it is more preferable that the alkali dissolution speed thereof be 70 nm/min or greater, and it is even more preferable that the alkali dissolution speed be 100 nm/min or greater. When the alkali dissolution speed thereof is within the range mentioned above, the post-development resolution can be improved. On the other hand, it is preferable that the alkali dissolution speed be 12,000 nm/min or less, and it is more preferable that the alkali dissolution speed be 10,000 nm/min or less, and it is even more preferable that the alkali dissolution speed be 8,000 nm/min or less. When the alkali dissolution speed is within the range mentioned above, the film reduction at the time of alkaline development can be inhibited.

The alkali dissolution speed mentioned herein refers to a film thickness reduction value obtained by applying a solution obtained by dissolving the resin in γ-butyrolactone onto an Si wafer, performing prebake at 120° C. for 4 minutes to form a pre-baked film having a film thickness of 10 μm±0.5 μm, developing the pre-baked film with a 2.38 wt % tetramethylammonium hydroxide aqueous solution at 23±1° C. for 60 seconds, and then rinsing the film with water for 30 seconds.

<Synthesis Method for (A-1) Polyimide, (A-2) Polybenzo-Oxazole, (A-3) Polyimide Precursor, or (A-4) Polybenzo-Oxazole Precursor>

The (A-1) polyimide or the (A-3) polyimide precursor can be synthesized by a known method. For example, a method in which tetracarboxylic dianhydride and a diamine (partially replaced with a monoamine that is an end-capping agent) are reacted in a polar solvent, such as N-methyl-2-pyrrolidone at 80 to 200° C. or a method in which tetracarboxylic dianhydride (partially replaced with dicarboxylic anhydride, a monocarboxylic acid, a monocarboxylic acid chloride, or a monocarboxylic acid active ester that is an end-capping agent) and a diamine are reacted at 80 to 200° C., etc. can be cited.

The (A-2) polybenzo-oxazole or the (A-4) polybenzo-oxazole precursor can be synthesized by a known method. For example, a method in which a dicarboxylic acid active diester and a bisaminophenol compound (partly replaced with a monoamine that is an end-capping agent) are reacted in a polar solvent, such as N-methyl-2-pyrrolidone, at 80 to 250° C., a method in which a dicarboxylic acid active diester (partly replaced with a dicarboxylic anhydride, a monocarboxylic acid, a monocarboxylic acid chloride, or a monocarboxylic acid active ester that is an end-capping agent) and a bisaminophenol compound are reacted at 80 to 250° C., etc. can be cited.

It is preferable that the one or more species of resins selected from the (A-1) polyimide, the (A-2) polybenzo-oxazole, the (A-3) polyimide precursor, and the (A-4) polybenzo-oxazole precursor be those obtained by, after end of polymerization reaction, carrying out precipitation in a poor solvent with respect to the one or more species of resins selected from the (A-1) polyimide, the (A-2) polybenzo-oxazole, the (A-3) polyimide precursor, and the (A-4) polybenzo-oxazole precursor, such as methanol or water, and then washing and drying the precipitate. By performing a re-precipitation process, a low-molecular weight component or the like can be removed, so that the mechanical characteristic of the cured film will considerably improve.

A concrete method for synthesizing the (A-1) polyimide, the (A-2) polybenzo-oxazole, the (A-3) polyimide precursor, or the (A-4) polybenzo-oxazole precursor will be described. First, a diamine or the like or a bisaminophenol compound or the like are dissolved in a reaction solvent. Into this solution, a substantially equimolar amount of a carboxylic anhydride or the like is gradually added. Using a mechanical stirrer, the mixture solution is agitated for preferably 0.5 to 50 hours and more preferably 2 to 24 hours at a temperature of preferably 0 to 200° C. and more preferably 40 to 150° C. In the case where an end-capping agent is used, addition of the carboxylic anhydride or the like is followed by agitation at a predetermined temperature for a predetermined time, which is followed by gradual addition of the end-capping agent and agitation.

It suffices that the reaction solvent for use in the polymerization reaction can dissolve diamines or the like or bisaminophenol compounds or the like and carboxylic anhydrides or the like that are raw materials, and it is preferable that the reaction solvent be a polar solvent. As the reaction solvent, for example, amides, such as N,N-dimethylformamide, N,N-dimethylacetamide, or N-methyl-2-pyrrolidone, cyclic esters, such as γ-butyrolactone, γ-valerolactone, δ-valerolactone, γ-caprolactone, ϵ-caprolactone, or α-methyl-γ-butyrolactone, carbonates, such as ethylene carbonate or propylene carbonate, glycols, such as triethylene glycol, phenols, such as m-cresol or p-cresol, and other solvents, such as acetophenone, 1,3-dimethyl-2-imidazolidinone, sulfolane, or dimethyl sulfoxide, can be cited. It is preferable that the amount of the reaction solvent be 100 to 1900 mass parts in the case where the total amount of the diamines or the like or the bisaminophenol compounds or the like and the carboxylic anhydride or the like is assumed to be 100 mass parts, and it is more preferable that the amount of the reaction solvent be 150 to 950 mass parts.

The imide ring closure ratio (imide conversion ratio) of the (A-1) polyimide or the (A-3) polyimide precursor can be easily determined, for example, by the following method. First, an infrared absorption spectrum of the resin is measured, and the presence of absorption peaks (near 1780 $cm^{-1}$ and near 1377 $cm^{-1}$) of imide bonds resulting from the polyimide structure is checked. Next, the resin is thermoset at 350° C. for 1 hour, and then the infrared absorption spectrum thereof is measured. By comparing the peak strengths near 1780 $cm^{-1}$ or near 1377 $cm^{-1}$ before and after the thermosetting, the imide bond content in the resin prior to the thermosetting can be calculated and therefore the imide conversion ratio can be determined.

The oxazole ring closure ratio (oxazole conversion ratio) of the (A-2) polybenzo-oxazole or the (A-4) polybenzo-oxazole precursor can be easily determined by, for example, the following method. First, an infrared absorption spectrum of the resin is measured, and the presence of absorption peaks (near 1574 $cm^{-1}$ and near 1557 $cm^{-1}$) of oxazole bonds resulting from a polybenzo-oxazole structure is checked. Next, the resin is thermoset at 350° C. for 1 hour, and then the infrared absorption spectrum is measured. By comparing the peak strengths near 1574 $cm^{-1}$ or near 1557 $cm^{-1}$ before and after the thermosetting, the oxazole bond content in the resin prior to the thermosetting can be calculated and therefore the oxazole conversion ratio can be determined.

<(A-5) Polysiloxane>

The (A) alkali-soluble resin can contain a (A-5) polysiloxane. The (A-5) polysiloxane is a thermosetting resin. By thermosetting and dehydrocondensing the (A-5) polysiloxane at high temperature, high-heat resistance siloxane bonds (Si—O) are formed. Therefore, by containing in the resin composition the (A-5) polysiloxane that has high-heat resistance siloxane bonds, the heat resistance of the cured film obtained can be improved. Furthermore, since the (A-5) polysiloxane is a resin that improves in heat resistance after dehydrocondensation, the (A-5) polysiloxane is suitable for the cases where the (A-5) polysiloxane is put to uses in which both the property prior to dehydrocondensation and the heat resistance of the cured film are desired to be favorably achieved, and the like.

As the (A-5) polysiloxane for use in the present invention, for example, polysiloxanes obtained by hydrolyzing and dehydrocondensing one or more species selected from trifunctional organosilanes, tetrafunctional organosilanes, difunctional organosilanes, and monofunctional organosilanes can be cited.

Furthermore, the (A-5) polysiloxane has silanol groups as a reactive group. Therefore, in the case where, as the (D) coloring agent described below, a (D1) pigment is particularly contained, silanol groups can interact with and/or bind to surfaces of the (D1) pigment and, at the same time, can interact with and/or bind to surface modifying groups of the (D1) pigment. Therefore, the dispersion stability of the (D1) pigment can be improved.

<Trifunctional Organosilane Unit, Tetrafunctional Organosilane Unit, Difunctional Organosilane Unit, and Monofunctional Organosilane Unit>

It is preferable that the (A-5) polysiloxane for use in the present invention contain a trifunctional organosilane unit and/or a tetrafunctional organosilane unit, from the viewpoint of heat resistance improvement of the cured film and post-development resolution improvement. It is preferable that the trifunctional organosilane be an organosilane unit represented by general formula (20). It is preferable that the tetrafunctional organosilane unit be an organosilane unit represented by general formula (21).

The (A-5) polysiloxane for use in the present invention may contain a difunctional organosilane unit, from the viewpoint of reduced taper of the pattern shape and improvement of mechanical characteristics of the cured film. It is preferable that the difunctional organosilane be an organosilane unit represented by general formula (22).

The (A-5) polysiloxane for use in the present invention may contain a monofunctional organosilane unit from the viewpoint of improvement of storage stability of the coating liquid of the resin composition. It is preferable that the monofunctional organosilane unit be an organosilane unit represented by general formula (23).

[Chem. 8]

(20)

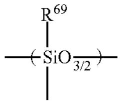

(21)

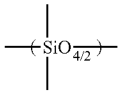

(22)

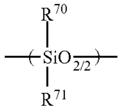

(23)

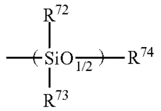

In general formulas (20) to (23), $R^{69}$ to R74 each independently represent hydrogen, an alkyl group, a cycloalkyl group, an alkenyl group, or an aryl group. In general formulas (20) to (23), it is preferable that $R^{69}$ to $R^{74}$ each independently be hydrogen, an alkyl group having a carbon number of 1 to 10, a cycloalkyl group having a carbon number of 4 to 10, an alkenyl group having a carbon number of 2 to 10, or an aryl group having a carbon number of 6 to 15, and it is more preferable that $R^{69}$ to $R^{74}$ each independently be hydrogen, an alkyl group having a carbon number of 1 to 6, a cycloalkyl group having a carbon number of 4 to 7, an alkenyl group having a carbon number of 2 to 8, or an aryl group having a carbon number of 6 to 10. The alkyl group, the cycloalkyl group, the alkenyl group, and the aryl group mentioned above may have a heteroatom and may be either an unsubstituted product or a substitution product.

As the alkyl groups of $R^{69}$ to $R^{74}$ in general formulas (20) to (23), for example, methyl groups, ethyl groups, n-propyl groups, isopropyl groups, n-butyl groups, t-butyl groups, n-hexyl groups, and n-decyl groups can be cited. Furthermore, as their substituents, for example, halogen atoms, epoxy groups, glycidyl groups, oxetanyl groups, amino groups, mercapto groups, or isocyanate groups can be cited. As $R^{69}$ to $R^{74}$ in the case where the alkyl groups are substitution products, for example, trifluoromethyl groups, 3,3,3-trifluoropropyl groups, 3-glycidoxypropyl groups, 2-(3,4-epoxy cyclohexyl)ethyl groups, 3-[(3-ethyl-3-oxetanyl)methoxy]propyl groups, 3-aminopropyl groups, 3-mercapto propyl groups, 3-isocyanate propyl groups, or substituents having a structure indicated below can be cited.

[CHEM. 9]

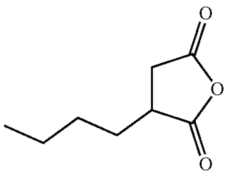

As the cycloalkyl groups of $R^{69}$ to $R^{74}$ in general formulas (20) to (23), for example, cyclopentyl groups or cyclohexyl groups can be cited. Furthermore, as their substituents, for example, halogen atoms, epoxy groups, glycidyl groups, oxetanyl groups, amino groups, mercapto groups, or isocyanate groups can be cited.

As the alkenyl groups and their substitution products of $R^{69}$ to $R^{74}$ in general formulas (20) to (23), for example, vinyl groups, allyl groups, 3-(meth)acryloxy propyl groups, or 2-(meth)acryloxyethyl groups can be cited.

As the aryl groups and their substitution products of $R^{69}$ to $R^{74}$ in general formulas (20) to (23), for example, phenyl groups, 4-tolyl groups, 4-hydroxyphenyl group, 4-methoxyphenyl groups, 4-t-butylphenyl groups, 1-naphthyl groups, 2-naphthyl groups, 4-styryl groups, 2-phenylethyl groups, 1-(4-hydroxyphenyl)ethyl groups, 2-(4-hydroxyphenyl) ethyl groups, or 4-hydroxy-5-(4-hydroxyphenylcarbonyloxy)pentyl groups can be cited.

As the organosilane having an organosilane unit represented by general formula (20), for example, trifunctional organosilanes, such as methyltrimethoxysilane, methyltriethoxysilane, methyltri-n-propoxysilane, methyltriisoproopoxysilane, methyltri-n-butoxysilane, ethyltrimethoxysilane, ethyltriethoxysilane, ethyltri-n-propoxysilane, ethyltriisoproopoxysilane, ethyltri-n-butoxysilane, n-propyltrimethoxysilane, n-propyltriethoxysilane, isopropyltrimethoxysilane, isopropyltriethoxysilane, n-butyltrimethoxysilane, n-butyltriethoxysilane, n-hexyltrimethoxysilane, n-hexyltriethoxysilane, n-octyltrimethoxysilane, n-decyltrimethoxysilane, cyclopentyltrimethoxysilane, cyclohexyltrimethoxysilane, 3-glycidoxypropyltrimethoxysilane, 3-glycidoxypropyltriethoxysilane, 2-(3,4-epoxy cyclohexyl)ethyltrimethoxysilane, 2-(3,4-epoxy cyclohexyl) ethyltriethoxysilane, 3-[(3-ethyl-3-oxetanyl)methoxy]propyltrimethoxysilane, 3-[(3-ethyl-3-oxetanyl) methoxy]propyltriethoxysilane, 3-aminopropyltrimethoxysilane, 3-aminopropyltriethoxysilane, N-(2-aminoethyl)-3-aminopropyltrimethoxysilane, N-(2-aminoethyl)-3-aminopropyltriethoxysilane, N-phenyl-3-aminopropyltrimethoxysilane, N-(vinyl benzyl)-2-aminoethyl-3-aminopropyltrimethoxysilane hydrochlorate salt, 3-(4-aminophenyl)propyltrimethoxysilane, 1-[4-(3-trimethoxysilylpropyl)phenyl]urea, 1-(3-trimethoxysilylpropyl)urea, 1-(3-triethoxysilylpropyl)urea, 3-trimethoxysilyl-N-(1,3-dimethylbutylidene) propyl amine, 3-triethoxysilyl-N-(1,3-dimethylbutylidene) propyl amine, 3-mercaptopropyltrimethoxysilane, 3-mercapto propyltriethoxysilane, 3-isocyanate propyltrimethoxysilane, 3-isocyanate propyltriethoxysilane, 1,3,5-tris(3-trimethoxysilylpropyl)isocyanuric acid, 1,3,5-tris(3-triethoxysilylpropyl)isocyanuric acid, N-t-butyl-2-(3-trimethoxysilylpropyl) succinimide, or N-t-butyl-2-(3-triethoxysilylpropyl) succinimide, can be cited.

As the organosilane having an organosilane unit represented by general formula (21), for example, tetrafunctional organosilanes, such as tetramethoxysilane, tetraethoxysilane, tetra-n-propoxysilane, tetraisopropoxysilane, tetra-n-butoxysilane, or tetraacetoxysilane, and silicate compounds, such as Methyl Silicate 51 (made by FUSO CHEMICAL CO., LTD.), M Silicate 51, Silicate 40 or Silicate 45 (which are all made by TAMA CHEMICALS CO., LTD.), or Methyl Silicate 51, Methyl Silicate 53A, Ethyl Silicate 40, or Ethyl Silicate 48 (which are all made by COLCOAT CO., LTD.) can be cited. From the viewpoint of heat resistance improvement of the cured film and post-development resolution improvement, tetramethoxysilane, tetraethoxysilane, tetra-n-propoxysilane, Methyl Silicate 51 (made by FUSO CHEMICAL CO., LTD.), M Silicate 51 (made by TAMA CHEMICALS CO., LTD.), or Methyl Silicate 51 (made by COLCOAT CO., LTD.) are preferable.

As the organosilane having an organosilane unit represented by general formula (22), for example, difunctionalorganosilanes, such as dimethyldimethoxysilane, dimethyldiethoxysilane, dimethyldiacetoxysilane, diethyldimethoxysilane, diethyldiethoxysilane, di-n-propyldimethoxysilane, di-n-propyldiethoxysilane, diisoproopyldimethoxysilane, diisopropyldiethoxysilane, di-n-butyldimethoxysilane, diisobutyldimethoxysilane, dicyclopentyldimethoxysilane, cyclohexylmethyldimethoxysilane, 3-glycidoxypropylmethyldimethoxysilane, 3-glycidoxypropyl methyldiethoxysilane, N-(2-aminoethyl)-3-aminopropylmethyldimethoxysilane, 3-mercapto propylmethyldimethoxysilane, or 3-isocyanate propylmethyldiethoxysilane, difunctionalorganosilane oligomers, such as 1,1,3,3-tetramethyl-1,3-dimethoxy disiloxane, 1,1,3,3-tetramethyl-1,3-diethoxy disiloxane, 1,1,3,3-tetraethyl-1,3-dimethoxy disiloxane, 1,1,3,3-tetraethyl-1,3-diethoxy disiloxane, or DMS-S12, DMS-S15, PDS-1615, or PDS-9931 (which are all made by Gelest), can be cited. From the viewpoint of reduced taper of the pattern shape and improvement of mechanical characteristics of the cured film, dimethyldimethoxysilane, dimethyldiethoxysilane, dimethyldiacetoxysilane, diethyldimethoxysilane, diethyldiethoxysilane, di-n-propyldimethoxysilane, di-n-propyldiethoxysilane, diisoproopyldimethoxysilane, diisopropyldiethoxysilane, di-n-butyldimethoxysilane, diisobutyldimethoxysilane, diphenyldimethoxysilane, diphenyldiethoxysilane, 1,1,3,3-tetramethyl-1,3-dimethoxy disiloxane, 1,1,3,3-tetramethyl-1,3-diethoxy disiloxane, 1,1,3,3-tetraethyl-1,3-dimethoxy disiloxane, or 1,1,3,3-tetraethyl-1,3-diethoxy disiloxane is preferable.

As the organosilane having an organosilane unit represented by general formula (23), for example, monofunctional organosilanes, such as trimethylmethoxysilane, trimethylethoxysilane, triethylmethoxysilane, triethylethoxysilane, tri-n-propyltrimethoxysilane, tri-n-propyltriethoxysilane, tri-n-butyltrimethoxysilane, tri-n-butyltriethoxysilane, (3-glycidoxypropyl)dimethylmethoxysilane, or (3-glycidoxypropyl)dimethylethoxysilane, can be cited.

It is preferable that the (A-5) polysiloxane for use in the present invention be a (A-5) polysiloxane obtained by hydrolyzing and dehyrocondensing one or more species selected from organosilanes represented by general formula (20a), organosilanes represented by general formula (21a), organosilanes represented by general formula (22a), and organosilanes represented by general formula (23a).

[CHEM. 10]

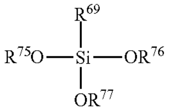

(20a)

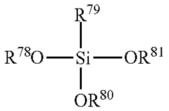

(21a)

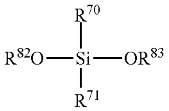

(22a)

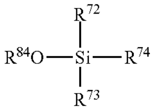

(23a)

In general formulas (20a) to (23a), $R^{69}$ to $R^{74}$ each independently represent hydrogen, an alkyl group, a cycloalkyl group, an alkenyl group, or an aryl group, and $R^{75}$ to $R^{84}$ each independently represent hydrogen, an alkyl group, an acyl group, or an aryl group. In general formulas (20a) to (23a), it is preferable that $R^{69}$ to $R^{74}$ each independently be hydrogen, an alkyl group having a carbon number of 1 to 10, a cycloalkyl group having a carbon number of 4 to 10, an alkenyl group having a carbon number of 2 to 10, or an aryl group having a carbon number of 6 to 15, and it is more preferable that $R^{69}$ to $R^{74}$ each independently be hydrogen, an alkyl group having a carbon number of 1 to 6, a cycloalkyl group having a carbon number of 4 to 7, an alkenyl group having a carbon number of 2 to 8, or an aryl group having a carbon number of 6 to 10. Furthermore, it is preferable that $R^{75}$ to $R^{84}$ each independently be hydrogen, an alkyl group having a carbon number of 1 to 6, an acyl group having a carbon number of 2 to 6, or an aryl group having a carbon number of 6 to 15, and it is more preferable that $R^{75}$ to $R^{84}$ each independently be hydrogen, an alkyl group having a carbon number of 1 to 4, an acyl group having a carbon number of 2 to 4, or an aryl group having a carbon number of 6 to 10. The alkyl group, the cycloalkyl group, the alkenyl group, the aryl group, and the acyl group mentioned above may have a heteroatom, and may be either an unsubstituted product or a substitution product.

In (A-5) polysiloxane, the organosilane unit represented by general formula (20), the organosilane unit represented by general formula (21), the organosilane unit represented by general formula (22), and the organosilane unit represented by general formula (23) may be in either a regular sequence or an irregular sequence. As the regular sequence, for example, alternating copolymerization, periodic copolymerization, block copolymerization, graft copolymerization, etc. can be cited. As the irregular sequence, for example, random copolymerization and the like can be cited.

Furthermore, in the (A-5) polysiloxane, the organosilane unit represented by general formula (20), the organosilane unit represented by general formula (21), the organosilane unit represented by general formula (22), and the organosilane unit represented by general formula (23) may be either a two-dimensional sequence or a three-dimensional sequence. As the two-dimensional sequence, for example, a straight chain type can be cited. As the three-dimensional sequence, for example, a ladder type, a cage type, a network type, etc. can be cited.

The content ratio of the various organosilane units in the (A-5) polysiloxane can be determined by a combination of $^{1}$H-NMR, $^{13}$C-NMR, $^{29}$Si-NMR, IR, TOF-MS, a chemical element analysis method, ash content measurement, etc.

<Physical Properties of (A-5) Polysiloxane>

It is preferable that the Mw of the (A-5) polysiloxane for use in the present invention, in terms of polystyrene measured by GPC, be 500 or greater, and it is more preferable that the Mw thereof be 700 or greater, and it is even more preferable that the Mw be 1,000 or greater. When the Mw is within the range mentioned above, the post-development resolution can be improved. On the other hand, it is preferable that the Mw be 100,000 or less, and it is more preferable that the Mw be 50,000 or less, and it is even more preferable that the Mw be 20,000 or less. When the Mw is within the range mentioned above, the leveling property at the time of coating application and the pattern workability with an alkaline developer can be improved.

<Synthesis Method for (A-5) Polysiloxane>

The (A-5) polysiloxane can be synthesized by a known method. For example, a method in which an organosilane is hydrolyzed in a reaction solvent to cause dehydrocondensation, or the like can be cited. As the method for hydrolyzing and dehydrocondensing an organosilane, for example, a method in which a reaction solvent and water and, as needed, a catalyst are added to a mixture that contains an organosilane, and heating and agitating it for 0.5 to 100 hours at 50 to 150° C. and, preferably, 90 to 130° C., or the like can be cited. Note that during heating and agitation, a hydrolysis secondary product (alcohol such as methanol) and a condensation byproduct (water) may be distilled away by distillation as needed.

<(A-6) Cardo Based Resin>

The (A) alkali-soluble resin can contain a (A-6) cardo based resin. The (A-6) cardo based resin is a thermosetting resin, has a structure in which a main chain and a bulky side chain are connected by one atom, and has as the bulky side chain a cyclic structure that is high heat resistant and rigid, such as a fluorene ring. Therefore, as the resin composition contains the (A-6) cardo based resin having a cyclic structure that is high heat resistant and rigid, such as a fluorene ring, the heat resistance of the cured film obtained can be improved. Hence, the (A-6) cardo based resin is suitable for the case where the cured film is put to a use in which heat resistance is required, and the like cases.

As the (A-6) cardo based resin for use in the present invention, for example, (I) cardo based resins obtained by reacting a phenol compound, a carboxylic anhydride, and an epoxy compound, (II) cardo based resins obtained by reacting an epoxy compound, a carboxylic acid compound and an epoxy compound, or (III) cardo based resins obtained by reacting an epoxy compound, a carboxylic acid compound, and a carboxylic anhydride can be cited.

It is preferable that the (A-6) cardo based resin for use in the present invention have an ethylenic unsaturated bond group. The (A-6) cardo based resin is a resin that allows an ethylenic unsaturated bond group to be easily introduced into a side chain branching from a main chain of the resin. In the case where the (A-6) cardo based resin has an ethylenic unsaturated bond group, the (A-6) cardo based resin is a photo-curable resin and, when UV cured at the time of exposure, forms a three-dimensional crosslink structure of carbon-carbon bonds. Therefore, as the resin composition contains the (A-6) cardo based resin whose side chain has an ethylenic unsaturated bond group, the sensitivity at the time of exposure can be improved. Furthermore, because the three-dimensional crosslink structure formed has an alicyclic structure or an aliphatic structure as a main component, the temperature increase of the softening point of the resin is inhibited, so that a low-taper pattern shape can be obtained and mechanical characteristics of the cured film obtained can be improved. Hence, the (A-6) cardo based resin is suitable for the cases where the cured film is put to a use in which mechanical characteristic is required, and the like cases.

It is preferable, from the viewpoint of heat resistance improvement of the cured film, that the (A-6) cardo based resin for use in the present invention contain one or more species selected from structural units represented by general formula (24), structural units represented by general formula (25), structural units represented by general formula (26), and structural units represented by general formula (27). Furthermore, from the viewpoint of improvement of the sensitivity at the time of exposure and improvement of mechanical characteristics of the cured film, it is preferable that the (A-6) cardo based resin for use in the present invention contain an ethylenic unsaturated bond group at one or more locations of a main chain, a side chain, and an end.

[CHEM. 11]

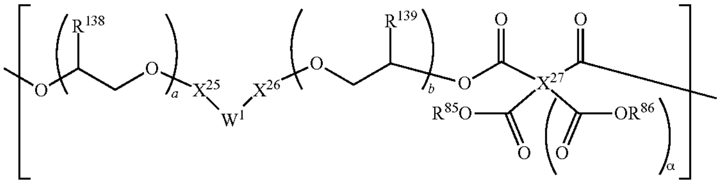
(24)

-continued (25)

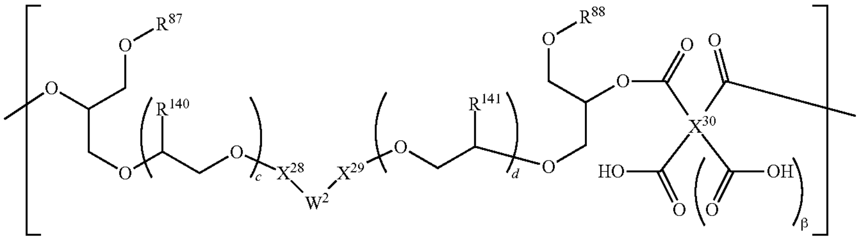

(26)

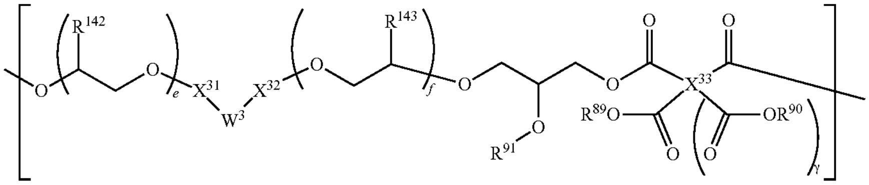

(27)

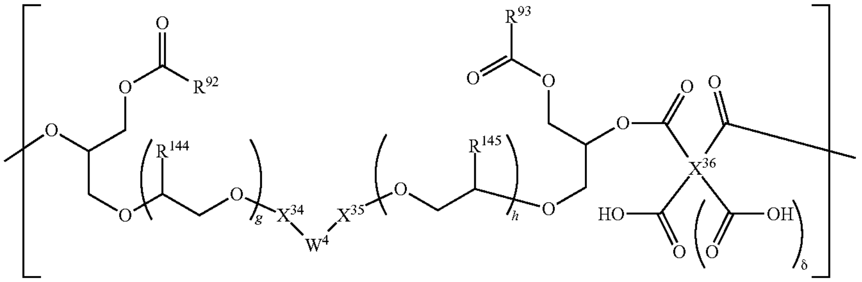

In general formulas (24) to (27), $X^{25}$, $X^{26}$, $X^{28}$, $X^{29}$, $X^{31}$, $X^{32}$, $X^{34}$ and $X^{35}$ each independently represent a monocyclic or condensed polycyclic hydrocarbon ring. $X^{27}$, $X^{30}$, $X^{33}$ and $X^{36}$ each independently represent an organic group having a valence of 2 to 10 that is a carboxylic acid and/or its derivative residue. $W^1$ to $W^4$ each independently represent an organic group that has two or more aromatic groups. $R^{85}$ to $R^{90}$ and $R^{92}$ and $R^{93}$ each independently represent an organic group that has hydrogen or an ethylenic unsaturated bond group and $R^{138}$ to $R^{145}$ each independently represent hydrogen or an alkyl group having a carbon number of 1 to 6. $R^{91}$ represents hydrogen or an alkyl group having a carbon number of 1 to 10. a, b, c, d, e, f, g and h each independently represent an integer of 0 to 10 and α, β, γ, and δ each independently represent an integer of 0 or 1. In general formulas (24) to (27), it is preferable that $X^{25}$, $X^{26}$, $X^{28}$, $X^{29}$, $X^{31}$, $X^{32}$, $X^{34}$ and $X^{35}$ each independently be a monocyclic or condensed polycyclic hydrocarbon ring having a carbon number of 6 to 15 and a valence of 4 to 10 and it is more preferable that $X^{25}$, $X^{26}$, $X^{28}$, $X^{29}$, $X^{31}$, $X^{32}$, $X^{34}$ and $X^{35}$ each independently be a monocyclic or condensed polycyclic hydrocarbon ring having a carbon number of 6 to 10 and a valence of 4 to 10. Furthermore, it is preferable that $X^{27}$, $X^{30}$, $X^{33}$ and $X^{36}$ each independently be an organic group having a valence of 2 to 10 that has one or more species selected from an aliphatic structure having a carbon number of 2 to 20, an alicyclic structure having a carbon number of 4 to 20, and an aromatic structure having a carbon number of 6 to 30, and it is more preferable that $X^{27}$, $X^{30}$, $X^{33}$ and $X^{36}$ each independently be an organic group having a valence of 4 to 10 that has one or more species selected from an aliphatic structure having a carbon number of 4 to 15, an alicyclic structure having a carbon number of 4 to 15, and an aromatic structure having a carbon number of 6 to 25. Furthermore, it is preferable that $W^1$ to $W^4$ each independently be a substituent represented by any one of general formulas (28) to (33). Furthermore, it is preferable that $R^{85}$ to $R^{90}$, $R^{92}$ and $R^{93}$ each independently be a substituent represented by general formula (34), and it is preferable that $R^{138}$ to $R^{145}$ each independently be hydrogen or an alkyl group having a carbon number of 1 to 4. Furthermore, it is preferable that $R^{91}$ be hydrogen or an alkyl group having a carbon number of 1 to 6. The alkyl chain, the aliphatic structure, the alicyclic structure, the aromatic structure, the monocyclic or condensed polycyclic aromatic hydrocarbon ring, and the organic group having an ethylenic unsaturated bond group mentioned above may have a heteroatom and may be either an unsubstituted product or a substitution product.

[CHEM.12]

(28)

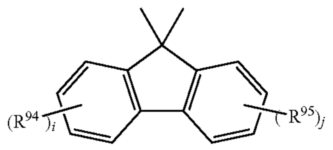

(29)

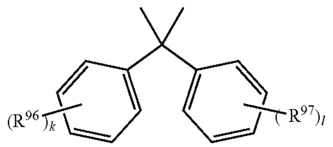

-continued (30)

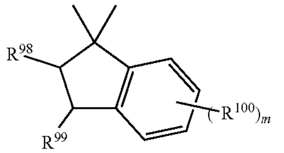

(31)

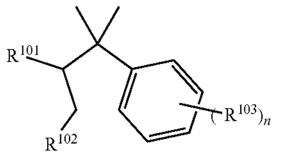

(32)

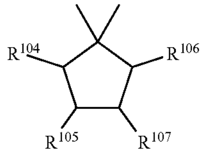

(33)

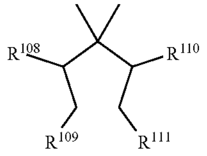

In general formulas (28) to (33), $R^{94}$ to $R^{97}$ and $R^{100}$ and $R^{103}$ each independently represent an alkyl group having a carbon number of 1 to 10. $R^{98}$, $R^{99}$, $R^{101}$, $R^{102}$, $R^{104}$, $R^{106}$, $R^{108}$ to $R^{111}$ each independently represent hydrogen, an alkyl group having a carbon number of 1 to 10, a cycloalkyl group having a carbon number of 4 to 10, or an aryl group having a carbon number of 6 to 15. $R^{105}$ and $R^{107}$ each independently represent hydrogen, an alkyl group having a carbon number of 1 to 10, a cycloalkyl group having a carbon number of 4 to 10, or an aryl group having a carbon number of 6 to 15, and $R^{105}$ and $R^{107}$ may together form a ring. As the ring formed by $R^{105}$ and $R^{107}$, for example, a benzene ring or a cyclohexane ring can be cited. At least one of $R^{98}$ and $R^{99}$ is an aryl group having a carbon number of 6 to 15. At least one of $R^{101}$ and $R^{102}$ is an aryl group having a carbon number of 6 to 15. At least one of $R^{104}$ and $R^{105}$ is an aryl group having a carbon number of 6 to 15, at least one of $R^{106}$ and $R^{107}$ is an aryl group having a carbon number of 6 to 15, and $R^{105}$ and $R^{107}$ may together form a ring. At least one of $R^{108}$ and $R^{109}$ is an aryl group having a carbon number of 6 to 15, and at least one of $R^{110}$ and $R^{111}$ is an aryl group having a carbon number of 6 to 15. i, j, k, l, m and n each independently represent an integer of 0 to 4. In general formulas (28) to (33), it is preferable that $R^{94}$ to $R^{97}$ and $R^{100}$ and $R^{103}$ each independently be an alkyl group having a carbon number of 1 to 6. Furthermore, it is preferable that $R^{98}$, $R^{99}$, $R^{101}$, $R^{102}$, $R^{104}$, $R^{106}$, $R^{108}$ to $R^{111}$ each independently be hydrogen, an alkyl group having a carbon number of 1 to 6, a cycloalkyl group having a carbon number of 4 to 7, or an aryl group having a carbon number of 6 to 10. It is preferable that $R^{105}$ and $R^{107}$ each independently be hydrogen, an alkyl group having a carbon number of 1 to 6, a cycloalkyl group having a carbon number of 4 to 7, or an aryl group having a carbon number of 6 to 10, and it is preferable that the ring formed by $R^{105}$ and $R^{107}$ be a benzene ring. The alkyl chain, the cycloalkyl group, and the aryl group mentioned above may be either an unsubstituted product or a substitution product.

[CHEM. 13]

(34)

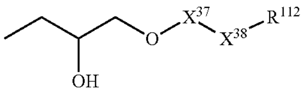

In general formula (34), $X^{37}$ represents a direct bond, an alkylene chain having a carbon number of 1 to 10, a cycloalkylene chain having a carbon number of 4 to 10, or an arylene chain having a carbon number of 6 to 15, and $X^{38}$ represents a direct bond or an arylene chain having a carbon number of 6 to 15. $R^{112}$ represents a vinyl group, an aryl group, or a (meth)acrylic group. In general formula (34), it is preferable that $X^{37}$ be a direct bond, an alkylene chain having a carbon number of 1 to 6, a cycloalkylene chain having a carbon number of 4 to 7, or an arylene chain having a carbon number of 6 to 10. Furthermore, it is preferable that $X^{38}$ be a direct bond or an arylene chain having a carbon number of 6 to 10. The alkylene chain, the cycloalkylene chain, the arylene group, the vinyl group, the aryl group, and the (meth)acrylic group mentioned above may be either an unsubstituted product or a substitution product.

<Synthesis Method for (A-6) Cardo Based Resin>

It is preferable that the (A-6) cardo based resin for use in the present invention be one or more species of (A-6) cardo based resins of (I) to (IV) below.

As the (A-6) cardo based resin of (I), a (A-6) cardo based resin obtained by ring-opening addition reaction of a resin obtained by reacting a compound having two or more aromatic groups in the molecule and hydroxy groups which is represented by general formula (35) and a multifunctional active carboxylic acid derivative (one or more species selected from tetracarboxylic dianhydrides, dicarboxylic dichlorides, and dicarboxylic acid active diesters), with an unsaturated compound having an ethylenic unsaturated bond group and an epoxy group which is represented by general formula (37) can be cited. As the multifunctional active carboxylic acid derivative, a tetracarboxylic dianhydride is preferable. In addition to the multifunctional active carboxylic acid derivative, a tricarboxylic anhydride, a dicarboxylic anhydride, a monocarboxylic acid chloride, or a monocarboxylic acid active ester may be used as an end-capping agent among reaction components.

As the (A-6) cardo based resin of (II), a (A-6) cardo based resin obtained by reacting a resin obtained by ring-opening addition reaction of a compound having two or more aromatic groups in the molecule and hydroxy groups which is represented by general formula (35) and an unsaturated compound having an ethylenic unsaturated bond group and an epoxy group which is represented by general formula (37), with a multifunctional active carboxylic acid derivative (one or more species selected from tetracarboxylic dianhydrides, dicarboxylic dichlorides, and dicarboxylic acid active diesters) can be cited. As the multifunctional active carboxylic acid derivative, a tetracarboxylic dianhydride is preferable. In addition to the multifunctional active carboxylic acid derivative, a tricarboxylic anhydride, a dicarboxylic anhydride, a monocarboxylic acid chloride, or a monocarboxylic acid active ester may be used as an end-capping agent among reaction components.

As the (A-6) cardo based resin of (III), a (A-6) cardo based resin obtained by ring-opening addition reaction of a resin obtained by ring-opening addition reaction of a compound having two or more aromatic groups in the molecules and an epoxy group which is represented by general formula (36) and a multifunctional carboxylic acid (one or more species selected from tetracarboxylic acids, tricarboxylic acids, and dicarboxylic acids), with an unsaturated compound having an ethylenic unsaturated bond group and an epoxy group which is represented by general formula (37) can be cited. As the multifunctional carboxylic acid, a tetracarboxylic acid or a tricarboxylic acid is preferable. In addition to the multifunctional carboxylic acid, a monocarboxylic acid may be used as an end-capping agent among reaction components.

As the (A-6) cardo based resin of (IV), a (A-6) cardo based resin obtained by reacting a resin obtained by ring-opening addition reaction of a compound having two or more aromatic groups in the molecules and an epoxy group which is represented by general formula (36) and an unsaturated carboxylic acid having an ethylenic unsaturated bond group, with a multifunctional active carboxylic acid derivative (one or more species selected from tetracarboxylic dianhydrides, dicarboxylic dichlorides, and dicarboxylic acid active diesters) can be cited. As the multifunctional active carboxylic acid derivative, a tetracarboxylic dianhydride is preferable. In addition to the multifunctional active carboxylic acid derivative, a tricarboxylic anhydride, a dicarboxylic anhydride, a monocarboxylic acid chloride, or a monocarboxylic acid active ester may be used as an end-capping agent among reaction components.

[CHEM. 14]

(35)

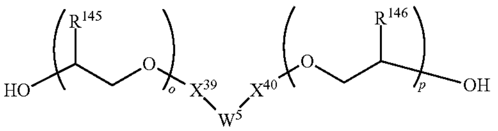

(36)

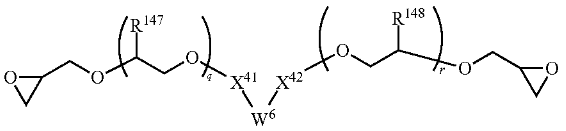

In general formulas (35) and (36), $X^{39}$ to $X^{42}$ each independently represent a monocyclic or condensed polycyclic aromatic hydrocarbon ring, and $W^5$ and $W^6$ each independently represent an organic group having two or more aromatic groups. $R^{145}$ to $R^{148}$ each independently represent hydrogen or an alkyl group having a carbon number of 1 to 6. o, p, q and r each independently represent an integer of 0 to 10. In general formulas (35) and (36), it is preferable that $X^{39}$ to $X^{42}$ each independently be a monocyclic or condensed polycyclic aromatic hydrocarbon ring having a carbon number of 6 to 15 and a valence of 4 to 10, and it is more preferable that $X^{39}$ to $X^{42}$ each independently be a monocyclic or condensed polycyclic aromatic hydrocarbon ring having a carbon number of 6 to 10 and a valence of 4 to 10. Furthermore, it is preferable that $W^5$ and $W^6$ each independently be a substituent represented by any one of general formulas (28) to (33) mentioned above. Furthermore, it is preferable that $R^{145}$ to $R^{148}$ each independently be hydrogen or an alkyl group having a carbon number of 1 to 4. The monocyclic or condensed polycyclic aromatic hydrocarbon ring mentioned above may have a heteroatom and may be either an unsubstituted product or a substitution product.

[CHEM. 15]

(37)

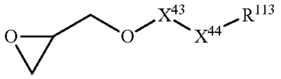

In general formula (37), $X^{43}$ represents a direct bond, an alkylene chain having a carbon number of 1 to 10, a cycloalkylene chain having a carbon number of 4 to 10, or an arylene chain having a carbon number of 6 to 15. In the case where $X^{43}$ is a direct bond or an arylene chain having a carbon number of 6 to 15, $X^{44}$ represents a direct bond. In the case where $X^{43}$ is an alkylene chain having a carbon number of 1 to 10 or a cycloalkylene chain having a carbon number of 4 to 10, $X^{44}$ represents a direct bond or an arylene chain having a carbon number of 6 to 15. $R^{113}$ represents a vinyl group, an aryl group, or a (meth)acrylic group. In general formula (37), it is preferable that $X^{43}$ be a direct bond, an alkylene chain having a carbon number of 1 to 6, a cycloalkylene chain having a carbon number of 4 to 7, or an arylene chain having a carbon number of 6 to 10. Furthermore, it is preferable that $X^{44}$ be a direct bond or an arylene chain having a carbon number of 6 to 10. The alkylene chain, the cycloalkylene chain, the arylene group, the vinyl group, the aryl group, and the (meth)acrylic group mentioned above may have a heteroatom and may be either an unsubstituted product or a substitution product.

As the compound having two or more aromatic groups in the molecule and a hydroxy group which is represented by general formula (35), for example, known compounds, such as 9,9-bis[4-(2-hydroxyethoxy)phenyl]fluorene, 9,9-bis[4-(3-hydroxypropoxy)phenyl]fluorene, 9,9-bis[4-(2-hydroxyethoxy)-3-methylphenyl]fluorene, 9,9-bis[4-(2-hydroxyethoxy)-3,5-dimethylphenyl]fluorene, 9,9-bis(4-hydroxyphenyl)fluorene, 9,9-bis(4-hydroxy-3-methylphenyl)fluorene, or 9,9-bis(4-hydroxy-3,5-dimethylphenyl)fluorene, can be used.

As the compound having two or more aromatic groups in the molecule and an epoxy group which is represented by general formula (36), for example, known compounds, such as 9,9-bis[4-(2-glycidoxyethoxy)phenyl]fluorene, 9,9-bis[4-(3-glycidoxypropoxy)phenyl]fluorene, 9,9-bis[4-(2-glycidoxyethoxy)-3-methylphenyl]fluorene, 9,9-bis[4-(2-glycidoxyethoxy)-3,5-dimethylphenyl]fluorene, 9,9-bis(4-glycidoxyphenyl)fluorene, 9,9-bis(4-glycidoxy-3-methylphenyl)fluorene, or 9,9-bis(4-glycidoxy-3,5-dimethylphenyl)fluorene, can be used.

As the unsaturated compound having an ethylenic unsaturated bond group and an epoxy group which is represented by general formula (37), for example, known compounds, such as glycidyl (meth)acrylate, (α-ethyl)glycidyl (meth)acrylate, (α-n-propyl)glycidyl (meth)acrylate, (α-n-butyl)glycidyl (meth)acrylate, (3,4-epoxy)n-butyl (meth)acrylate, (3,4-epoxy)heptyl (meth)acrylate, (α-ethyl-6,7-epoxy)heptyl (meth)acrylate, can be used.

As the unsaturated carboxylic acid having an ethylenic unsaturated bond group, for example, (meth)acrylic acid, itaconic acid, maleic acid, fumaric acid, mono(2-acryloyloxyethyl) succinate, mono(2-acryloxyethyl) phthalate, mono(2-acryloxyethyl) tetrahydrophthalate, 2-vinyl acetic acid, 2-vinylcyclohexane carboxylic acid, 3-vinylcyclohexane carboxylic acid, 4-vinylcyclohexane carboxylic acid, 2-vinyl benzoic acid, 3-vinyl benzoic acid, 4-vinyl benzoic acid, 4-hydroxyphenyl (meth)acrylate, or 2-hydroxyphenyl (meth)acrylate can be cited.

As the tetracarboxylic acid, the tetracarboxylic dianhydride, the tricarboxylic acid, the tricarboxylic anhydride, the dicarboxylic acid, the dicarboxylic anhydride, the dicarboxylic dichloride, the dicarboxylic acid active diester, the monocarboxylic acid, the monocarboxylic acid chloride, or the monocarboxylic acid active ester, it is possible to cite compounds included in the tetracarboxylic acids and/or their derivatives, tricarboxylic acids and/or their derivatives, dicarboxylic acids and/or their derivatives, monocarboxylic acids, monocarboxylic acid chlorides, or monocarboxylic acid active esters mentioned above.

As the catalyst for use in the ring-opening addition reaction of a compound having two or more aromatic groups in the molecule and an epoxy group which is represented by general formula (36), an unsaturated compound having an ethylenic unsaturated bond group and an epoxy group which is represented by general formula (37), or an unsaturated carboxylic acid having an ethylenic unsaturated bond group, it is possible to cite, for example, amine based catalysts, such as triethylamine, dimethylaniline, tetramethylethylenediamine, 2,4,6-tris(dimethylaminomethyl)phenol, dimethylbenzylamine, or tri-n-octylamine, quaternary ammonium salts, such as tetramethylammonium chloride, tetramethylammonium bromide, or tetramethylammonium fluoride, alkyl ureas, such as tetramethylurea, alkyl guanidines, such as tetramethylguanidine, tin based catalysts, such as tin(II) bis(2-ethylhexanoate) or di-n-butyl tin(IV) dilaurate, titanium based catalysts, such as titanium(IV) tetrakis(2-ethylhexanoate), phosphorus based catalysts, such as triphenyl phosphine or triphenyl phosphine oxide, chromium based catalysts, such as chromium(III) tris(acetylacetonate), chromium(III) chloride, chromium(III) octenoate, or chromium (III) naphthenate, or cobalt based catalysts, such as cobalt (II) octenoate, can be cited.

The content ratio of the structural unit originating from various monomer components in the (A-6) cardo based resin can be determined by a combination of $^{1}$H-NMR, $^{13}$C-NMR, $^{29}$Si-NMR, IR, TOF-MS, a chemical element analysis method, and ash content measurement.

<Physical Properties of (A-6) Cardo Based Resin>

It is preferable that the double-bond equivalent of the (A-6) cardo based resin for use in the present invention be 150 g/mol or greater, and it is more preferable that the double-bond equivalent thereof be 200 g/mol or greater, and it is even more preferable that the double-bond equivalent thereof be 250 g/mol or greater. When the double-bond equivalent thereof be within the range mentioned above, the adhesion with a base substrate can be improved. On the other hand, it is preferable that the double-bond equivalent be 10,000 g/mol or less, and it is more preferable that the double-bond equivalent be 5,000 g/mol or less, and it is even more preferable that the double-bond equivalent be 2,000 g/mol or less. When the double-bond equivalent is within the range mentioned above, the sensitivity at the time of exposure can be improved.

It is preferable that the Mw of the (A-6) cardo based resin for use in the present invention in terms of polystyrene measured by GPC be 500 or greater, and it is more preferable that the Mw thereof be 1,000 or greater, and it is even more preferable that the Mw thereof be 1,500 or greater. When the Mw thereof is within the range mentioned above, the post-development resolution can be improved. On the other hand, it is preferable that the Mw thereof be 100,000 or less, and it is more preferable that the Mw thereof be 50,000 or less, and it is even more preferable that the Mw thereof be 20,000 or less. When the Mw thereof is within the range mentioned above, the leveling property at the time of coating application and the pattern workability with an alkaline developer can be improved.

In the negative-type photosensitive resin composition of the present invention, it is preferable that the content ratio of the total of one or more species of resins selected from the (A-1) polyimide, the (A-2) polybenzoxazole, the (A-3) polyimide precursor, the (A-4) polybenzoxazole precursor, the (A-5) polysiloxane, and the (A-6) cardo based resin in 100 mass % of the (A) alkali-soluble resin be 50 mass % or greater, and it is more preferable that the content ratio be 60 mass % or greater, and it is even more preferable that the content ratio be 70 mass % or greater, and it is yet more preferable that the content ratio be 80 mass % or greater, and it is particularly preferable that the content ratio be 90 mass % or greater. When the content ratio is within the range, the heat resistance of the cured film can be improved. Therefore, the cured film obtained from the negative-type photosensitive resin composition of the present invention is suitable for uses in which a high heat-resistant pattern shape is required, such as insulation layers, including pixel-separating layers in organic EL displays. In particular, in uses in which problems attributable to heat resistance, such as defect or degraded characteristics of an element resulting from degassing due to thermal decomposition, are assumed, the use of the cured film of the negative-type photosensitive resin composition of the present invention makes it possible to produce a highly reliable element that is free from the foregoing problems.

In the negative-type photosensitive resin composition of the present invention, from the viewpoint of heat resistance improvement of the cured film, it is preferable that the (A) alkali-soluble resin be one or more species of resins selected from the (A-1) polyimide, the (A-2) polybenzoxazole, the (A-3) polyimide precursor, the (A-4) polybenzoxazole precursor, the (A-5) polysiloxane, and the (A-6) cardo based resin, and it is more preferable that the (A) alkali-soluble resin be one or more species of resins selected from the (A-1) polyimide, the (A-2) polybenzoxazole, the (A-3) polyimide precursor, the (A-4) polybenzoxazole precursor, and the (A-5) polysiloxane. Furthermore, from the viewpoint of hardness improvement of the cured film, it is preferable that the (A) alkali-soluble resin be one or more species of resins selected from the (A-1) polyimide, the (A-2) polybenzoxazole, the (A-3) polyimide precursor, the (A-4) polybenzoxazole precursor, and the (A-6) cardo based resin.

<(A-7) Other Alkali-Soluble Resins>

The negative-type photosensitive resin composition of the present invention may further contain other alkali-soluble resins or their precursors in such a range that the effects of the present invention are not marred. As the other resins or their precursors, for example, polyamide, polyamide imide, polyhydroxy styrene, acrylic resin, epoxy resin, novolac resin, resol resin, urea resin, polyurethane, or their precursors can be cited.

<(B) Radical Polymerizable Compound>

The negative-type photosensitive resin composition of the present invention contains a (B) radical polymerizable compound. The (B) radical polymerizable compound refers to a compound that has in the molecule a plurality of unsaturated bond groups capable of radical polymerization, and the unsaturated bond groups include an ethylenic unsaturated bond group and an unsaturated triple bond group. At the time of exposure, radicals produced from a (C) photo initiator described below cause radical polymerization of the (B) radical polymerizable compound to progress so that photo-exposed portion of the film of the resin composition becomes insoluble in the alkaline developer. Thus, a negative-type pattern can be formed. In the present invention, the (B) radical polymerizable compound that contains an ethylenic unsaturated bond group is particularly preferable from the viewpoint of reactivity of the radical polymerization and improvement in sensitivity at the time of exposure.

As the (B) radical polymerizable compound is contained, the UV curing at the time of exposure is facilitated, so that the sensitivity at the time of exposure can be improved. Moreover, the post-thermosetting crosslink density improves and therefore the hardness of the cured film can be improved.

In the present invention, it is essential that 51 to 99 mass % of the (B) radical polymerizable compound be a compound having five ethylenic unsaturated bond groups in the (B-1) molecule. As from the foregoing range of the (B) radical polymerizable compound, a compound having 5 or more ethylenic unsaturated bond groups in the molecule is preferable from the viewpoint of improvement in sensitivity at the time of exposure and hardness improvement of the cured film, and a compound having 5 or fewer ethylenic unsaturated bond groups in the molecule is preferable from the viewpoint of obtaining a low-taper pattern shape. Therefore, a compound having five ethylenic unsaturated bond groups is suitable.

In the case where the (B) radical polymerizable compound contains a compound having 5 ethylenic unsaturated bond groups in the (B-1) molecule in an amount within the range of 51 to 99 mass %, the main component being a compound having an appropriate number of functional groups makes it possible to favorably achieve both high sensitivity at the time of exposure and a low-taper pattern shape. A low-taper pattern shape can be obtained in comparison with the case where the (B) radical polymerizable compound contains 50 or greater mass % of a compound having 6 to 10 ethylenic unsaturated bond groups in a (B-2) molecule described below. Furthermore, the sensitivity at the time of exposure can be improved in comparison with the case where the (B) radical polymerizable compound contains 50 or greater mass % of a compound having 2 to 4 ethylenic unsaturated bond groups in a (B-3) molecule described below.

In comparison with the case where the (B) radical polymerizable compound contains 100 mass % of a compound having 5 ethylenic unsaturated bond groups in the (B-1) molecule, the (B) radical polymerizable compound containing that compound in an amount within the range of 51 to 99 mass % makes it possible to obtain a low-taper pattern shape. This is speculated to be because the crosslink structure in the exposed portion changes so that the softening point shifts to a lower temperature. Decrease of the softening point facilitates the flowing of the pattern at the time of performing the heating process on the resin composition, so that a low-taper pattern shape can be obtained.

As for the (B) radical polymerizable compound, from the viewpoint of favorably achieving both high sensitivity at the time of exposure and a low-taper pattern shape, it is preferable that a compound having 5 ethylenic unsaturated bond groups in the (B-1) molecule be in an amount of 51 mass % or greater, and it is more preferable that the compound be in an amount of 61 mass % or greater, and it is even more preferable that the compound be in an amount of 71 mass % or greater, and it is still more preferable that the compound be in an amount of 81 mass % or greater, and it is yet more preferable that the compound be in an amount of 90 mass % or greater, and it is particularly preferable that the compound be in an amount of 91 mass % or greater, and it is most preferable that the compound be in an amount of 93 mass % or greater.

Furthermore, as for the (B) radical polymerizable compound, from the viewpoint of obtaining a low-taper pattern shape, it is preferable that a compound having 5 ethylenic unsaturated bond groups in the (B-1) molecule be in an amount of 99 mass % or less, and it is more preferable that the compound be in an amount of 97 mass % or less, and it is even more preferable that the compound be in an amount of 95 mass % or less, and it is still more preferable that the compound be in an amount of 94 mass % or less, and it is particularly preferable that the compound be in an amount of 93 mass % or less.

From the view point of favorably achieving both high sensitivity at the time of exposure and a low-taper pattern shape, it is preferable that the compound having 5 ethylenic unsaturated bond groups in the (B-1) molecule have a structure represented by general formula (1), and it is more preferable that the compound have a structure represented by general formula (5).

[CHEM. 16]

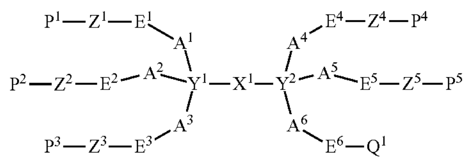

(1)

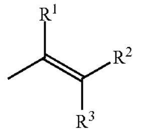

(2)

In general formula (1), $X^1$ represents a bivalent organic group, and $Y^1$ and $Y^2$ each independently represent a quadrivalent organic group. $A^1$ to $A^5$ each independently represent an alkylene group having a carbon number of 1 to 10 or an arylene group having a carbon number of 6 to 15. $A^6$ represents a direct bond, an alkylene group having a carbon number of 1 to 10, or an arylene group having a carbon number of 6 to 15. $E^1$ to $E^6$ each independently represent a direct bond or an oxygen atom. $Z^1$ to $Z^5$ each independently represent a direct bond, a carbonyl group, an alkylene group having a carbon number of 1 to 10, or an arylene group having a carbon number of 6 to 15. $P^1$ to $P^5$ each independently represent a substituent represented by general formula (2). $Q^1$ represents hydrogen, an alkyl group having a carbon number of 1 to 10, or an aryl group having a carbon number of 6 to 15.

In general formula (2), $R^1$ to $R^3$ each independently represent hydrogen, an alkyl group having a carbon number of 1 to 10, or an aryl group having a carbon number of 6 to 15.

[CHEM. 17]

(5)

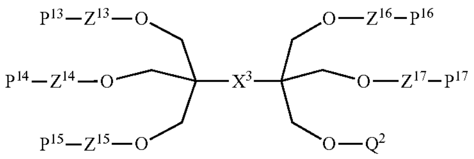

(6)

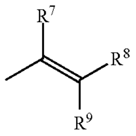

In general formula (5), $X^3$ represents a bivalent organic group. $Z^{13}$ to $Z^{17}$ each independently represent a direct bond, a carbonyl group, an alkylene group having a carbon number of 1 to 10, or an arylene group having a carbon number of 6 to 15. $P^{13}$ to $P^{17}$ each independently represent a substituent represented by general formula (6). $Q^2$ represents hydrogen, an alkyl group having a carbon number of 1 to 10, or an aryl group having a carbon number of 6 to 15.

In general formula (6), $R^7$ to $R^9$ each independently represent hydrogen, an alkyl group having a carbon number of 1 to 10, or an aryl group having a carbon number of 6 to 15.

As for the (B) radical polymerizable compound, it is preferable that 1 to 49 mass % thereof be a compound having 6 to 10 ethylenic unsaturated bond groups in the (B-2) molecule. From the viewpoint of improvement in sensitivity at the time of exposure and hardness improvement of the cured film, it is preferable that 1 to 49 mass % of the (B) radical polymerizable compound be a compound having 6 or more ethylenic unsaturated bond groups in the molecule. From viewpoint of obtaining a low-taper pattern shape, it is preferable that 1 to 49 mass % of the (B) radical polymerizable compound be a compound having 10 or fewer ethylenic unsaturated bond groups in the molecule, it is more preferable that 1 to 49 mass % of the (B) radical polymerizable compound be a compound having 9 or fewer ethylenic unsaturated bond groups in the molecule, it is even more preferable that 1 to 49 mass % of the (B) radical polymerizable compound be a compound having 8 or fewer ethylenic unsaturated bond groups in the molecule, it is still more preferable that 1 to 49 mass % of the (B) radical polymerizable compound be a compound having 7 or fewer ethylenic unsaturated bond groups in the molecule, it is particularly preferable that 1 to 49 mass % of the (B) radical polymerizable compound be a compound having 6 or fewer ethylenic unsaturated bond groups in the molecule, and it is most preferable that 1 to 49 mass % of the (B) radical polymerizable compound be a compound having 6 ethylenic unsaturated bond groups in the molecule.

As for the (B) radical polymerizable compound, from the viewpoint of favorably achieving both high sensitivity at the time of exposure and a low-taper pattern shape, it is preferable that a compound having 6 to 10 ethylenic unsaturated bond groups in the (B-2) molecule be also present in an amount of 1 mass % or greater, it is more preferable that the compound be in an amount of 3 mass % or greater, it is even more preferable that the compound be in an amount of 5 mass % or greater, it is still more preferable that the compound be in an amount of 6 mass % or greater, and it is particularly preferable that the compound be in an amount of 7 mass % or greater. Furthermore, from the viewpoint of obtaining a low-taper pattern shape, it is preferable that a compound having 6 to 10 ethylenic unsaturated bond groups in the (B-2) molecule be in an amount of 49 mass % or less, it is more preferable that the compound be in an amount of 39 mass % or less, it is even more preferable that the compound be in an amount of 29 mass % or less, it is still more preferable that the compound be in an amount of 19 mass % or less, it is yet more preferable that the compound be in an amount of 10 mass % or less, it is particularly preferable that the compound be in an amount of 9 mass % or less, and it is most preferable that the compound be in an amount of 7 mass % or less.

When the (B-2) compound is a compound having 6 ethylenic unsaturated bond groups in the molecule, it is preferable, from the viewpoint of improvement in sensitivity at the time of exposure and hardness improvement of the cured film, that the (B-2) compound have a structure represented by general formula (3), and it is more preferable that the (B-2) compound have a structure represented by general formula (7).

[CHEM. 18]

(3)

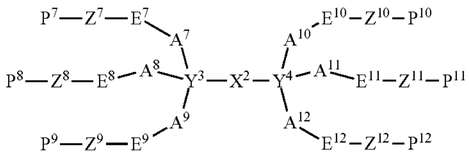

(4)

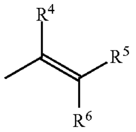

In general formula (3), $X^2$ represents a bivalent organic group and $Y^3$ and $Y^4$ each independently represent a quadrivalent organic group. $A^7$ to $A^{12}$ each independently represent an alkylene group having a carbon number of 1 to 10 or an arylene group having a carbon number of 6 to 15. $E^7$ to $E^{12}$ each independently represent a direct bond or an oxygen atom. $Z^7$ to $Z^{12}$ each independently represent a direct bond, a carbonyl group, an alkylene group having a carbon number of 1 to 10, or an arylene group having a carbon number of 6 to 15. $P^7$ to $P^{12}$ each independently represent a substituent represented by general formula (4).

In general formula (4), $R^4$ to $R^6$ each independently represent hydrogen, an alkyl group having a carbon number of 1 to 10, or an aryl group having a carbon number of 6 to 15.

[CHEM. 19]

(7)

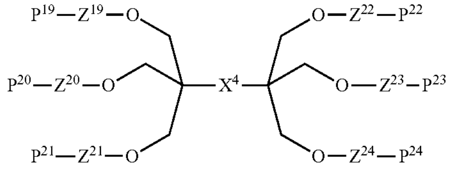

-continued (8)

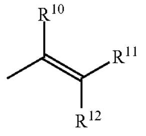

In general formula (7), $X^4$ represents a bivalent organic group. $Z^{19}$ to $Z^{24}$ each independently represent a direct bond, a carbonyl group, an alkylene group having a carbon number of 1 to 10, or an arylene group having a carbon number of 6 to 15. $P^{19}$ to $P^{24}$ each independently represent a substituent represented by general formula (8).

In general formula (8), $R^{10}$ to $R^{12}$ each independently represent hydrogen, an alkyl group having a carbon number of 1 to 10, or an aryl group having a carbon number of 6 to 15.

As for the (B) radical polymerizable compound in the negative-type photosensitive resin composition of the present invention, it is appropriate that the compound having 5 ethylenic unsaturated bond groups in the (B-1) molecule be a compound represented by general formula (1) mentioned above. Furthermore, when the compound having 6 to 10 ethylenic unsaturated bond groups in the (B-2) molecule is a compound having 6 ethylenic unsaturated bond groups in the molecule, it is appropriate that the compound be a compound represented by general formula (3) mentioned above.

Furthermore, as for the (B) radical polymerizable compound, it is appropriate that the compound having 5 ethylenic unsaturated bond groups in the (B-1) molecule be a compound represented by general formula (5) mentioned above. Furthermore, when the compound having 6 to 10 ethylenic unsaturated bond groups in the (B-2) molecule is a compound having 6 ethylenic unsaturated bond groups in the molecule, it is appropriate that the compound be a compound represented by general formula (7) mentioned above.

The (B) radical polymerizable compound may further contain a compound having 2 to 4 ethylenic unsaturated bond groups in the (B-3) molecule in an amount within the range of 1 to 49 mass %. As for the compound having 2 to 4 ethylenic unsaturated bond groups in the (B-3) molecule, a compound having two or more ethylenic unsaturated bond groups in the molecule is preferable from the viewpoint of improvement in sensitivity at the time of exposure and hardness improve of the cured film, and a compound having 4 or fewer ethylenic unsaturated bond groups in the molecule is preferable from the viewpoint of obtaining a low-taper pattern shape.

From the viewpoint of obtaining a low-taper pattern shape, it is preferable that the compound having 2 to 4 ethylenic unsaturated bond groups in the (B-3) molecule be in an amount of 1 mass % or greater in 100 mass % of the (B) radical polymerizable compound, and it is more preferable that the compound be in an amount of 5 mass % or greater. Furthermore, from the viewpoint of improvement in sensitivity at the time of exposure and hardness improve of the cured film, it is preferable that the compound be in an amount of 49 mass % or less, it is more preferable that the compound be in an amount of 39 mass % or less, it is even more preferable that the compound be in an amount of 29 mass % or less, it is still more preferable that the compound be in an amount of 19 mass % or less, it is yet more preferable that the compound be in an amount of 10 mass % or less, it is particularly preferable that the compound be in an amount of 9 mass % or less, and it is most preferable that the compound be in an amount of 7 mass % or less. On the other hand, with regard to the content ratios in the (B) radical polymerizable compound, it is preferable that the compound having 2 to 4 ethylenic unsaturated bond groups in the (B-3) molecule ≤ the compound having 6 to 10 ethylenic unsaturated bond groups in the (B-2) molecule.

It is preferable that the double bond equivalent of the (B) radical polymerizable compound be 80 to 400 g/mol from the viewpoint of improvement in sensitivity at the time of exposure and hardness improve of the cured film.

It is preferable that the (B) radical polymerizable compound be a compound having an acrylic group or a methacryl group, which easily undergo radical polymerization, from the viewpoint of improvement in sensitivity at the time of exposure and hardness improve of the cured film. That is, it is appropriate that the ethylenic unsaturated bond groups in the molecules of the compound having 5 ethylenic unsaturated bond groups in the (B-1) molecule, the compound having 6 to 10 ethylenic unsaturated bond groups in the (B-2) molecule, and the compound having 2 to 4 ethylenic unsaturated bond groups in the (B-3) molecule be acrylic groups or methacryl groups.

As the (B) radical polymerizable compound, for example, diethylene glycol di(meth)acrylate, triethylene glycol di(meth)acrylate, tetraethylene glycol di(meth)acrylate, propylene glycol di(meth)acrylate, trimethylol propane di(meth)acrylate, trimethylol propane tri(meth)acrylate, ethoxylated trimethylol propane di(meth)acrylate, ethoxylated trimethylol propane tri(meth)acrylate, ditrimethylol propane tri(meth) acrylate, ditrimethylolpropane tetra(meth)acrylate, 1,3-butanediol di(meth)acrylate, neopentyl glycol di(meth)acrylate, 1,4-butanediol di(meth)acrylate, 1,6-hexanediol di(meth)acrylate, 1,9-nonane diol di(meth)acrylate, 1,10-decane diol di(meth)acrylate, dimethylol-tricyclodecane di(meth)acrylate, ethoxylated glycerin tri(meth)acrylate, pentaerythritol tri(meth)acrylate, pentaerythritol tetra(meth) acrylate, ethoxylated pentaerythritol tri(meth)acrylate, ethoxylated pentaerythritol tetra(meth)acrylate, dipentaerythritol pentavinyl ether, dipentaerythritol hexavinyl ether, dipentaerythritol pentaallyl ether, dipentaerythritol hexaallyl ether, dipentaerythritol di(meth)acrylate, dipentaerythritol tri(meth)acrylate, dipentaerythritol tetra(meth) acrylate, dipentaerythritol penta(meth)acrylate, dipentaerythritol hexa(meth)acrylate, tripentaerythritol di(meth) acrylate, tripentaerythritol tri(meth)acrylate, tripentaerythritol tetra(meth)acrylate, tripentaerythritol penta(meth)acrylate, tripentaerythritol hexa(meth)acrylate, tripentaerythritol hepta(meth)acrylate, tripentaerythritol octa (meth)acrylate, tetrapentaerythritol penta(meth)acrylate, tetrapentaerythritol hexa(meth)acrylate, tetrapentaerythritol hepta(meth)acrylate, tetrapentaerythritol octa(meth)acrylate, tetrapentaerythritol nona(meth)acrylate, tetrapentaerythritol deca(meth)acrylate, pentapentaerythritol penta (meth)acrylate, pentapentaerythritol hexa(meth)acrylate, pentapentaerythritol hepta(meth)acrylate, pentapentaerythritol octa(meth)acrylate, pentapentaerythritol nona(meth) acrylate, pentapentaerythritol deca(meth)acrylate, pentapentaerythritol undeca(meth)acrylate, pentapentaerythritol dodeca(meth)acrylate, ethoxylated bisphenol A di(meth) acrylate, 2,2-bis[4-(3-(meth)acryloxy-2-hydroxypropoxy) phenyl]propane, 1,3,5-tris((meth)acryloxyethyl)isocyanuric acid, 1,3-bis((meth)acryloxyethyl)isocyanuric acid, 9,9-bis [4-(2-(meth)acryloxyethoxy)phenyl]fluorene, 9,9-bis[4-(3-(meth)acryloxy propoxy)phenyl]fluorene, or 9,9-bis(4-(meth)acryloxy phenyl)fluorene, or their acid-modified products, ethylene oxide-modified products, or propylene oxide-modified products can be cited.

From the viewpoint of favorably achieving both high sensitivity at the time of exposure and a low-taper pattern shape, it is preferable that the compound having 5 ethylenic unsaturated bond groups in the (B-1) molecule be dipentaerythritol pentavinyl ether, dipentaerythritol pentaallyl ether, dipentaerythritol penta(meth)acrylate, tripentaerythritol penta(meth)acrylate, tetrapentaerythritol penta(meth) acrylate, or pentapentaerythritol penta(meth)acrylate, or their acid-modified products, ethylene oxide-modified products, or propylene oxide-modified products, it is more preferable that the compound be dipentaerythritol penta(meth) acrylate, tripentaerythritol penta(meth)acrylate, tetrapentaerythritol penta(meth)acrylate, or pentapentaerythritol penta(meth)acrylate, or their acid-modified products, ethylene oxide-modified products, or propylene oxide-modified products, it is even more preferable that the compound be dipentaerythritol penta(meth)acrylate or its acid-modified products, ethylene oxide-modified products, or propylene oxide-modified products, and it is particularly preferable that the compound be dipentaerythritol penta (meth)acrylate.

Furthermore, from the viewpoint of favorably achieving both high sensitivity at the time of exposure and a low-taper pattern shape, it is preferable that the compound having 6 to 10 ethylenic unsaturated bond groups in the (B-2) molecule be dipentaerythritol hexavinyl ether, dipentaerythritol hexaallyl ether, dipentaerythritol hexa(meth)acrylate, tripentaerythritol hexa(meth)acrylate, tripentaerythritol hepta (meth)acrylate, tripentaerythritol octa(meth)acrylate, tetrapentaerythritol hexa(meth)acrylate, tetrapentaerythritol hepta(meth)acrylate, tetrapentaerythritol octa(meth)acrylate, tetrapentaerythritol nona(meth)acrylate, tetrapentaerythritol deca(meth)acrylate, pentapentaerythritol hexa (meth)acrylate, pentapentaerythritol hepta(meth)acrylate, pentapentaerythritol octa(meth)acrylate, pentapentaerythritol nona(meth)acrylate, or pentapentaerythritol deca(meth) acrylate, or their acid-modified products, ethylene oxide-modified products, or propylene oxide-modified products, it is more preferable that the compound be dipentaerythritol hexa(meth)acrylate, tripentaerythritol hexa(meth)acrylate, tetrapentaerythritol hexa(meth)acrylate, or pentapentaerythritol hexa(meth)acrylate, or their acid-modified products, ethylene oxide-modified product, or propylene oxide-modified product, it is even more preferable that the compound be dipentaerythritol hexa(meth)acrylate or its acid-modified products, ethylene oxide-modified products, or propylene oxide-modified products, and it is particularly preferable that the compound be dipentaerythritol hexa(meth)acrylate.

From the viewpoint of improvement of the post-development resolution, it is also preferable that the compound be a compound obtained by reacting a compound obtained by ring-opening addition reaction of a compound having in its molecule two or more glycidoxy groups and an unsaturated carboxylic acid having an ethylenic unsaturated bond group, with a polybasic acid carboxylic acid or a polybasic carboxylic anhydride.

It is preferable that the content of the (B) radical polymerizable compound in the negative photosensitive resin composition of the present invention be 15 mass parts or greater in the case where the total of the (A) alkali-soluble resin and the (B) radical polymerizable compound is assumed to be 100 mass parts, it is more preferable that the content thereof be 20 mass parts or greater, it is even more preferable that the content thereof be 25 mass parts or greater, and it is particularly preferable that the content thereof be 30 mass parts or greater. When the content thereof is within the range mentioned above, the sensitivity at the time of exposure can be improved and a cured film having a low-taper pattern shape can be obtained. On the other hand, it is preferable that the content of the (B) radical polymerizable compound be 65 mass parts or less, it is more preferable that the content thereof be 60 mass parts or less, it is even more preferable that the content thereof be 55 mass parts or less, and it is particularly preferable that the content thereof be 50 mass parts or less. When the content is within the range mentioned above, the heat resistance of the cured film can be improved and a low-taper pattern shape can be obtained.

As for the (B) radical polymerizable compound, a commercially available one can be directly used and, besides, a plurality of species of commercially obtained species may be mixed so as to obtain a desired ratio. Furthermore, the (B) radical polymerizable compound can also be synthesized by a known method. For example, a method in which, in a system in which a multifunctional alcohol, (meth)acrylic acid, an acid catalyst, and a polymerization terminator have been added to a hydrocarbon based solvent, dehydration-esterification reaction is performed and, through various steps of neutralization and water rinsing, purification, concentration, and filtration, multifunctional (meth)acrylate is obtained, a method in which, in a system in which a multifunctional alcohol, a lower (meth)acrylic acid ester, a catalyst, and a polymerization terminator have been added, transesterification is performed and, through various steps of purification, concentration, and filtration, multifunctional (meth)acrylate is obtained, a method in which a multifunctional alcohol is subjected to condensation reaction with an allyl halide or a vinyl halide in the presence of a catalyst, to obtain a multifunctional allyl ether or a multifunctional vinyl ether, etc. can be cited.

The double bond equivalent of the (B) radical polymerizable compound can be determined by, for example, a method below. Using ICl solution (mixture solution of $ICl_3$, $I_2$, and AcOH (acetic acid)) as an iodine supply source, a KI aqueous solution as an aqueous solution for trapping unreacted iodine, and a $Na_2S_2O_3$ aqueous solution as a titration reagent, the iodine value can be measured by oxidation-reduction titration, so that, from the measured value of the iodine value, a double bond equivalent can be determined.

<(C) Photo Initiator>

The negative-type photosensitive resin composition of the present invention further contains a (C) photo initiator.

The (C) photo initiator refers to a compound that, when exposed to light, undergoes bond cleavage and/or reaction to produce radicals.

As the (C) photo initiator is contained, the radical polymerization of the (B) radical polymerizable compound mentioned above progresses so that the photo-exposed portion of the film of the resin composition becomes insoluble in the alkaline developer and, therefore, a negative-type pattern can be formed. Furthermore, the UV curing at the time of exposure is facilitated and therefore sensitivity can be improved.

As the (C) photo initiator, for example, a benzyl ketal based photo initiator, an α-hydroxyketone based photo initiator, an α-amino ketone based photo initiator, an acyl phosphine oxide based photo initiator, an oxime ester based photo initiator, an acridine based photo initiator, a titanocene based photo initiator, a benzophenone-based photo initiator, an acetophenone based photo initiator, an aromatic ketoester based photo initiator, or a benzoic acid ester based photo initiator is preferable and, from the viewpoint of sensitivity improvement at the time of exposure, an α-hydroxyketone based photo initiator, an α-amino ketone based photo initiator, an acyl phosphine oxide based photo initiator, an oxime ester based photo initiator, an acridine based photo initiator, or a benzophenone-based photo initiator is more preferable, and an α-amino ketone based photo initiator, an acyl phosphine oxide based photo initiator, or an oxime ester based photo initiator is even more preferable.

As the benzyl ketal based photo initiator, for example, 2,2-dimethoxy-1,2-diphenylethane-1-one can be cited.

As the α-hydroxyketone based photo initiator, for example, 1-(4-isopropylphenyl)-2-hydroxy-2-methylpropane-1-one, 2-hydroxy-2-methyl-1-phenylpropane-1-one, 1-hydroxycyclohexyl phenyl ketone, 1-[4-(2-hydroxyethoxy)phenyl]-2-hydroxy-2-methylpropane-1-one, or 2-hydroxy-1-[4-[4-(2-hydroxy-2-methylpropionyl) benzyl]phenyl]-2-methylpropane-1-one can be cited.

As the α-amino ketone based photo initiator, for example, 2-methyl-1-[4-(methylthio)phenyl]-2-morpholino propane-1-one, 2-benzyl-2-dimethylamino-1-(4-morpholino phenyl)-butane-1-one, 2-dimethylamino-2-(4-methylbenzyl)-1-(4-morpholino phenyl)-butane-1-one, or 3,6-bis(2-methyl-2-morpholinopropionyl)-9-octyl-9H-carbazol can be cited.

As the acyl phosphine oxide based photo initiator, for example, 2,4,6-trimethylbenzoyl-diphenyl phosphine oxide, bis(2,4,6-trimethylbenzoyl)-phenyl phosphine oxide, or bis (2,6-dimethoxybenzoyl)-(2,4,4-trimethylpentyl)phosphine oxide can be cited.

As the oxime ester based photo initiator, for example, 1-phenylpropane-1,2-dione-2-(O-ethoxycarbonyl)oxime, 1-phenyl butane-1,2-dione-2-(O-methoxycarbonyl)oxime, 1,3-diphenylpropane-1,2,3-trione-2-(O-ethoxycarbonyl)oxime, 1-[4-(phenylthio)phenyl]octane-1,2-dione-2-(O-benzoyl)oxime, 1-[4-[4-(carboxyphenyl)thio]phenyl]propane-1,2-dione-2-(O-acetyl)oxime, 1-[9-ethyl-6-(2-methylbenzoyl)-9H-carbazol-3-yl]ethanone-1-(O-acetyl)oxime, 1-[9-ethyl-6-[2-methyl-4-[1-(2,2-dimethyl-1,3-dioxolane-4-yl)methyloxy]benzoyl]-9H-carbazol-3-yl]ethanone-1-(O-acetyl)oxime, or 1-(9-ethyl-6-nitro-9H-carbazol-3-yl)-1-[2-methyl-4-(1-methoxypropane-2-yloxy)phenyl]methanone-1-(O-acetyl)oxime can be cited.

As the acridine based photo initiator, for example, 1,7-bis(acridine-9-yl)-n-heptane can be cited.

As the titanocene based photo initiator, for example, bis($\eta^5$-2,4-cyclopentadiene-1-yl)-bis[2,6-difluoro)-3-(1H-pyrrole-1-yl)phenyl]titanium(IV) or bis($\eta^5$-3-methyl-2,4-cyclopentadiene-1-yl)-bis(2,6-difluorophenyl)titanium(IV) can be cited.

As the benzophenone-based photo initiator, for example, benzophenone, 4,4'-bis(dimethylamino) benzophenone, 4,4'-bis(diethylamino) benzophenone, 4-phenylbenzophenone, 4,4-dichlorobenzophenone, 4-hydroxybenzophenone, alkylated benzophenone, 3,3',4,4'-tetrakis(t-butylperoxycarbonyl) benzophenone, 4-methyl benzophenone, dibenzyl ketone, or fluorenone can be cited.

As the acetophenone based photo initiator, for example, 2,3-diethoxyacetophenone, 2,2-diethoxyacetophenone, 4-t-butyldichloroacetophenone, benzalacetophenone, or 4-azidobenzalacetophenone can be cited.

As the aromatic ketoester based photo initiator, for example, 2-phenyl-2-oxymethyl acetate can be cited.

As the benzoic acid ester based photo initiator, for example, ethyl 4-dimethylaminobenzoate, (2-ethyl)hexyl 4-dimethylaminobenzoate, ethyl 4-diethylaminobenzoate, or methyl 2-benzoylbenzoate can be cited.

It is preferable that the content of the (C) photo initiator in the negative photosensitive resin composition of the present invention be 0.1 mass part or larger in the case where the total of the (A) alkali-soluble resin and the (B) radical polymerizable compound is assumed to be 100 mass parts, it is more preferable that the content thereof be 0.5 mass part or larger, it is even more preferable that the content thereof be 0.7 mass part or larger, and it is particularly preferable that the content thereof be 1 mass part or larger. When the content is within the range mentioned above, the sensitivity at the time of exposure can be improved. On the other hand, it is preferable that the content be 25 mass parts or less, it is more preferable that the content be 20 mass parts or less, it is even more preferable that the content be 17 mass parts or less, and it is particularly preferable that the content be 15 mass parts or less. When the content is within the range mentioned above, the post-development resolution can be improved and, at the same time, a low-taper pattern shape can be obtained.

<(D) Coloring Agent>

It is preferable that the negative-type photosensitive resin composition of the present invention further contain a (D) coloring agent.

The (D) coloring agent is a compound that absorbs light of specific wavelengths and, particularly, refers to a compound that produces color by absorbing light of a visible ray wavelength (380 to 780 nm).

The organic EL display is a self-luminous element, so that incidence of external light, such as sun light outdoors, reduces visibility and contrast due to reflection of the external light. Therefore, a technology that reduces external light reflection is required. A method in which a polarizing plate, a quarter wavelength plate, reflection preventing layer, etc. is formed on the light extraction side of the light-emitting elements in order to reduce such external light reflection is known. However, for example, in the case where a polarizing plate is formed, the polarizing plate can reduce the external light reflection but the polarizing plate will also block part of light output from the light-emitting elements, decreasing the luminance of the organic EL display. Therefore, a technology that reduces the external light reflection without using a polarizing plate or the like is required. In this connection, a technique that uses a pixel-separating layer that has a light blocking property to absorb incident external light, so that external light reflection is reduced, can be cited.

Due to containing the (D) coloring agent, the film obtained from the resin composition can be colored, so that it is possible to provide a coloration property that causes light penetrating the film of the resin composition or light reflecting from the film of the resin composition to produce a desired color. Furthermore, it is possible to provide a light blocking property that eliminates the light of a wavelength that (D) coloring agent absorbs from light that penetrates the film of the resin composition or light that reflects from the film of the resin composition.

As the (D) coloring agent, compounds that absorb light of a visible ray wavelength and produce a color of white, red, orange, yellow, green, blue, or violet can be cited. By combining two or more colors of these coloring agents, it is possible to improve the color adjustment property that causes light that penetrates the film of a desired resin composition of the resin composition or light that reflects from the film of the resin composition to have a desired color coordinate.

As for the negative-type photosensitive resin composition of the present invention, it is preferable that the foregoing (D) coloring agent contain a (D1) pigment and/or a (D2) dye described later. As for the negative-type photosensitive resin composition of the present invention, it is preferable that the foregoing (D) coloring agent contain a (Da) black coloring agent and/or a (Db) coloring agent other than black.

The (Da) black coloring agent refers to a compound that produces black color by absorbing light of visible ray wavelengths.

Due to containing the (Da) black coloring agent, the film of the resin composition becomes black, so that the light blocking property that blocks light penetrating the film of the resin composition or light reflecting from the film of the resin composition can be improved. Therefore, the resin composition containing the (Da) black coloring agent is suitable for light-blocking films, such as a black matrix of a color filter or a black column spacer of a liquid crystal display, and for uses in which increased contrast achieved by inhibiting external light reflection is required.

It is preferable, from the viewpoint of light blocking property, that the (Da) black coloring agent be a compound that absorbs light of all the visible ray wavelengths and produce black color. Furthermore, a mixture of two or more colors of (D) coloring agents selected from coloring agents for white, red, orange, yellow, green, blue, or violet is also preferable. By combining two or more colors of these (D) coloring agents, it is possible to produce color of black in a pseudo manner and improve the light blocking property.

As for the negative-type photosensitive resin composition of the present invention, it is preferable that the foregoing (Da) black coloring agent contain one or more species selected from a (D1a) black pigment, a (D2a-1) black dye, and a (D2a-2) mixture of two or more color dyes which are described later. From the viewpoint of light blocking property, it is more preferable that the (Da) black coloring agent contain a (D1a) black pigment described below.

The (Db) coloring agent other than black refers to a compound that creates a color by absorbing light of a visible ray wavelength. That is, the (Db) coloring agent other than black is a coloring agent mentioned above that produces color of white, red, orange, yellow, green, blue, or violet, except black.

By containing the (Da) black coloring agent and the (Db) coloring agent other than black, the film of the resin composition can be provided with light blocking property, coloration property and/or color adjustment property.

As for the negative-type photosensitive resin composition of the present invention, it is preferable that the foregoing (Db) coloring agent other than black contain a (D1b) pigment other than black and/or a (D2b) dye other than black described later, and it is more preferable, from the viewpoint of light blocking property and heat resistance or weather resistance, that the (Db) coloring agent other than black contain a (D1b) pigment other than black described later.

In the negative-type photosensitive resin composition of the present invention, it is preferable that the content ratio of the (D) coloring agent in a total of 100 mass % of the (A) alkali-soluble resin, the (D) coloring agent, and a (E) dispersant described later be 15 mass % or greater, and it is more preferable that the content ratio thereof be 20 mass % or greater, and it is even more preferable that the content ratio thereof be 25 mass % or greater, and it is particularly preferable that the content ratio thereof be 30 mass % or greater. When the content ratio thereof is within the range mentioned above, the light blocking property, the coloration property, or the color adjustment property can be improved. On the other hand, it is preferable that the content ratio of the (D) coloring agent be 80 mass % or less, and it is more preferable that the content ratio thereof be 75 mass % or less, and it is even more preferable that the content ratio thereof be 70 mass % or less, and it is particularly preferable that the content ratio thereof be 65 mass % or less. When the content ratio thereof is within the range mentioned above, the sensitivity at the time of exposure can be improved.

Furthermore, it is preferable that the content ratio of the (D) coloring agent in the entire solid content of the negative photosensitive resin composition of the present invention excluding the solvent be 5 mass % or greater, and it is more preferable that the content ratio thereof be 10 mass % or greater, and it is even more preferable that the content ratio thereof be 15 mass % or greater, and it is particularly preferable that the content ratio thereof be 20 mass % or greater. When the content ratio thereof is within the range mentioned above, the light blocking property, the coloration property, or the color adjustment property can be improved. On the other hand, it is preferable that the content ratio of the (D) coloring agent in the entire solid content be 70 mass % or less, and it is more preferable that the content ratio thereof be 65 mass % or less, and it is even more preferable that the content ratio thereof be 60 mass % or less, and it is still more preferable that the content ratio thereof be 55 mass % or less, and it is particularly preferable that the content ratio thereof be 50 mass % or less. When the content ratio thereof is within the range mentioned above, the sensitivity at the time of exposure can be improved.

From the viewpoint of improvement of the light blocking property, it is preferable that the optical density per 1 μm of film thickness of the cured film obtained by curing the negative-type photosensitive resin composition of the present invention be 0.3 or greater, it is more preferable that the optical density be 0.5 or greater, it is even more preferable that the optical density be 1.0 or greater, it is still more preferable that the optical density be 1.5 or greater, and it is particularly preferable that the optical density be 2.0 or greater. Furthermore, from the viewpoint of improvement of the sensitivity at the time of exposure, it is preferable that the optical density per 1 μm of film thickness be 5.0 or less, and it is more preferable that the optical density be 4.5 or less.

<(D1) Pigment>

As for the negative-type photosensitive resin composition of the present invention, it is preferable that the foregoing (D) coloring agent contain a (D1) pigment. As for a mode in which the foregoing (D) coloring agent contains a (D1) pigment, it is preferable that the (D1) pigment be contained as the (Da) black coloring agent and/or the (Db) coloring agent other than black.

The (D1) pigment refers to a compound that colors an object by the (D1) pigment being physically adsorbed to a surface of the object or by the (D1) pigment and a surface of the object having interaction or the like, and generally is insoluble in solvents and the like. Furthermore, the coloration by the (D1) pigment is high in hiding power and does not easily fade in color due to ultraviolet ray or the like.

As the (D1) pigment is contained, coloration to a color that is excellent in hiding power can be achieved, so that the light blocking property and the weather resistance of the film of the resin composition can be improved.

It is preferable that the number average particle diameter of the (D1) pigment be 1 to 1,000 nm, and it is more preferable that the number average particle diameter thereof be 5 to 500 nm, and it is even more preferable that the number average particle diameter thereof be 10 to 200 nm. When the number average particle diameter of the (D1) pigment is within the range mentioned above, the light blocking property of the film of the resin composition and the dispersion stability of the (D1) pigment can be improved.

Note that the number average particle diameter of the (D1) pigment can be determined by measuring the laser scattering due to Brownian movement of the (D1) pigment in the solution (dynamic light scattering method) through the use of a submicron particle size distribution measurement apparatus (N4-PLUS, made by Beckman Coulter, Inc.) or a zeta potential/particle diameter/molecular weight measurement apparatus (Zeta Sizer Nano ZS, made by SYSMEX CORPORATION). Furthermore, the number average particle diameter of the (D1) pigment in the cured film obtained from the resin composition can be determined by measurement through the use of SEM and TEM. With the magnification factor set to 50,000 to 200,000 times, the number average particle diameter of the (D1) pigment is directly measured. In the case where the (D1) pigment is a true sphere, the diameter of the true sphere is measured and determined as the number average particle diameter. In the case where the (D1) pigment is not a true sphere, the longest diameter (hereinafter, “major axis diameter”) and the longest diameter in directions orthogonal to the major axis diameter (hereinafter, “minor axis diameter”) are measured, and a two-axis average diameter obtained by averaging the major axis diameter and the minor axis diameter is determined as the number average particle diameter.

As the (D1) pigment, for example, organic pigments or inorganic pigments can be cited.

Due to containing an organic pigment, the film of the resin composition can be provided with coloration property or color adjustment property. Moreover, since it is an organic substance, the transmission spectrum or absorption spectrum of the film of the resin composition can be adjusted by achieving transmission or blockage of light of a desired specific wavelength, or the like, through chemical structural change or functional transformation, so that the color adjustment property can be improved. Furthermore, since the organic pigment, compared with common inorganic pigments, is excellent in insulation property and low dielectricity, containment of an organic pigment can improve the resistance value of the film. In particular, in the case where the negative-type photosensitive resin composition of the present invention is used as an insulation layer such as a pixel-separating layer of an organic EL display, the resin composition can inhibit imperfect light emission or the like and can improve reliability.

As the organic pigment, for example, phthalocyanine based pigments, anthraquinone based pigments, quinacridone based pigments, pyranthrone based pigments, dioxazine based pigments, thioindigo based pigments, diketopyrrolopyrrole based pigments, quinophthalone based pigments, threne based pigments, indoline based pigments, isoindoline based pigments, isoindolinone based pigments, benzofuranone based pigments, perylene based pigments, aniline based pigments, azo based pigments, azomethine based pigments, condensed azo based pigments, carbon black, metal complex based pigments, lake pigments, toner pigments, or fluorescence pigments can be cited. From the viewpoint of heat resistance, anthraquinone based pigments, quinacridone based pigments, pyranthrone based pigments, diketopyrrolopyrrole based pigments, benzofuranone based pigments, perylene based pigments, condensed azo based pigments, and carbon black are preferable.

As the phthalocyanine based pigment, for example, copper phthalocyanine based compounds, halogenated copper phthalocyanine based compounds, or metal-free phthalocyanine based compounds can be cited.

As the anthraquinone based pigment, for example, aminoanthraquinone based compounds, diaminoanthraquinone based compounds, anthrapyrimidine based compounds, flavanthrone based compounds, anthanthrone based compounds, indanthrone based compounds, pyranthrone based compounds, or violanthrone based compounds can be cited.

As the azo based pigment, for example, disazo based compounds or polyazo based compounds can be cited.

Due to containing the inorganic pigment contained, the film of the resin composition can be provided with coloration property or color adjustment property. Moreover, since it is an inorganic substance and excellent in heat resistance and weather resistance, the heat resistance and weather resistance of the film of the resin composition can be improved.

As the inorganic pigment, for example, titanium oxide, barium carbonate, zirconium oxide, zinc white, zinc sulfide, white lead, calcium carbonate, barium sulfate, white carbon, alumina white, silicon dioxide, kaolin clay, talc, bentonite, red oxide, molybdenum red, molybdenum orange, chromium vermilion, lead yellow, cadmium yellow, yellow iron oxide, titanium yellow, chromic oxide, viridian, titanium cobalt green, cobalt green, cobalt chromium green, victoria green, ultramarine, iron blue, cobalt blue, cerulean blue, cobalt silica blue, cobalt zinc silica blue, manganese violet, cobalt violet, graphite, silver tin alloy, or fine particles, oxides, composite oxides, sulfides, sulfate salts, nitrate salts, carbonate salts, nitrides, carbides, or oxynitrides of a metal, such as titanium, copper, iron, manganese, cobalt, chromium, nickel, zinc, calcium, or silver, can be cited.

As for the negative-type photosensitive resin composition of the present invention, it is preferable that the foregoing (D1) pigment contain a (D1a) black pigment or a (D1a) black pigment and a (D1b) pigment other than black which are described later.

It is preferable that the content ratio of the (D1) pigment in the entire solid content of the negative photosensitive resin composition of the present invention excluding the solvent be 5 mass % or greater, it is more preferable that the content ratio be 10 mass % or greater, it is even more preferable that the content ratio be 15 mass % or greater, and it is particularly preferable that the content ratio be 20 mass % or greater. When the content ratio is within the range mentioned above, the light blocking property, the coloration property, or the color adjustment property can be improved. On the other hand, it is preferable that the content ratio of the (D1) pigment in the entire solid content be 70 mass % or less, it is more preferable that the content ratio be 65 mass % or less, it is even more preferable that the content ratio be 60 mass % or less, and it is still more preferable that the content ratio be 55 mass % or less, and it is particularly preferable that the content ratio be 50 mass % or less. When the content ratio is within the range mentioned above, the sensitivity at the time of exposure can be improved.

<(D1a) Black Pigment and (D2a) Pigment Other than Black>

As for the negative-type photosensitive resin composition of the present invention, it is preferable that the foregoing (D1) pigment contain a (D1a) black pigment, or a (D1a) black pigment and a (D1b) pigment other than black.

The (D1a) black pigment refers to a pigment that produces black color by absorbing light of visible ray wavelengths.

Due to containing the (D1a) black pigment, the film of the resin composition becomes black and the hiding power is excellent, so that the light blocking property of the film of the resin composition can be improved.

As for the negative-type photosensitive resin composition of the present invention, it is preferable that the foregoing (D1a) black pigment be one or more species selected from a (D1a-1) black organic pigment, a (D1a-2) black inorganic pigment, and a (D1a-3) mixture of two or more coloring pigments that will be described later.

The (D1b) pigment other than black refers to a pigment that produce color of violet, blue, green, yellow, orange, red, or white, except black, by absorbing light of visible ray wavelengths.

As the (D1b) pigment other than black is contained, the film of the resin composition can be colored and can be provided with coloration property or color adjustment property. As two or more colors of (D1b) pigments other than black are combined, the film of the resin composition can be adjusted in color to a desired color coordinate, so that the color adjustment property can be improved.

As the (D1b) pigment other than black, the below described pigments that produce color of white, red, orange, yellow, green, blue, or violet, except black, can be cited.

As for the negative-type photosensitive resin composition of the present invention, it is preferable that the foregoing (D1b) pigment other than black be an (D1b-1) organic pigment other than black and/or an (D1b-2) inorganic pigment other than black that will be described later.

<(D1a-1) Black Organic Pigment, (D1a-2) Black Inorganic Pigment, and (D1a-3) Mixture of Two or More Color Pigments>

As for the negative-type photosensitive resin composition of the present invention, it is preferable that the foregoing (D1a) black pigment be one or more species selected from a (D1a-1) black organic pigment, a (D1a-2) black inorganic pigment, a (D1a-3) mixture of two or more coloring pigments.

The (D1a-1) black organic pigment refers to an organic pigment that produces black color by absorbing light of visible ray wavelengths.

By containing the (D1a-1) black organic pigment, the film of the resin composition becomes black and the hiding power is excellent, so that the light blocking property of the film of the resin composition can be improved. Furthermore, since it is an organic substance, the transmission spectrum or absorption spectrum of the film of the resin composition can be adjusted by achieving transmission or blockage of light of a desired specific wavelength, or the like, through chemical structural change or functional transformation, so that the color adjustment property can be improved. Furthermore, since the (D1a-1) black organic pigment, compared with common inorganic pigments, is excellent in insulation property and low dielectricity, containment of a (D1a-1) black organic pigment can improve the resistance value of the film. In particular, in the case where the negative-type photosensitive resin composition of the present invention is used as an insulation layer such as a pixel-separating layer of an organic EL display, the resin composition can inhibit imperfect light emission or the like and can improve reliability.

As the (D1a-1) black organic pigment, for example, anthraquinone based black pigments, benzofuranone based black pigments, perylene based black pigments, aniline based black pigments, azomethine based black pigments, or carbon black can be cited.

As the carbon black, for example, channel black, furnace black, thermal black, acetylene black, and lamp black can be cited. From the viewpoint of light blocking property, channel black is preferable.

The (D1a-2) black inorganic pigment refers to an inorganic pigment that produces black color by absorbing light of visible ray wavelengths.

Due to containing the (D1a-2) black inorganic pigment, the film of the resin composition becomes black and is excellent in hiding power, so that the light blocking property of the film of the resin composition can be improved. Furthermore, since it is an inorganic substance and more excellent in heat resistance and weather resistance, the heat resistance and weather resistance of the film of the resin composition can be improved.

As the (D1a-2) black inorganic pigment, for example, graphite, silver tin alloy, fine particles, oxides, composite oxides, sulfides, sulfate salts, nitrate salts, carbonate salts, nitrides, carbides, or oxynitrides of a metal, such as titanium, copper, iron, manganese, cobalt, chromium, nickel, zinc, calcium, or silver, can be cited. From the viewpoint of improvement of the light blocking property, it is preferable that the (D1a-2) black inorganic pigment be fine particles, oxides, composite oxides, sulfides, nitrides, carbides, or oxynitrides of titanium or silver, and it is more preferable that the (D1a-2) black inorganic pigment be nitrides or oxynitrides of titanium.

As the black organic pigment or the black inorganic pigment, for example, Pigment Black 1, 6, 7, 12, 20, 31, or 32 can be cited. (The numerical values are each a color index (hereinafter, "CI") number.)

The (D1a-3) mixture of two or more color pigments refers to a pigment mixture that produces black color in a pseudo manner due to combination of two or more color pigments selected from white, red, orange, yellow, green, blue, and violet pigments.

Due to containing the (D1a-3) mixture of two or more color pigments, the film of the resin composition becomes black and is excellent in hiding power, so that the light blocking property of the film of the resin composition can be improved. Furthermore, since two or more color pigments are mixed, the transmission spectrum or absorption spectrum of the film of the resin composition can be adjusted by achieving transmission or blockage of light of a desired specific wavelength, or the like, so that the color adjustment property can be improved.

As the pigment that produces red color, for example, Pigment Red 9, 48, 97, 122, 123, 144, 149, 166, 168, 177, 179, 180, 192, 209, 215, 216, 217, 220, 223, 224, 226, 227, 228, 240, or 250 can be cited (the numerical values are each a CI number).

As the pigment that produces orange color, for example, Pigment Orange 12, 36, 38, 43, 51, 55, 59, 61, 64, 65, or 71 can be cited (the numerical values are each a CI number).

As the pigment that produces yellow color, for example, Pigment Yellow 12, 13, 17, 20, 24, 83, 86, 93, 95, 109, 110, 117, 125, 129, 137, 138, 139, 147, 148, 150, 153, 154, 166, 168, or 185 can be cited (the numerical values are each a CI number).

As the pigment that produces green color, for example, Pigment Green 7, 10, 36, or 58 can be cited (the numerical values are each a CI number).

As the pigment that produces blue color, for example, Pigment Blue 15, 15:3, 15:4, 15:6, 22, 60, or 64 can be cited (the numerical values are each a CI number).

As the pigment that produces violet color, for example, Pigment Violet 19, 23, 29, 30, 32, 37, 40, or 50 can be cited (the numerical values are each a CI number).

As the pigment that produces white color, for example, titanium oxide, barium carbonate, zirconium oxide, zinc white, zinc sulfide, white lead, calcium carbonate, barium sulfate, white carbon, alumina white, silicon dioxide, kaolin clay, talc, or bentonite can be cited.

<(D1b-1) Organic Pigment Other than Black and (D1b-2) Inorganic Pigment Other than Black>

As for the negative-type photosensitive resin composition of the present invention, it is preferable that the (D1b) pigment other than black be an (D1b-1) organic pigment other than black and/or an (D1b-2) inorganic pigment other than black.

The (D1b-1) organic pigment other than black refers to an organic pigment that produces color of white, red, orange, yellow, green, blue, or violet, except black, by absorbing light of visible ray wavelengths.

Due to containing the (D1b-1) organic pigment other than black, the film of the resin composition can be colored and can be provided with coloration property or color adjustment property. Furthermore, since it is an organic substance, the transmission spectrum or absorption spectrum of the film of the resin composition can be adjusted by achieving transmission or blockage of light of a desired specific wavelength, or the like, through chemical structural change or functional transformation, so that the color adjustment property can be improved. As two or more colors of (D1b-1) organic pigments other than black are combined, the film of the resin composition can be adjusted in color to a desired color coordinate, so that the color adjustment property can be improved.

As the (D1 b-1) organic pigment other than black, the below described pigments that produce color of white, red, orange, yellow, green, blue, or violet, except black, can be cited.

As the (D1 b-1) organic pigment other than black, for example, phthalocyanine based pigments, anthraquinone based pigments, quinacridone based pigments, pyranthrone based pigments, dioxazine based pigments, thioindigo based pigments, diketopyrrolopyrrole based pigments, quinophthalone based pigments, threne based pigments, indoline based pigments, isoindoline based pigments, isoindolinone based pigments, benzofuranone based pigments, perylene based pigments, aniline based pigments, azo based pigments, azomethine based pigments, metal complex based pigments, lake pigments, toner pigments, or fluorescence pigments can be cited.

The (D1b-2) inorganic pigment other than black refers to an inorganic pigment that produces color of white, red, orange, yellow, green, blue, or violet, except black, by absorbing light of visible ray wavelengths.

Due to containing the (D1b-2) inorganic pigment other than black, the film of the resin composition can be colored and can be provided with coloration property or color adjustment property. Furthermore, since it is an inorganic substance and more excellent in heat resistance and weather resistance, the heat resistance and weather resistance of the film of the resin composition can be improved. As two or more colors of (D1b-2) inorganic pigments other than black are combined, the film of the resin composition can be adjusted in color to a desired color coordinate, so that the color adjustment property can be improved.

As two or more colors of (D1b-2) inorganic pigments other than black are combined, the film of the resin composition can be adjusted in color to a desired color coordinate, so that the color adjustment property can be improved.

As the (D1b-2) inorganic pigment other than black, inorganic pigments that produce color of white, red, orange, yellow, green, blue, or violet, except black, can be cited.

As the (D1b-2) inorganic pigment other than black, for example, titanium oxide, barium carbonate, zirconium oxide, zinc white, zinc sulfide, white lead, calcium carbonate, barium sulfate, white carbon, alumina white, silicon dioxide, kaolin clay, talc, bentonite, red oxide, molybdenum red, molybdenum orange, chromium vermilion, lead yellow, cadmium yellow, yellow iron oxide, titanium yellow, chromic oxide, viridian, titanium cobalt green, cobalt green, cobalt chromium green, victoria green, ultramarine, iron blue, cobalt blue, cerulean blue, cobalt silica blue, cobalt zinc silica blue, manganese violet, or cobalt violet can be cited.

<(D1a-1a) Benzofuranone Based Black Pigment and (D1a-1b) Perylene Based Black Pigment>

As for the negative-type photosensitive resin composition of the present invention, it is preferable that the (D1a-1) black organic pigment be a (D1a-1a) benzofuranone based black pigment and/or a (D1a-1b) perylene based black pigment.

The (D1a-1a) benzofuranone based black pigment refers to a compound that has in its molecule a benzofuran-2(3H)-one structure or a benzofuran-3(2H)-one structure and that produces black color by absorbing light of visible ray wavelengths.

Due to containing the (D1a-1a) benzofuranone based black pigment, the film of the resin composition becomes black and is excellent in hiding power, so that the light blocking property of the film of the resin composition can be improved. In particular, since the (D1a-1a) benzofuranone based black pigment, compared with common organic pigments, is excellent in the light blocking property per a unit content ratio of the pigment in the resin composition, a reduced content ratio of the (D1a-1a) benzofuranone based black pigment can provide a comparable light blocking property. Therefore, containment of the (D1a-1a) benzofuranone based black pigment can improve the light blocking property of the film and, at the same time, can improve the sensitivity at the time of exposure. Furthermore, since the (D1a-1a) benzofuranone based black pigment absorbs light of visible light ray wavelengths and, on another hand, transmits wavelengths in an ultraviolet region (e.g., 400 nm or less), the sensitivity at the time of exposure can be improved. Furthermore, since it is an organic substance, the transmission spectrum or absorption spectrum of the film of the resin composition can be adjusted by achieving transmission or blockage of light of a desired specific wavelength, or the like, through chemical structural change or functional transformation, so that the color adjustment property can be improved. Particularly, because the transmittance at a wavelength in a near-infrared area (e.g., 700 nm or greater) can be improved, the film of the resin composition containing the (D1a-1a) benzofuranone based black pigment has light blocking property and is suitable for uses in which light of a wavelength in a near-infrared area is utilized. Furthermore, since the (D1a-1a) benzofuranone based black pigment, compared with common organic pigments and inorganic pigments, is excellent in insulation property and low dielectricity, containment of the (D1a-1a) benzofuranone based black pigment can improve the resistance value of the film. In particular, in the case where the negative-type photosensitive resin composition of the present invention is used as an insulation layer such as a pixel-separating layer of an organic EL display, the resin composition can inhibit imperfect light emission or the like and can improve reliability.

It is preferable that the (D1a-1a) benzofuranone based black pigment be a benzofuranone compound represented by any one of general formulas (38) to (43), its geometrical isomer, its salt, or a salt of its geometrical isomer.

[CHEM. 20]

(38)

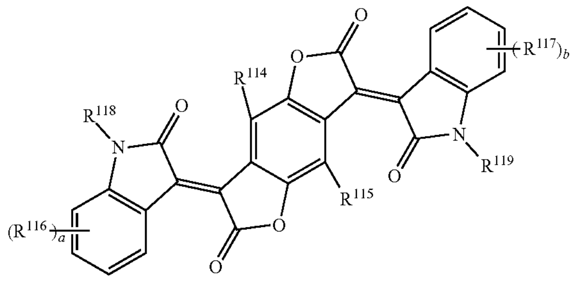

(39)

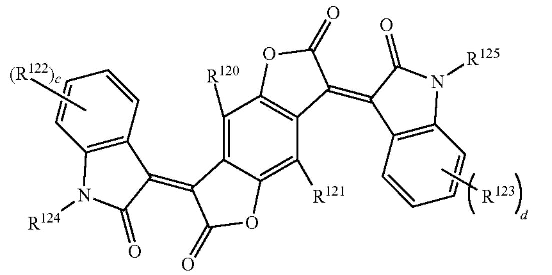

(40)

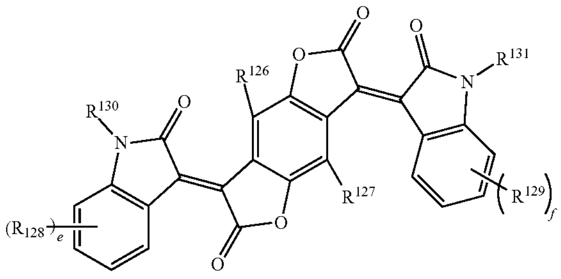

In general formulas (38) to (40), $R^{114}$, $R^{115}$, $R^{120}$, $R^{121}$, $R^{126}$ and $R^{127}$ each independently represent hydrogen, a halogen atom, an alkyl group having a carbon number of 1 to 10, or an alkyl group having a carbon number of 1 to 10 and having 1 to 20 fluorine atoms. $R^{116}$, $R^{117}$, $R^{122}$, $R^{123}$, $R^{128}$ and $R^{129}$ each independently represent hydrogen, a halogen atom, $R^{251}$, COOH, $COOR^{251}$, $COO^-$, $CONH_2$, $CONHR^{251}$, $CONR^{251}R^{252}$, CN, OH, $OR^{251}$, $OCOR^{251}$, $OCONH_2$, $OCONHR^{251}$, $OCONR^{251}R^{252}$, $NO_2$, $NH_2$, $NHR^{251}$, $NR^{251}R^{252}$, $NHCOR^{251}$, $NR^{251}COR^{252}$, $N{=}CH_2$, $N{=}CHR^{251}$, $N{=}CR^{251}R^{252}$, SH, $SR^{251}$, $SOR^{251}$, $SO_2R^{251}$, $SO_3R^{251}$, $SO_3H$, $SO_3$, $SO_2NH_2$, $SO_2NHR^{251}$, or $SO_2NR^{251}R^{252}$, and $R^{251}$ and $R^{252}$ each independently represent an alkyl group having a carbon number of 1 to 10, a cycloalkyl group having a carbon number of 4 to 10, an alkenyl group having a carbon number of 2 to 10, a cycloalkenyl group having a carbon number of 4 to 10, or an alkynyl group having a carbon number of 2 to 10. A plurality of $R^{116}$, $R^{117}$, $R^{122}$, $R^{123}$, $R^{128}$ or $R^{129}$ may form a ring by direct bonds or by an oxygen atom bridge, a sulfur atom bridge, an NH bridge, or $NR^{251}$ bridge. $R^{118}$, $R^{119}$, $R^{124}$, $R^{125}$, $R^{130}$ and $R^{131}$ each independently represent hydrogen, an alkyl group having a carbon number of 1 to 10, or an aryl group having a carbon number of 6 to 15. a, b, c, d, e and f each independently represent an integer of 0 to 4. In general formulas (38) to (40), it is preferable that $R^{114}$, $R^{115}$, $R^{120}$, $R^{121}$, $R^{126}$ and $R^{127}$ each independently be hydrogen, a halogen atom, an alkyl group having a carbon number of 1 to 6, an alkyl group having a carbon number of 1 to 6 and having 1 to 12 fluorine atoms. Furthermore, it is preferable that $R^{251}$ and $R^{252}$ each independently be an alkyl group having a carbon number of 1 to 6, a cycloalkyl group having a carbon number of 4 to 7, an alkenyl group having a carbon number of 2 to 6, cycloalkenyl group having a carbon number of 4 to 7, or an alkynyl group having a carbon number of 2 to 6. Furthermore, it is preferable that $R^{118}$, $R^{119}$, $R^{124}$, $R^{125}$, $R^{130}$ and $R^{131}$ each independently be hydrogen, an alkyl group having a carbon number of 1 to 6, or an aryl group having a carbon number of 6 to 10. The alkyl group, the cycloalkyl group, the alkenyl group, the cycloalkenyl group, the alkynyl group, and the aryl group mentioned above may have a heteroatom and may be either an unsubstituted product or a substitution product.

[CHEM. 21]

(41)

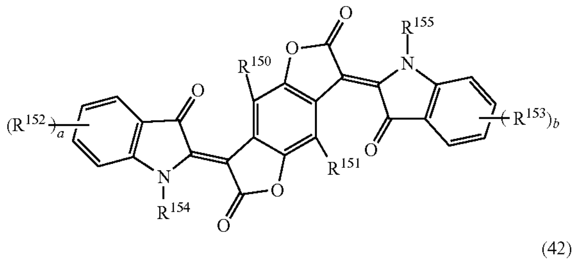

(42)

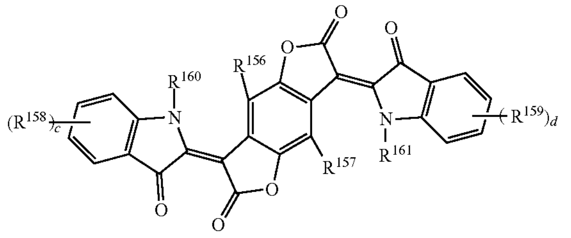

(43)

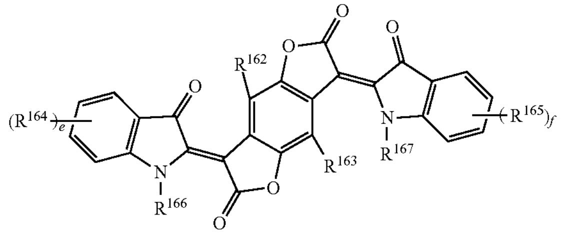

In general formulas (41) to (43), $R^{150}$, $R^{151}$, $R^{156}$, $R^{157}$, $R^{162}$ and $R^{163}$ each independently represent hydrogen, a halogen atom, an alkyl group having a carbon number of 1 to 10, or an alkyl group having a carbon number of 1 to 10 and having 1 to 20 fluorine atoms. $R^{152}$, $R^{153}$, $R^{158}$, $R^{159}$, $R^{164}$ and $R^{165}$ each independently represent hydrogen, halogen atom, $R^{271}$, COOH, $COOR^{271}$, $COO^-$, $CONH_2$, $CONHR^{271}$, $CONR^{271}R^{272}$, CN, OH, $OR^{271}$, $OCOR^{271}$, $OCONH_2$, $OCONHR^{271}$, $OCONR^{271}R^{272}$, $NO_2$, $NH_2$, $NHR^{271}$, $NR^{271}R^{272}$, $NHCOR^{271}$, $NR^{271}COR^{272}$, $N{=}CH_2$, $N{=}CHR^{271}$, $N{=}CR^{271}R^{272}$, SH, $SR^{271}$, $SOR^{271}$, $SO_2R^{271}$, $SO_3R^{271}$, $SO_3H$, $SO_3$, $SO_2NH_2$, $SO_2NHR^{271}$, or $SO_2NR^{271}R^{272}$, and $R^{271}$ and $R^{272}$ each independently represent an alkyl group having a carbon number of 1 to 10, a cycloalkyl group having a carbon number of 4 to 10, an alkenyl group having a carbon number of 2 to 10, a cycloalkenyl group having a carbon number of 4 to 10, or an alkynyl group having a carbon number of 2 to 10. A plurality of $R^{152}$, $R^{153}$, $R^{158}$, $R^{159}$, $R^{164}$ and $R^{165}$ may form a ring by direct bonds or by an oxygen atom bridge, a sulfur atom bridge, an NH bridge, or an $NR^{271}$ bridge. $R^{154}$, $R^{155}$, $R^{160}$, $R^{161}$, $R^{166}$ and $R^{167}$ each independently represent hydrogen, an alkyl group having a carbon number of 1 to 10, or an aryl group having a carbon number of 6 to 15. a, b, c, d, e and f each independently represent an integer or 0 to 4. In general formulas (41) to (43), it is preferable that $R^{150}$, $R^{151}$, $R^{156}$, $R^{157}$, $R^{162}$ and $R^{163}$ each independently be hydrogen, a halogen atom, an alkyl group having a carbon number of 1 to 6, or an alkyl group having a carbon number of 1 to 6 and having 1 to 12 fluorine atoms. Furthermore, it is preferable that $R^{271}$ and $R^{272}$ each independently be an alkyl group having a carbon number of 1 to 6, a cycloalkyl group having a carbon number of 4 to 7, an alkenyl group having a carbon number of 2 to 6, a cycloalkenyl group having a carbon number of 4 to 7, or an alkynyl group having a carbon number of 2 to 6. Furthermore, it is preferable that $R^{154}$, $R^{155}$, $R^{160}$, $R^{161}$, $R^{166}$ and $R^{167}$ each independently be hydrogen, an alkyl group having a carbon number of 1 to 6, or an aryl group having a carbon number of 6 to 10. The alkyl group, the cycloalkyl group, the alkenyl group, the cycloalkenyl group, the alkynyl group, and the aryl group mentioned above may have a heteroatom and may be either an unsubstituted product or a substitution product.

As the (D1a-1a) benzofuranone based black pigment, for example, "IRGAPHOR" (registered trademark) BLACK S0100CF (made by BASF), a black pigment mentioned in International Publication WO 2010-081624, or a black pigment mentioned in International Publication WO 2010-081756 can be cited.

The (D1a-1b) perylene based black pigment refers to a compound that has in its molecule a perylene structure and that produces black color by absorbing light of visible ray wavelengths.

Due to containing the (D1a-1b) perylene based black pigment, the film of the resin composition becomes black and is excellent in hiding power, so that the light blocking property of the film of the resin composition can be improved. In particular, since the (D1a-1b) perylene based black pigment, compared with common organic pigments, is excellent in the light blocking property per a unit content ratio of the pigment in the resin composition, a reduced content ratio of the (D1a-1b) perylene based black pigment can provide a comparable light blocking property. Therefore, containment of the (D1a-1b) perylene based black pigment can improve the light blocking property of the film and, at the same time, can improve the sensitivity at the time of exposure. Furthermore, since it is an organic substance, the transmission spectrum or absorption spectrum of the film of the resin composition can be adjusted by achieving transmission or blockage of light of a desired specific wavelength, or the like, through chemical structural change or functional transformation, so that the color adjustment property can be improved. Particularly, because the transmittance at a wavelength in a near-infrared area (e.g., 700 nm or greater) can be improved, the film of the resin composition containing the (D1a-1b) perylene based black has light blocking property and is suitable for uses in which light of a wavelength in a near-infrared area is utilized.

It is preferable that the (D1a-1b) perylene based black pigment be a perylene compound represented by any one of general formulas (44) to (46), its geometrical isomer, its salt, or a salt of its geometrical isomer.

[CHEM. 22]

(44)

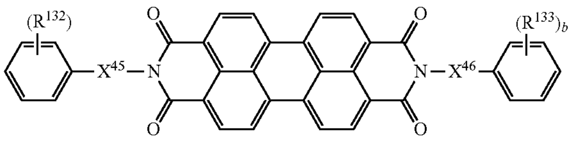

(45)

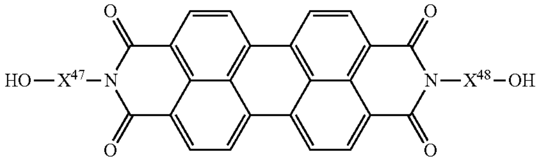

(46)

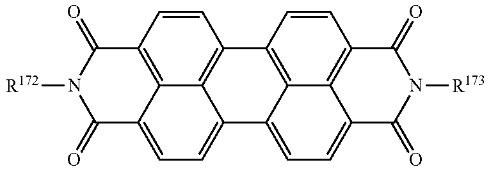

In general formulas (44) to (46), $X^{45}$, $X^{46}$, $X^{47}$ and $X^{48}$ each independently represent an alkylene chain having a carbon number of 1 to 10. $R^{132}$ and $R^{133}$ each independently represent hydrogen, a hydroxy group, an alkoxy group having a carbon number of 1 to 6, and an acyl group having a carbon number of 2 to 6. $R^{172}$ and $R^{173}$ each independently represent hydrogen or an alkyl group having a carbon number of 1 to 10. a and b each independently represent an integer of 0 to 5. In general formulas (44) to (46), it is preferable that $X^{45}$, $X^{46}$, $X^{47}$ and $X^{48}$ each independently be an alkylene chain having a carbon number of 1 to 6. Furthermore, it is preferable that $R^{132}$ and $R^{133}$ each independently be hydrogen, a hydroxy group, an alkoxy group having a carbon number of 1 to 4, or an acyl group having a carbon number of 2 to 4. It is preferable that $R^{172}$ and $R^{173}$ each independently be hydrogen or an alkyl group having a carbon number of 1 to 6. The alkylene chain, the alkoxy group, the acyl group, and the alkyl group mentioned above may have a heteroatom and may be either an unsubstituted product or a substitution product.

As the (D1a-1b) perylene based black pigment, for example, Pigment Black 21, 30, 31, 32, 33, or 34 can be cited (the numerical values are each a CI number).

Besides what have been mentioned above, "PALIOGEN" (registered trademark) BLACK S0084, K0084 of the same, L0086 of the same, K0086 of the same, EH0788 of the same, or FK4281 of the same (which are all made by BASF) can be cited.

It is preferable that the content ratio of the (D1a-1a) benzofuranone based black pigment and/or the (D1a-1b) perylene based black pigment in the entire solid content of the negative photosensitive resin composition of the present invention, excluding the solvent, be 5 mass % or greater, it is more preferable that the content ratio thereof be 10 mass % or greater, it is even more preferable that the content ratio thereof be 15 mass % or greater, and it is particularly preferable that the content ratio thereof be 20 mass % or greater. When the content ratio thereof is within the range mentioned above, the light blocking property and the color adjustment property can be improved. On the other hand, it is preferable that the content ratio of the (D1a-1a) benzofuranone based black pigment and/or the (D1a-1b) perylene based black pigment in the entire solid content be 70 mass % or less, it is more preferable that the content ratio be 65 mass % or less, it is even more preferable that the content ratio be 60 mass % or less, it is still more preferable that the content ratio be 55 mass % or less, and it is particularly preferable that the content ratio be 50 mass % or less. When the content ratio is within the range mentioned above, the sensitivity at the time of exposure can be improved.

<(D2) Dye>

As for the negative-type photosensitive resin composition of the present invention, it is preferable that the foregoing (D) coloring agent contain a (D2) dye. As a mode in which the (D) coloring agent contains a (D2) dye, it is preferable that the (D2) dye be contained as the (Da) black coloring agent and/or the (Db) coloring agent other than black.

The (D2) dye refers to a compound that colors an object because a substituent, such as an ionic group or a hydroxy group, in the (D2) dye undergoes chemical adsorption, strong interaction, or the like with respect to a surface structure of the object, and, generally, is soluble to solvents. Furthermore, because, in the coloration by the (D2) dye, individual molecules thereof are adsorbed to an object, the power of coloration is high and the color development efficiency is high.

Due to containment of the (D2) dye, coloration to a color that is excellent in coloration power can be achieved, so that the coloration property or color adjustment property of the film of the resin composition can be improved.

As the (D2) dye, for example, direct dyes, reactivity dyes, sulfur dyes, vat dyes, acidic dyes, metal-containing dyes, metal-containing acidic dyes, basic dyes, mordant dyes, acidic mordant dye, disperse dyes, cation dyes, or fluorescence whitening dyes can be cited.

As the (D2) dye, anthraquinone based dyes, azo based dyes, azine based dyes, phthalocyanine based dyes, methine based dyes, oxazine based dyes, quinoline based dyes, indigo based dyes, indigoid based dyes, carbonium based dyes, threne based dyes, perinone based dyes, perylene based dyes, triaryl methane based dyes, or xanthene based dyes can be cited. It is preferable, from the viewpoint of the solubility with respect to the solvent described later and the heat resistance, that the (D2) dye be an anthraquinone based dye, an azo based dye, an azine based dye, a methine based dye, a triaryl methane based dye, or a xanthene based dye.

Due to containment of the (D2) dye, the film of the resin composition can be provided with coloration property or color adjustment property.

As for the negative-type photosensitive resin composition of the present invention, it is preferable that the (D2) dye contain a (D2a-1) black dye, a (D2a-2) mixture of two or more color dyes, and a (D2b) dye other than black which will be described later.

It is preferable that the content ratio of the (D2) dye in the entire solid content of the negative photosensitive resin composition of the present invention, excluding the solvent, be 0.01 mass % or greater, and it is more preferable that the content ratio thereof be 0.05 mass % or greater, and it is even more preferable that the content ratio thereof be 0.1 mass % or greater. When the content ratio is within the range mentioned above, the coloration property or the color adjustment property can be improved. On the other hand, it is preferable that the content ratio of the (D2) dye in the entire solid content be 50 mass % or less, and it is more preferable that the content ratio thereof be 45 mass % or less, and it is even more preferable that the content ratio thereof be 40 mass % or less. When the content ratio is within the range mentioned above, the heat resistance of the cured film can be improved.

<(D2a-1) Black Dye, (D2a-2) Mixture of Two or More Color Dyes, and (D2b) Dye Other than Black>

As for the negative-type photosensitive resin composition of the present invention, it is preferable that the (D2) dye contain a (D2a-1) black dye, a (D2a-2) mixture of two or more color dyes, and a (D2b) dye other than black.

The (D2a-1) black dye refers to a dye that produces black color by absorbing light of visible ray wavelengths.

Due to containing the (D2a-1) black dye, the film of the resin composition becomes black and is excellent in coloration property, so that the light blocking property of the film of the resin composition can be improved.

As the (D2a-1) black dye, for example, known ones, such as Solvent Black 3, 5, 7, 22, 27, 29, or 34, Mordant Black 1, 11, or 17, Acid Black 2 or 52, or Direct Black 19 or 154, can be used (the numerical values are each a CI number).

The (D2a-2) mixture of two or more color dyes refers to a dye mixture that produces black color in a pseudo manner due to combining two or more color dyes selected from dyes of white, red, orange, yellow, green, blue, or violet.

Due to containing the (D2a-2) mixture of two or more color dyes, the film of the resin composition becomes black and is excellent in coloration property, so that the light blocking property of the film of the resin composition can be improved. Furthermore, since two or more color dyes are mixed, the transmission spectrum or absorption spectrum of the film of the resin composition can be adjusted by achieving transmission or blockage of light of a desired specific wavelength, or the like, so that the color adjustment property can be improved.

As the dye that produces red color, for example, known ones, such as, Direct Red 2, 23, 62, 111, 207, or 247, Acid Red 35, 80, 111, 143, 211, or 397, Reactive Red 3, 21, 35, 40, or 55, or Basic Red 12, 22, 35, 45, or 46, can be used (the numerical values are each a CI number).

As the dye that produces orange color, for example, Basic Orange 21 or 23 can be cited (the numerical values are each a CI number).

As the dye that produces yellow color, for example, known ones, such as Direct Yellow 8, 27, 87, 100, 130, or 163, Acid Yellow 17, 40, 76, 110, 222, or 227, Reactive Yellow 2, 13, 23, 35, or 42, or Basic Yellow 1, 11, 21, 32, or 40, can be used (the numerical values are each a CI number).

As the dye that produces green color, for example, known ones, such as Acid Green 16, can be used (the numerical values are each a CI number).

As the dye that produces blue color, for example, known ones, such as Acid Blue 9, 45, 80, 83, 90, or 185, can be used (the numerical values are each a CI number).

As the dye that produces violet color, for example, known ones, such as Direct Violet 7, 47, 66, 90, or 101, Acid Violet 5, 11, 34, 75, or 126, Reactive Violet 1, 16, 22, 27, or 34, or Basic Violet 1, 10, 20, 35, or 48, can be used (the numerical values are each a CI number).

The (D2b) dye other than black refers to a dye that produces color of white, red, orange, yellow, green, blue, or violet, except black, by absorbing light of a visible ray wavelength.

Due to containing the (D2b) dye other than black, the film of the resin composition can be colored, so that it is possible to provide coloration property or color adjustment property. Due to combining two or more colors of (D2b) dyes other than black, the film of the resin composition can be adjusted in color to a desired color coordinate, so that the color adjustment property can be improved.

As the (D2b) dye other than black, aforementioned dyes that produce color of white, red, orange, yellow, green, blue, or violet, except black, can be cited.

It is preferable that the optical density per 1 μm of film thickness of the cured film obtained by curing the negative-type photosensitive resin composition in the present invention be 0.3 or greater, and it is more preferable that the optical density be 0.5 or greater, and it is even more preferable that the optical density be 0.7 or greater, and it is particularly preferable that the optical density be 1.0 or greater. When the optical density per 1 μm of film thickness is within the range mentioned above, the light blocking property can be improved by the cured film, so that in display devices, such as organic EL displays or liquid crystal displays, it becomes possible to prevent visualization of electrode wirings or reduce external light reflection. Therefore, contrast in image display can be improved. Therefore, the cured film obtained as described above is suitable for uses in which contrast enhancement is required by inhibiting external light reflection, such as light-blocking films, including black matrixes of color filters, black column spacers of liquid crystal displays, or the like, pixel-separating layers of organic EL displays, TFT planarization layers, etc. On the other hand, it is preferable that the optical density per 1 μm of film thickness be 5.0 or less, it is more preferable that the optical density be 4.0 or less, and it is even more preferable that the optical density be 3.0 or less. When the foregoing optical density per 1 μm of film thickness is within the range mentioned above, the sensitivity at the time of exposure can be improved and a cured film having a low-taper pattern shape can be obtained. The optical density per 1 μm of film thickness of the cured film can be adjusted by the composition and content ratio of the (D) coloring agent described above.

<(E) Dispersant>

It is preferable that the negative-type photosensitive resin composition of the present invention further contain a (E) dispersant.

The (E) dispersant refers to a compound that has a surface affinity group that interacts with a surface of the above-described (D1) pigment, a disperse dye as a (D2) dye, etc. and a dispersion stabilizing structure that improves the dispersion stability of the (D1) pigment or the disperse dye. As the dispersion stabilizing structure of the (E) dispersant, a polymer chain and/or a substituent that has electrostatic charge, etc. can be cited.

Due to containing the (E) dispersant, the resin composition can be improved in the dispersion stability of the (D1) pigment or a disperse dye in the case where the (D1) pigment or the disperse dye is contained in the resin composition, so that the post-development resolution can be improved. In particular, for example, in the case where the (D1) pigment is particles crushed to a number average particle diameter of 1 μm or less, the increased surface area of the particles of the (D1) pigment facilitates occurrence of aggregation of particles of the (D1) pigment. On the other hand, in the case where the (D1) pigment is contained, surfaces of the crushed (D1) pigment and surface affinity groups of the (E) dispersant interact and a dispersion stabilizing structure of the (E) dispersant brings about steric hindrance and/or electrostatic repulsion, so that aggregation of particles of the (D1) pigment can be inhibited and dispersion stability can be improved.

As the (E) dispersant having a surface affinity group, for example, a (E) dispersant that has an amine value alone, an (E) dispersant that has an amine value and an acid value, a (E) dispersant that has an acid value alone, or a (E) dispersant that does not have either an amine value or an acid value can be cited. From the view point of improvement of the dispersion stability of the particles of the (D1) pigment, a (E) dispersant that has an amine value alone and a (E) dispersant that has an amine value and an acid value are preferable.

It is also preferable that the (E) dispersant that has a surface affinity group have a structure in which an amino group and/or an acidic group that are surface affinity groups, together with an acid and/or a base, form a salt.

As the (E) dispersant that has an amine value alone, for example, "DISPERBYK" (registered trademark)-108, ditto-109, ditto-160, ditto-161, ditto-162, ditto-163, ditto-164, ditto-166, ditto-167, ditto-168, ditto-182, ditto-184, ditto-185, ditto-2000, ditto-2008, ditto-2009, ditto-2022, ditto-2050, ditto-2055, ditto-2150, ditto-2155, ditto-2163, ditto-2164, or ditto-2061, "BYK" (registered trademark)-9075, ditto-9077, ditto-LP-N6919, ditto-LP-N21116, or ditto-LP-N21324 (which are all made by BYK Japan KK), "EFKA" (registered trademark) 4015, ditto 4020, ditto 4046, ditto 4047, ditto 4050, ditto 4055, ditto 4060, ditto 4080, ditto 4300, ditto 4330, ditto 4340, ditto 4400, ditto 4401, ditto 4402, ditto 4403, or ditto 4800 (which are all made by BASF), "AJISPER" (registered trademark) PB711 (made by Ajinomoto Fine-Techno Co., Inc.), or "SOLSPERSE" (registered trademark) 13240, ditto 13940, ditto 20000, ditto 71000, or ditto 76500 (which are all made by Lubrizol) can be cited.

As the (E) dispersant that has an amine value and an acid value, for example, "ANTI-TERRA" (registered trademark)-U100 or ditto-204, "DISPERBYK" (registered trademark)-106, ditto-140, ditto-142, ditto-145, ditto-180, ditto-2001, ditto-2013, ditto-2020, ditto-2025, ditto-187 or ditto-191, "BYK" (registered trademark)-9076 (made by BYK Japan KK, "AJISPER" (registered trademark) PB821, ditto PB880, or ditto PB881 (which are all made by Ajinomoto Fine-Techno Co., Inc.), or "SOLSPERSE" (registered trademark) 9000, ditto 11200, ditto 13650, ditto 24000, ditto 32000, ditto 32500, ditto 32500, ditto 32600, ditto 33000, ditto 34750, ditto 35100, ditto 35200, ditto 37500, ditto 39000, ditto 56000, or ditto 76500 (which are all made by Lubrizol) can be cited.

As the (E) dispersant that has an acid value alone, for example, "DISPERBYK" (registered trademark)-102, ditto-110, ditto-111, ditto-118, ditto-170, ditto-171, ditto-174, ditto-2060, or ditto-2096, "BYK" (registered trademark)-P104, ditto-P105, or ditto-220S (which are all made by BYK Japan KK), or "SOLSPERSE" (registered trademark) 3000, ditto 16000, ditto 17000, ditto 18000, ditto 21000, ditto 26000, ditto 28000, ditto 36000, ditto 36600, ditto 38500, ditto 41000, ditto 41090, ditto 53095, or ditto 55000 (which are all made by Lubrizol) can be cited.

As the (E) dispersant that does not have either an amine value or an acid value, for example, "DISPERBYK" (registered trademark)-103, ditto-2152, ditto-2200 or ditto-192 (which are all made by BYK Japan KK) or "SOLSPERSE" (registered trademark) 27000, ditto 54000, or ditto X300 (which are all made by Lubrizol) can be cited.

It is preferable that the amine value of the (E) dispersant be 5 mgKOH/g or greater, it is more preferable that the amine value thereof be 8 mgKOH/g or greater, and it is even more preferable that the amine value thereof be 10 mgKOH or greater. When the amine value thereof is within the range mentioned above, the dispersion stability of the (D1) pigment can be improved. On the other hand, it is preferable that the amine value of the (E) dispersant be 150 mgKOH/g or less, it is more preferable that the amine value thereof be 120 mgKOH/g or less, and it is even more preferable that the amine value thereof be 100 mgKOH/g or less. When the amine value thereof is within the range mentioned above, the storage stability of the resin composition can be improved.

The amine value mentioned herein refers to a weight of potassium hydroxide equivalent to that of an acid that reacts with 1 g of the (E) dispersant, and the unit of the amine value is mgKOH/g. The amine value can be determined by neutralizing the (E) dispersant with 1 g of an acid and then performing titration with a potassium hydroxide aqueous solution. From the numerical value of the amine value, an amine equivalent (whose unit is g/mol) that is a resin weight per 1 mol of amino groups can be calculated, and the number of amino groups in the (E) dispersant can be determined.

It is preferable that the acid value of the (E) dispersant be 5 mgKOH/g or greater, it is more preferable that the acid value thereof be 8 mgKOH/g or greater, and it is even more preferable that the acid value thereof be 10 mgKOH or greater. When the acid value thereof is within the range mentioned above, the dispersion stability of the (D1) pigment can be improved. On the other hand, it is preferable that the acid value of the (E) dispersant be 200 mgKOH/g or less, it is more preferable that the acid value thereof be 170 mgKOH/g or less, and it is even more preferable that the acid value thereof be 150 mgKOH/g or less. When the acid value thereof is within the range mentioned above, the storage stability of the resin composition can be improved.

The acid value mentioned herein refers to a weight of potassium hydroxide that reacts with 1 g of the (E) dispersant, and the unit of the acid value is mgKOH/g. The acid value can be determined by titrating 1 g of the (E) dispersant with a potassium hydroxide aqueous solution. From the numerical value of the acid value, an acid equivalent (whose unit is g/mol) that is a resin weight per 1 mol of acidic groups can be calculated, and the number of acidic groups in the (E) dispersant can be determined.

As the (E) dispersant that has a polymer chain, acrylic resin based dispersants, polyoxyalkylene ether based dispersants, polyester based dispersants, polyurethane based dispersants, polyol based dispersants, polyethylene imine based dispersants, or polyallylamine based dispersants can be cited. From the viewpoint of the pattern workability with an alkaline developer, it is preferable that the (E) dispersant that has a polymer chain be an acrylic resin based dispersant, a polyoxyalkylene ether based dispersant, a polyester based dispersant, a polyurethane based dispersant, or a polyol based dispersant.

In the case where the negative photosensitive resin composition of the present invention contains the (D1) pigment and/or a disperse dye as the (D2) dye, it is preferable that the content ratio of the (E) dispersant in the negative photosensitive resin composition of the present invention be 1 mass % or greater where a total of the (D1) pigment and/or the disperse dye and (E) dispersant is assumed to be 100 mass %, it is more preferable that the content ratio thereof be 5 mass % or greater, and it is even more preferable that the content ratio thereof be 10 mass % or greater. When the content ratio thereof is within the range mentioned above, the dispersion stability of the (D1) pigment and/or the disperse dye can be improved, and the post-development resolution can be improved. On the other hand, it is preferable that the content ratio thereof be 60 mass % or less, it is more preferable that the content ratio thereof be 55 mass % or less, and it is even more preferable that the content ratio thereof be 50 mass % or less. When the content ratio thereof is within the range mentioned above, the heat resistance of the cured film can be improved.

<Sensitivity Enhancing Agent>

It is preferable that the negative-type photosensitive resin composition of the present invention further contain a sensitivity enhancing agent.

The sensitivity enhancing agent refers to a compound capable of absorbing energy from exposure to produce exited-triplet electrons due to internal conversion and intersystem crossing so that energy transfer to the foregoing (C) photo initiator or the like can be caused.

Due to containment of the sensitivity enhancing agent, the sensitivity at the time of exposure can be improved. This is speculated to be because the sensitivity enhancing agent can improve photoreaction efficiency by absorbing light of long wavelengths that the (C) photo initiator does not absorb and transferring its energy from the sensitivity enhancing agent to the (C) photo initiator and the like.

As the sensitivity enhancing agent, thioxanthone based sensitivity enhancing agents are preferable. As the thioxanthone based sensitivity enhancing agents, for example, thioxanthone, 2-methylthioxanthone, 2-chlorothioxanthone, 2-isopropyl thioxanthone, 2,4-dimethylthioxanthone, 2,4-diethylthioxanthone, or 2,4-dichlorothioxanthone can be cited.

It is preferable that the content of the sensitivity enhancing agent in the negative photosensitive resin composition of the present invention be 0.01 mass part or greater in the case where the total of the (A) alkali-soluble resin and the (B) radical polymerizable compound is assumed to be 100 mass parts, and it is more preferable that the content thereof be 0.1 mass part or greater, and it is even more preferable that the content thereof be 0.5 mass part or greater, and it is particularly preferable that the content thereof be 1 mass part or greater. When the content thereof is within the range mentioned above, the sensitivity at the time of exposure can be improved. On the other hand, it is preferable that the content of the sensitivity enhancing agent be 15 mass parts or less, and it is more preferable that the content thereof be 13 mass parts or less, and it is even more preferable that the content thereof be 10 mass parts or less, and it is particularly preferable that the content thereof be 8 mass parts or less. When the content thereof is within the range mentioned above, the post-development resolution can be improved and a low-taper pattern shape can be obtained.

<Chain Transfer Agent>

It is preferable that the negative-type photosensitive resin composition of the present invention further contain a chain transfer agent.

The chain transfer agent refers to a compound capable of receiving radicals from a growing polymer end of a polymer chain obtained by radical polymerization at the time of exposure and causing transfer of radicals to another polymer chain.

Due to containment of a chain transfer agent, the sensitivity at the time of exposure can be improved. This is speculated to be because radicals produced by exposure undergo radical transfer to other polymer chains due to the chain transfer agent so that radical crosslinking occurs to deep portions of the film. Particularly, for example, in the case where the resin composition contains a (Da) black coloring agent as the above-described (D) coloring agent, it is sometimes the case that light due to exposure is absorbed by the (Da) black coloring agent and therefore does not reach deep portions of the film. On the other hand, in the case where the resin composition contains a chain transfer agent, the radical transfer due to the chain transfer agent achieves radical crosslinking to deep portions of the film, so that the sensitivity at the time of exposure can be improved.

Furthermore, due to containing a chain transfer agent, a low-taper pattern shape can be obtained. This is speculated to be because the radical transfer by the chain transfer agent can provide a molecular weight control of polymer chains that are obtained by radical polymerization at the time of exposure. Specifically, due to containment of a chain transfer agent, the production of remarkably high molecular weight polymer chains due to excessive radical polymerization at the time of exposure is inhibited and therefore increase in the softening point of the obtained film is restrained. Therefore, it is considered that the pattern reflow property at the time of thermosetting improves so that a low-taper pattern shape is obtained.

As the chain transfer agent, a thiol based chain transfer agent is preferable. As the thiol based chain transfer agent, for example, β-mercaptopropionic acid, methyl β-mercaptopropionate, 2-ethylhexyl β-mercaptopropionate, stearyl β-mercaptopropionate, 3-mercaptobutanoic acid, methyl thioglycolate, 1,4-bis(3-mercaptobutanoyloxy)butane, ethylene glycol bis(thioglycolate), trimethylolethane tris(3-mercaptopropionate), trimethylolethane tris(3-mercaptobutyrate), trimethylolpropane tris(3-mercaptopropionate), trimethylolpropane tris(3-mercaptobutyrate), trimethylolpropane tris(thioglycolate), 1,3,5-tris[(3-mercaptopropionyloxy)ethyl]isocyanuric acid, 1,3,5-tris[(3-mercaptobutanoyloxy) ethyl]isocyanuric acid, pentaerythritol tetrakis(3-mercaptopropionate), pentaerythritol tetrakis(3-mercaptobutyrate), pentaerythritol tetrakis(thioglycolate), dipentaerythritol hexakis(3-mercaptopropionate), or dipentaerythritol hexakis(3-mercaptobutyrate) can be cited. From the viewpoint of improvement of the sensitivity at the time of exposure and a low-taper pattern shape, it is preferable that the thiol based chain transfer agent be trimethylolethane tris(3-mercaptopropionate), trimethylolethane tris(3-mercaptobutyrate), trimethylolpropane tris(3-mercaptopropionate), trimethylolpropane tris(3-mercaptobutyrate), 1,3,5-tris[(3-mercaptopropionyloxy) ethyl]isocyanuric acid, 1,3,5-tris[(3-mercaptobutanoyloxy) ethyl]isocyanuric acid, pentaerythritol tetrakis(3-mercaptopropionate), pentaerythritol tetrakis(3-mercaptobutyrate), dipentaerythritol hexakis (3-mercaptopropionate), or dipentaerythritol hexakis(3-mercaptobutyrate).

It is preferable that the content of the chain transfer agent in the negative photosensitive resin composition of the present invention be 0.01 mass part or greater in the case where a total of the (A) alkali-soluble resin and the (B) radical polymerizable compound is assumed to be 100 mass parts, and it is more preferable that the content thereof be 0.1 mass part or greater, and it is even more preferable that the content thereof be 0.5 mass part or greater, and it is particularly preferable that the content thereof be 1 mass part of greater. When the content thereof is within the range mentioned above, the sensitivity at the time of exposure can be improved and, at the same time, a low-taper pattern shape can be obtained. On the other hand, it is preferable that the content of the chain transfer agent be 15 mass parts or less, and it is more preferable that the content ratio thereof be 13 mass parts or less, and it is even more preferable that the content thereof be 10 mass parts or less, and it is particularly preferable that the content thereof be 8 mass parts or less. When the content thereof is within the range mentioned above, the post-development resolution and the heat resistance of the cured film can be improved.

<Polymerization Terminator>

It is preferable that the negative-type photosensitive resin composition of the present invention further contain a polymerization terminator.

The polymerization terminator refers to a compound capable of stopping radical polymerization by trapping radicals produced at the time of exposure or radicals of growing polymer ends of polymer chains obtained by radical polymerization at the time of exposure and holding the radicals as stable radicals.

Due to containing an appropriate amount of a polymerization terminator, production of residue after development can be inhibited, so that the post-development resolution can be improved. This is speculated to be because the polymerization terminator traps an excess amount of radicals produced at the time of exposure or radicals at growing ends of high-molecular weight polymer chains, so that progress of excessive radical polymerization is inhibited.

As the polymerization terminator, phenol based polymerization terminators are preferable. As phenol based polymerization terminators, for example, 4-methoxyphenol, 1,4-hydroquinone, 1,4-benzoquinone, 2-t-butyl-4-methoxyphenol, 3-t-butyl-4-methoxyphenol, 4-t-butylcatechol, 2,6-di-t-butyl-4-methylphenol, 2,5-di-t-butyl-1,4-hydroquinone, 2,5-di-t-amyl-1,4-hydroquinone, or "IRGANOX" (registered trademark) 1010, ditto 1035, ditto 1076, ditto 1098, ditto 1135, ditto 1330, ditto 1726, ditto 1425, ditto 1520, ditto 245, ditto 259, ditto 3114, ditto 565, or ditto 295 (which are all made by BASF) can be cited.

It is preferable that the content of the polymerization terminator in the negative photosensitive resin composition of the present invention be 0.01 mass part or greater in the case where a total of the (A) alkali-soluble resin and the (B) radical polymerizable compound is assumed to be 100 mass parts, and it is more preferable that the content thereof be 0.03 mass part or greater, and it is even more preferable that the content thereof be 0.05 mass part or greater, and it is particularly preferable that the content thereof be 0.1 mass part or greater. When the content thereof is within the range mentioned above, the post-development resolution and the heat resistance of the cured film can be improved. On the other hand, it is preferable that the content of the polymerization terminator be 10 mass parts or less, and it is more preferable that the content thereof be 8 mass parts or less, and it is even more preferable that the content thereof be 5 mass parts or less, and it is particularly preferable that the content thereof be 3 mass parts or less. When the content thereof is within the range mentioned above, the sensitivity at the time of exposure can be improved.

<Crosslinking Agent>

It is preferable that the negative-type photosensitive resin composition of the present invention further contain a crosslinking agent.

The crosslinking agent refers to a compound that has a crosslinkable group capable of binding to the resin.

Due to containing a crosslinking agent, the hardness and chemical resistance of the cured film can be improved. This is speculated to be because the crosslinking agent makes it possible to introduce a new crosslink structure to the cured film of the resin composition and therefore the crosslink density improves.

It is preferable that the crosslinking agent be a compound that has in its molecule two or more thermal crosslinkabilities such as alkoxy methyl groups, methylol groups, epoxy groups, or oxetanyl groups.

As the compound that has in its molecule two or more alkoxy methyl groups or methylol groups, for example, DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DML-BisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, or HMOM-TPHAP (which are all made by Honshu Chemical Industry Co., Ltd.), or "NIKALAC" (registered trademark) MX-290, ditto MX-280, ditto MX-270, ditto MX-279, ditto MW-100LM, ditto MW-30HM, ditto MW-390, or ditto MX-750LM (which are made by SANWA CHEMICAL CO., LTD.) can be cited.

As the compound that has in its molecule two or more epoxy groups, for example, "Epolite" (registered trademark) 40E, ditto 100E, ditto 200E, ditto 400E, ditto 70P, ditto 200P, ditto 400P, ditto 1500NP, ditto 80MF, ditto 4000, or ditto 3002 (which are all made by Kyoeisha Chemical Co., Ltd.), "Denacol" (registered trademark) EX-212L, ditto EX-214L, ditto EX-216L, ditto EX-321L, or ditto EX-850L (which are all made by Nagase ChemteX Corporation), "jER" (registered trademark) 828, ditto 1002, ditto 1750, ditto 1007, ditto YX8100-BH30, ditto E1256, ditto E4250, or ditto E4275 (which are all made by Mitsubishi Chemical Corporation), GAN, GOT, EPPN-502H, NC-3000, or NC-6000 (which are all made by Nippon Kayaku Co., Ltd.), "EPICLON" (registered trademark) EXA-9583, ditto HP4032, ditto N695, or ditto HP7200 (which are all made by DIC Corporation), "TECHMORE" (registered trademark) VG-3101L (made by Printec Corporation), "TEPIC" (registered trademark) S, ditto G, or ditto P (which are all made by Nissan Chemical Industries, Ltd.), or "Epotohto" (registered trademark) YH-434L (made by Tohto Kasei Co., Ltd.) can be cited.

As the compound that has in its molecule two or more oxetanyl groups, for example, "ETERNACOLL" (registered trademark) EHO, ditto OXBP, ditto OXTP, or ditto OXMA (which are all made by Ube Industries, Ltd.), or oxetanized phenol novolac can be cited.

It is preferable that the content of the crosslinking agent in the negative photosensitive resin composition of the present invention be 0.1 mass part or greater in the case where a total of the (A) alkali-soluble resin and the (B) radical polymerizable compound is assumed to be 100 mass parts, and it is more preferable that the content thereof be 0.5 mass part or greater, and it is even more preferable that the content thereof be 1 mass part or greater. When the content thereof is within the range mentioned above, the hardness and chemical resistance of the cured film can be improved. On the other hand, it is preferable that the content of the crosslinking agent be 70 mass parts or less, and it is more preferable that the content thereof be 60 mass parts or less, and it is even more preferable that the content thereof be 50 mass parts or less. When the content thereof is within the range mentioned above, the hardness and chemical resistance of the cured film can be improved.

<Silane Coupling Agent>

The negative-type photosensitive resin composition of the present invention may further contain a silane coupling agent.

The silane coupling agent refers to a compound that has a hydrolyzable silyl group or silanol group.

Containing a silane coupling agent increases the interaction at the interface between the cured film of the resin composition and a base substrate, so that the adhesion with the base substrate and the chemical resistance of the cured film can be improved.

As the silane coupling agent, trifunctional organosilanes, tetrafunctional organosilanes, or silicate compounds are preferable.

As the trifunctional organosilane, for example, methyltrimethoxysilane, methyltriethoxysilane, methyltri-n-propoxysilane, ethyltrimethoxysilane, n-propyltrimethoxysilane, isopropyltrimethoxysilane, n-butyltrimethoxysilane, n-hexyltrimethoxysilane, n-octyltrimethoxysilane, n-decyltrimethoxysilane, cyclopentyltrimethoxysilane, cyclohexyltrimethoxysilane, vinyltrimethoxysilane, vinyltriethoxysilane, 3-methacryloxypropyltrimethoxysilane, 3-methacryloxypropyltriethoxysilane, 3-acryloxy propyl trimethoxysilane, 3-acryloxy propyltriethoxysilane, phenyltrimethoxysilane, phenyltriethoxysilane, 4-tolyltrimethoxysilane, 4-hydroxyphenyltrimethoxysilane, 4-methoxyphenyltrimethoxysilane, 4-t-butylphenyltrimethoxysilane, 1-naphthyltrimethoxysilane, 2-naphthyltrimethoxysilane, 4-styryltrimethoxysilane, 2-phenylethyltrimethoxysilane, 4-hydroxy benzyltrimethoxysilane, 1-(4-hydroxyphenyl)ethyltrimethoxysilane, 2-(4-hydroxyphenyl)ethyltrimethoxysilane, 4-hydroxy-5-(4-hydroxyphenylcarbonyloxy)pentyltrimethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, 2-(3-trimethoxysilylpropyl)-4-(N-t-butyl)amino-4-oxo butanoic acid, 3-(3-trimethoxysilylpropyl)-4-(N-t-butyl) amino-4-oxo butanoic acid, 3-trimethoxysilyipropyisuccinic acid, 3-triethoxysilylpropylsuccinic acid, 3-trimethoxysilylpropionic acid, 4-trimethoxysilylbutyric acid, 5-trimethoxysilylvaleric acid, 3-trimethoxysilylpropyl succinic anhydride, 3-triethoxysilylpropyl succinic anhydride, 4-(3-trimethoxysilylpropyl)cyclohexane-1,2-dicarboxylic anhydride, 4-(3-trimethoxysilylpropyl)phthalic anhydride, trifluoromethyltrimethoxysilane, trifluoromethyltriethoxysilane, 3,3,3-trifluoropropyltrimethoxysilane, 3-[(3-ethyl-3-oxetanyl)methoxy]propyltrimethoxysilane, 3-[(3-ethyl-3-oxetanyl)methoxy]propyltriethoxysilane, 3-aminopropyltrimethoxysilane, 3-aminopropyltriethoxysilane, N-(2-aminoethyl)-3-aminopropyltrimethoxysilane, N-(2-aminoethyl)-3-aminopropyltriethoxysilane, N-phenyl-3-aminopropyltrimethoxysilane, N-(vinylbenzyl)-2-aminoethyl-3-aminopropyltrimethoxysilane hydrochlorate salt, 3-(4-aminophenyl)propyltrimethoxysilane, 1-[4-(3-trimethoxysilylpropyl)phenyl]urea, 1-(3-trimethoxysilylpropyl) urea, 1-(3-triethoxysilylpropyl)urea, 3-trimethoxysilyl-N-(1,3-dimethylbutylidene) propyl amine, 3-triethoxysilyl-N-(1,3-dimethylbutylidene) propyl amine, 3-mercaptopropyltrimethoxysilane, 3-mercapto propyltriethoxysilane, 3-isocyanate propyltrimethoxysilane, 3-isocyanate propyltriethoxysilane, 1,3,5-tris(3-trimethoxysilylpropyl) isocyanuric acid, 1,3,5-tris(3-triethoxysilylpropyl)isocyanuric acid, N-t-butyl-2-(3-trimethoxysilylpropyl)succinimide, or N-t-butyl-2-(3-triethoxysilylpropyl)succinimide can be cited.

As the tetrafunctional organosilanes or the silicate compounds, for example, organosilanes represented by general formula (47) can be cited.

[CHEM. 23]

(47)

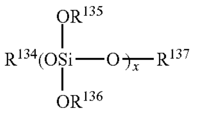

In general formula (47), $R^{134}$ to $R^{137}$ each independently represent hydrogen, an alkyl group, an acyl group, or an aryl group, and x represents an integer of 1 to 15. In general formula (47), it is preferable that $R^{134}$ to $R^{137}$ each independently be hydrogen, an alkyl group having a carbon number of 1 to 6, an acyl group having a carbon number of 2 to 6, or an aryl group having a carbon number of 6 to 15, and it is more preferable that $R^{134}$ to $R^{137}$ each independently be hydrogen, an alkyl group having a carbon number of 1 to 4, an acyl group having a carbon number of 2 to 4, or an aryl group having a carbon number of 6 to 10. The alkyl group, the acyl group, and the aryl group mentioned above may be either an unsubstituted product or a substitution product.

As the organosilane represented by general formula (47), for example, tetrafunctional organosilanes, such as tetramethoxysilane, tetraethoxysilane, tetra-n-propoxysilane, tetraisopropoxysilane, tetra-n-butoxysilane, or tetraacetoxysilane, and silicate compounds, such as Methyl Silicate 51 (made by FUSO CHEMICAL CO., LTD.), M Silicate 51, Silicate 40, or Silicate 45 (which are all made by TAMA CHEMICALS CO., LTD.), or Methyl Silicate 51, Methyl Silicate 53A, Ethyl Silicate 40, or Ethyl Silicate 48 (which are all made by COLCOAT CO., LTD.), can be cited.

It is preferable that the content of the silane coupling agent in the negative photosensitive resin composition of the present invention be 0.01 mass part or greater in the case where a total of the (A) alkali-soluble resin and the (B) radical polymerizable compound is assumed to be 100 mass parts, and it is more preferable that the content thereof be 0.1 mass part or greater, and it is even more preferable that the content thereof be 0.5 mass part or greater, and it is particularly preferable that the content thereof be 1 mass part or greater. When the content thereof is within the range mentioned above, the adhesion with the base substrate and the chemical resistance of the cured film can be improved. On the other hand, it is preferable that the content of the silane coupling agent be 15 mass parts or less, and it is more preferable that the content thereof be 13 mass parts or less, and it is even more preferable that the content thereof be 10 mass parts or less, and it is particularly preferable that the content thereof be 8 mass parts or less. When the content thereof is within the range mentioned above, the post-development resolution can be improved.

<Surfactant>

The negative-type photosensitive resin composition of the present invention may further contain a surfactant.

The surfactant refers to a compound that has a hydrophilic structure and a hydrophobic structure.

Due to containing an appropriate amount of a surfactant, the surface tension of the resin composition can be arbitrarily adjusted, and the leveling property at the time of coating application improves, so that the film thickness uniformity of the coating film can be improved.

As the surfactant, fluorine resin based surfactants, silicone based surfactants, polyoxyalkylene ether based surfactants, or acrylic resin based surfactants are preferable.

As the fluorine resin based surfactant, for example, "MEGAFAC" (registered trademark) F-142D, ditto F-172, ditto F-173, ditto F-183, ditto F-444, ditto F-445, ditto F-470, ditto F-475, ditto F-477, ditto F-555, ditto F-558, or ditto F-559 (which are all made by DIC Corporation), "Eftop" (registered trademark) EF301, ditto 303, or ditto 352 (which are all made by Mitsubishi Materials Electronic Chemicals Co., Ltd.), "Fluorad" (registered trademark) FC-430 or ditto FC-431 (which are all made by Sumitomo 3M Limited), "AsahiGuard" (registered trademark) AG710 (made by Asahi Glass Co., Ltd.), "SURFLON" (registered trademark) S-382, ditto SC-101, ditto SC-102, ditto SC-103, ditto SC-104, ditto SC-105, or ditto SC-106 (which are all made by AGC Seimi Chemical Co., Ltd.), BM-1000 or BM-1100 (which are all made by Yusho Co., Ltd.), or "FTERGENT" (registered trademark) 710FM or ditto 730LM (which are all made by NEOS COMPANY LIMITED) can be cited.

As the silicone based surfactant, for example, SH28PA, SH7PA, SH21PA, SH30PA, or ST94PA (which are all made by Dow Corning Toray Co., Ltd.), or "BYK" (registered trademark)-301, ditto-306, ditto-307, ditto-331, ditto-333, ditto-337, or ditto-345 (which are all made by BYK Japan KK) can be cited.

As the polyoxyalkylene ether based surfactant, "FTERGENT" (registered trademark) 212M, ditto 209F, ditto 208G, ditto 240G, ditto 212P, ditto 220P, ditto 228P, ditto NBX-15, ditto FTX-218, or ditto DFX-218 (which are all made by NEOS COMPANY LIMITED) can be cited.

As the acrylic resin based surfactant, "BYK" (registered trademark)-350, ditto-352, ditto-354, ditto-355, ditto-356, ditto-358N, ditto-361N, ditto-392, ditto-394, or ditto-399 (which are all made by BYK Japan KK) can be cited.

It is preferable that the content ratio of the surfactant in the negative photosensitive resin composition of the present invention be 0.001 mass % or greater of the entire negative-type photosensitive resin composition, and it is more preferable that the content ratio thereof be 0.005 mass % or greater, and it is even more preferable that the content ratio thereof be 0.01 mass % or greater. When the content ratio thereof is within the range mentioned above, the leveling property at the time of coating application can be improved. On the other hand, it is preferable that the content ratio of the surfactant be 1 mass % or less, and it is more preferable that the content ratio thereof be 0.5 mass % or less, and it is even more preferable that the content ratio thereof be 0.03 mass % or less. When the content ratio thereof is within the range mentioned above, the leveling property at the time of coating application can be improved.

<Solvent>

It is preferable that the negative-type photosensitive resin composition of the present invention further contain a solvent.

The solvent refers to a compound capable of dissolving various resins and various additives that are to be contained in the resin composition.

Due to containing a solvent, various resins and various additives that are to be contained in the resin composition can be homogeneously dissolved, so that the transmittance of the cured film can be improved. Furthermore, the viscosity of the resin composition can be arbitrarily adjusted, so that a film can be formed with a desired film thickness on a substrate. Moreover, the surface tension of the resin composition or the desiccation speed thereof at the time of coating application can be arbitrarily adjusted, so that the leveling property at the time of coating application and the film thickness uniformity of the coating film can be improved.

It is preferable, from the viewpoint of the solubility of various resins and various additives, that the solvent be a compound that has an alcoholic hydroxyl group, a compound that has a carbonyl group, a compound that has three or more ether bonds. Moreover, a compound whose boiling point under atmospheric pressure is 110 to 250° C. is more preferable. Having a boiling point of 110° C. or greater, the solvent vaporizes appropriately at the time of coating application and thus promotes the drying of the coating film, so that coating unevenness can be inhibited and the film thickness uniformity can be improved. On the other hand, the solvent having a boiling point of 250° C. or less allows reduction of the amount of the solvent that remains in the coating film. Therefore, the amount of film shrinkage at the time of thermosetting can be reduced, so that the flatness of the cured film can be increased and the film thickness uniformity can be improved.

As the compound which has an alcoholic hydroxyl group and whose boiling point under atmospheric pressure is 110 to 250° C., for example, hydroxy acetone, 4-hydroxy-2-butanone, 3-hydroxy-3-methyl-2-butanone, 4-hydroxy-3-methyl-2-butanone, 5-hydroxy-2-pentanone, 4-hydroxy-2-pentanone, 4-hydroxy-4-methyl-2-pentanone (also called diacetone alcohol), methyl lactate, ethyl lactate, n-propyl lactate, n-butyl lactate, methyl 2-hydroxy-2-methylpropionate, methyl 2-hydroxy-3-methylbutanoate, ethylene glycol monomethyl ether, ethylene glycol monoethyl ether, ethylene glycol mono-n-propyl ether, ethylene glycol mono-n-butyl ether, propylene glycol monomethyl ether, propylene glycol monoethyl ether, propylene glycol mono-n-propyl ether, propylene glycol mono-n-butyl ether, propylene glycol mono-t-butyl ether, diethylene glycol monomethyl ether, diethylene glycol monoethyl ether, diethylene glycol mono-n-propyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, 3-methoxy-1-butanol, 3-methoxy-3-methyl-1-butanol, 1,3-butanediol, 1,4-butanediol, tetrahydrofurfuryl alcohol, n-butanol, or n-pentanol can be cited. From the viewpoint of the leveling property at the time of coating application, it is preferable that the compound be diacetone alcohol, ethyl lactate, ethylene glycol monomethyl ether, propylene glycol monomethyl ether, diethylene glycol monomethyl ether, dipropylene glycol monomethyl ether, 3-methoxy-1-butanol, 3-methoxy-3-methyl-1-butanol, or tetrahydrofurfuryl alcohol.

As the compound which has a carbonyl group and whose boiling point under atmospheric pressure is 110 to 250° C., for example, n-butyl acetate, isobutyl acetate, 3-methoxymethyl propionate, methyl 3-ethoxypropionate, ethoxyethyl acetate, 3-methoxy-n-butyl acetate, 3-methyl-3-methoxy-n-butyl acetate, 3-methyl-3-methoxy-n-butyl propionate, ethylene glycol monomethyl ether acetate, ethylene glycol monoethyl ether acetate, ethylene glycol monobutyl ether acetate, propylene glycol monomethyl ether acetate, propylene glycol monoethyl ether acetate, propylene glycol monobutyl ether acetate, diethylene glycol monomethyl ether acetate, diethylene glycol monoethyl ether acetate, diethylene glycol mono-n-butyl ether acetate, dipropylene glycol monomethyl ether acetate, dipropylene glycol monoethyl ether acetate, cyclohexanol acetate, propylene glycol diacetate, 1,3-butanediol diacetate, 1,4-butanediol diacetate, methyl n-butyl ketone, methyl isobutyl ketone, diisobutyl ketone, 2-heptanone, acetylacetone, cyclopentanone, cyclohexanone, cycloheptanone, γ-butyrolactone, γ-valerolactone, δ-valerolactone, propylene carbonate, N-methyl-2-pyrrolidone, N,N'-dimethylformamide, N,N'-dimethylacetamide, or 1,3-dimethyl-2-imidazolidinone can be cited. From the viewpoint of the leveling property at the time of coating application, it is preferable that the compound be 3-methoxy-n-butyl acetate, 3-methyl-3-n-butyl acetate, propylene glycol monomethyl ether acetate, dipropylene glycol monomethyl ether acetate, or □-butyrolactone.

As the compound which has three or more ether bonds and whose boiling point under atmospheric pressure is 110 to 250° C., for example, diethylene glycol dimethyl ether, diethylene glycol diethyl ether, diethylene glycol ethyl methyl ether, diethylene glycol di-n-propyl ether, dipropylene glycol dimethyl ether, dipropylene glycol diethyl ether, dipropylene glycol methyl-n-propyl ether, dipropylene glycol ethyl methyl ether, or dipropylene glycol di-n-propyl ether can be cited. From the viewpoint of the leveling property at the time of coating application, it is preferable that the compound be diethylene glycol dimethyl ether, diethylene glycol ethyl methyl ether, or dipropylene glycol dimethyl ether.

The content ratio of the solvent in the negative-type photosensitive resin composition of the present invention can be adjusted as appropriate according to the coating method or the like. For example, in the case where a coating film is formed by spin coating, it is common to set the content ratio thereof within the range of 50 to 95 mass % of the entire negative-type photosensitive resin composition.

In the case where the (D1) pigment or disperse dye is contained as a (D) coloring agent, it is preferable that the solvent be a solvent that has a carbonyl group or an ester bond. Due to containing a solvent that has a carbonyl group or an ester bond, the dispersion stability of the (D1) pigment or disperse dye can be improved. From the viewpoint of dispersion stability, it is more preferable that the solvent be a solvent that has an acetate bond. Due to containing a solvent that has an acetate bond, the dispersion stability of the (D1) pigment or disperse dye can be improved.

As the solvent that has an acetate bond, for example, n-butyl acetate, isobutyl acetate, 3-methoxy-n-butyl acetate, 3-methyl-3-methoxy-n-butyl acetate, ethylene glycol monomethyl ether acetate, ethylene glycol monoethyl ether acetate, ethylene glycol monobutyl ether acetate, propylene glycol monomethyl ether acetate, propylene glycol monoethyl ether acetate, propylene glycol monobutyl ether acetate, diethylene glycol monomethyl ether acetate, diethylene glycol monoethyl ether acetate, diethylene glycol mono-n-butyl ether acetate, dipropylene glycol monomethyl ether acetate, dipropylene glycol monoethyl ether acetate, cyclohexanol acetate, propylene glycol diacetate, 1,3-butanediol diacetate, or 1,4-butanediol diacetate can be cited.

In the negative-type photosensitive resin composition of the present invention, it is preferable that the content ratio of the solvent that has a carbonyl group or an ester bond in the solvent be within the range of 30 to 100 mass %, and it is more preferable that the content ratio thereof be within the range of 50 to 100 mass %, and it is even more preferable that the content ratio thereof be within the range of 70 to 100 mass %. When the content ratio thereof is within the range mentioned above, the dispersion stability of the (D1) pigment can be improved.

<Production Method for Negative-Type Photosensitive Resin Composition of Present Invention>

A representative production method for the negative-type photosensitive resin composition of the present invention will be described. For example, in the case where the (D) coloring agent contains a (D1) pigment, the (E) dispersant is added to a solution of the (A) alkali-soluble resin, and the (D1) pigment is dispersed in this mixture solution by using a disperser so as to prepare a pigment dispersion liquid. Next, the (B) radical polymerizable compound, the (C) photo initiator, and other additives as well as an arbitrary solvent are added to the pigment dispersion liquid. Stirring is performed for 20 minutes to 3 hours to form a homogeneous solution. After stirring, the obtained solution is filtered to obtain a negative-type photosensitive resin composition of the present invention.

As the disperser, for example, a ball mill, a bead mill, a sand grinder, a three-roll mill, or a high-speed impact mill can be cited. From the viewpoint of more efficient dispersion and finer dispersion, it is preferable that the disperser be a bead mill. As the bead mill, for example, a co-ball mill, a basket mill, a pin mill, or a DYNO mill can be cited. As beads of the bead mill, for example, titania beads, zirconia beads, or zircon beads can be cited. It is preferable that the bead diameter of the bead mill be 0.01 to 6 mm, and it is more preferable that the bead diameter thereof be 0.015 to 5 mm, and it is even more preferable that the bead diameter thereof be 0.03 to 3 mm. In the case where the primary particle diameter of the (D1) pigment and the particle diameter of secondary particles formed by aggregation of primary particles of the (D1) pigment is several hundred nanometers or less, small beads of 0.015 to 0.1 mm are preferable. In this case, a bead mill that has a separator based on a centrifugal separation system which is capable of separating small beads and the pigment dispersion liquid is preferable. On the other hand, in the case where the (D1) pigment contains large particles of several hundred nanometers or greater, beads of 0.1 to 6 mm are preferable from the viewpoint of more efficient dispersion.

<Process that Uses Negative-Type Photosensitive Resin Composition of Present Invention>

The cured film obtained from the negative-type photosensitive resin composition of the present invention can be suitably put to uses such as pixel-separating layers, color filters, and black matrixes of color filters of organic EL displays, black column spacers of liquid crystal displays, gate insulation films of semiconductors, interlayer insulation films of semiconductors, protection films for metal wiring, insulation films for metal wiring, or planarization films for TFTs.

<Cured Pattern of Low-Taper Pattern Shape>

The negative-type photosensitive resin composition of the present invention makes it possible to obtain a cured film that has a cured pattern of a low-taper pattern shape. It is preferable that the taper angle of an inclined side of a cross section of a cured pattern obtained from the negative-type photosensitive resin composition of the present invention be 1□ or greater, and it is more preferable that the taper angle thereof be 5□ or greater, and it is even more preferable that the taper angle thereof be 10□ or greater, and it is still more preferable that the taper angle thereof be 12□ or greater, and it is particularly preferable that the taper angle thereof be 15□ or greater. When the taper angle thereof is within the range mentioned above, light-emitting elements can be highly densely integrated and arranged, so that the resolution of display devices can be improved. On the other hand, it is preferable that the taper angle of the inclined side of a cross section of the cured pattern be 60□ or less, and it is more preferable that the taper angle thereof be 55□ or less, and it is even more preferable that the taper angle thereof be 50□ or less, and it is still more preferable that the taper angle thereof be 45□ or less, and it is particularly preferable that the taper angle thereof be 40□ or less. When the taper angle thereof is within the range mentioned above, wire breakage at the time of forming electrodes, such as transparent electrodes or reflector electrodes, can be prevented. Furthermore, electric field concentration at edge portions of electrodes can be inhibited, so that degradation of light-emitting elements can be inhibited.

<Production Process for Organic EL Display>

As a process that uses the negative-type photosensitive resin composition of the present invention, a process that uses a cured film of that composition as a pixel-separating layer of an organic EL display is illustrated in FIG. 1 and will be described as an example. First, (1) thin-film transistors (hereinafter, "TFTs") 2 are formed on a glass substrate 1, and a photosensitive material for a TFT planarization film is formed into a film, which is then pattern-processed by photolithography and subsequently thermally cured to form a cured film for TFT planarization 3. Next, (2) a silver-palladium-copper alloy (hereinafter, "APC") is sputtered to form a film, which is pattern-processed by etching with photoresist to form an APC layer. Furthermore, as an upper layer on the APC layer, indium tin oxide (hereinafter, ITO) is sputtered to form a film, which is then pattern-processed by etching with photoresist to form reflector electrodes 4 as first electrodes. After that, (3) the negative-type photosensitive resin composition of the present invention is applied and prebaked to form a prebaked film 5*a*. Subsequently, (4) a chemical active ray 7 is applied via a mask 6 that has a desired pattern. Next, (5) after development and pattern processing, bleaching exposure and intermediate bake are performed as needed so as to carry out thermal cure. Thus, a cured pattern 5*b* having a desired pattern is formed as a pixel-separating layer. After that, (6) an EL light-emitting material is vapor deposition via a mask to form a film. Thus, an EL light-emitting layer 8 is formed. A magnesium-silver alloy (hereinafter, "MgAg") is vapor deposited to form a film, which is then pattern-processed by etching with photoresist to form transparent electrodes 9 as second electrodes. Next, (7) a photosensitive material for a planarization film is formed into a film, which is then pattern-processed by photolithography and then thermally cured to form a cured film for planarization 10. After that, a cover glass 11 is joined thereto to obtain an organic EL display that has the negative-type photosensitive resin composition of the present invention in a pixel-separating layer.

<Production Process for Liquid Crystal Display>

As another process that uses the negative-type photosensitive resin composition of the present invention, a process in which a cured film of the composition that contains a coloring agent is used as a black column spacer (hereinafter, "BCS") and a black matrix (hereinafter, "BM") of a color filter of a liquid crystal display is illustrated in FIG. 2 and will be described as an example. First, (1) a backlight unit (hereinafter, "BLU") 13 is formed on a glass substrate 12 to obtain a glass substrate 14 that includes a BLU.

Furthermore, (2) TFTs 16 are formed on another glass substrate 15. A photosensitive material for a TFT planarization film is formed into a film, which is then pattern-processed by photolithography and subsequently thermally cured to form a cured film for TFT planarization 17. Next, (3) ITO is sputtered to form a film, which is then pattern-processed by etching with photoresist to form a transparent electrode 18. On top of it, a planarization film 19 and an alignment layer 20 are formed. After that, (4) the negative-type photosensitive resin composition of the present invention is applied and prebaked to form a prebaked film 21*a*. Subsequently, (5) a chemical active ray 23 is applied via a mask 22 that has a desired pattern. Next, (6) after development and pattern processing, bleaching exposure and intermediate bake are performed as needed so as to carry out thermal cure. Thus, a cured pattern 21*b* having a desired pattern is formed as a BCS that has light blocking property so as to obtain a glass substrate 24 that has a BCS. Subsequently, (7) the foregoing glass substrate 14 and this glass substrate 24 are joined to obtain a glass substrate 25 that has a BLU and a BCS.

Furthermore, (8) a color filter 27 of three colors of red, green, and blue is formed on another glass substrate 26. Next, (9) in substantially the same method as above, a cured pattern 28 having a desired pattern is formed as a BM that has light blocking property from the negative-type photosensitive resin composition of the present invention. After that, (10) a photosensitive material for planarization is formed into a film, which is then pattern-processed by photolithography and subsequently thermally cured to form a cured film for planarization 29, on which an alignment layer 30 is formed. Thus, a color filter substrate 31 is obtained. Subsequently, (11) the foregoing glass substrate 25 and this color filter substrate 31 are joined so that (12) a glass substrate 32 that has a BLU, a BCS, and a BM is obtained. Next, (13) a liquid crystal is injected to form a liquid crystal layer 33, so that a liquid crystal display that includes the negative-type photosensitive resin composition of the present invention in the BCS and the BM is obtained.

As described above, according to the production methods for an organic EL display and a liquid crystal display which uses the negative-type photosensitive resin composition of the present invention, it is possible to obtain a cured film having high heat resistance, high sensitivity, and a low-taper pattern shape which has been pattern-processed and contains polyimide and/or polybenzo-oxazole, leading to improvement in the yield of production, improvement in the performance, and improvement in the reliability of organic EL displays and liquid crystal displays.

According to the process that uses the negative-type photosensitive resin composition of the present invention, since the resin composition is photosensitive, direct pattern processing by photolithography is feasible. Therefore, in comparison with a process that uses photoresist, the number of steps can be reduced, so that improvement of productivity, process time reduction and takt time reduction with regard to organic EL displays and liquid crystal displays can be achieved.

<Display Devices that Use Cured Films Obtained from Negative-Type Photosensitive Resin Composition of Present Invention>

Furthermore, the negative-type photosensitive resin composition of the present invention makes it possible to obtain high sensitivity and a low-taper pattern shape and obtain a cured film excellent in high heat resistance. Therefore, the negative-type photosensitive resin composition of the present invention is suitable for uses in which high heat resistance and a low-taper pattern shape are required, such as insulation layers of pixel-separating layers and the like of organic EL displays, and the like. Particularly, in uses in which problems attributable to heat resistance and pattern shape, such as defect or declined property of an element resulting from degassing due to thermal decomposition, a break of an electrode wiring due to a high-taper pattern shape, etc., are assumed, the using of the cured film of the negative-type photosensitive resin composition of the present invention makes it possible to produce a highly reliable element with which the foregoing problems do not occur. Furthermore, in the case where a coloring agent is used, since the cured film is excellent in light blocking property, it becomes possible to prevent visualization of electrode wirings or reduce external light reflection, so that contrast in image display can be improved. Therefore, by using the cured film obtained from the negative-type photosensitive resin composition of the present invention as a pixel-separating layer of an organic EL display, it is possible to improve contrast without a need to form a polarizing plate and a quarter-wavelength plate at the light extraction side of the light-emitting elements.

The display device can have a display unit that has a curved surface. It is preferable that the radius of curvature of the curved surface be 0.1 mm or greater, from the viewpoint of inhibiting display defect resulting from a wire break in the display unit having a curved surface, or the like. It is more preferable that the radius of curvature thereof be 0.3 mm or greater. Furthermore, from the viewpoint of size reduction and resolution enhancement of the display device, it is preferable that the radius of curvature of the curved surface be 10 mm or less, and it is more preferable that the radius of curvature thereof be 7 mm or less, and it is even more preferable that the radius of curvature thereof be 5 mm or less.

The production method for a display device which uses the negative-type photosensitive resin composition of the present invention includes steps of (1) to (4) as follows:

(1) a step of forming a coating film of the negative-type photosensitive resin composition of the present invention on a substrate;

(2) a step of applying a chemical active ray to the resin composition via a photomask;

(3) a step of forming a pattern of the resin composition by development with an alkali solution; and (4) a step of heating the pattern so as to obtain a cured pattern of the resin composition.

<Step of Forming Film>

The production method for a display device which uses the negative-type photosensitive resin composition of the present invention includes (1) a step of forming a film of the resin composition on a substrate.

As a method for forming a film of the negative-type photosensitive resin composition of the present invention, for example, a method in which the film is formed by applying the resin composition onto a substrate or a method in which the film is formed by applying the resin composition in a pattern on a substrate can be cited.

As the substrate, for example, a substrate in which an oxide having one or more species selected from indium, tin, zinc, aluminum, and gallium, a metal (molybdenum, silver, copper, aluminum, chromium, titanium, etc.), or CNT (carbon nano tube) has been formed as an electrode or a wiring on glass, or the like can be used.

As the oxide having one or more species selected from indium, tin, zinc, aluminum, and gallium, for example, indium tin oxide (ITO), indium zinc oxide (IZO), aluminum zinc oxide (AZO), indium gallium zinc oxide (IGZO), or zinc oxide (ZnO) can be cited.

<Method in which Negative-Type Photosensitive Resin Composition of Present Invention is Applied to Substrate>

As the method in which the negative-type photosensitive resin composition of the present invention is applied to a substrate, for example, micro gravure coating, spin coating, dip coating, curtain flow coating, roll coating, spraying coating, or slit coating can be cited. Although the coating film thickness varies depending on the coating method, the solid content concentration and viscosity of the resin composition, the resin composition is usually applied so that the film thickness subsequent to the application and the prebake is 0.1 to 30 μm.

It is preferable that after the negative-type photosensitive resin composition of the present invention is applied to a substrate, prebake be performed. The prebake may use an oven, a hot plate, infrared rays, a flash annealing apparatus, a laser annealing apparatus, etc. It is preferable that the prebake temperature be 50 to 150° C. It is preferable that the prebake time be 30 seconds to several hours. It is also permissible to perform prebake in multiple steps of two or more steps, such as prebake at 80° C. for 2 minutes and then prebake at 120° C. for 2 minutes.

<Method in which Negative-Type Photosensitive Resin Composition of Present Invention is Applied in Pattern Shape to Substrate>

As the method in which the negative-type photosensitive resin composition of the present invention is applied in a pattern shape to a substrate, for example, relief printing, intaglio printing, stencil printing, planographic printing, screen printing, ink jet printing, offset printing, or laser printing can be cited. Although the coating film thickness varies depending on the coating method, the solid content concentration or viscosity of the photosensitive resin composition of the present invention, etc., the resin composition is usually applied so that the film thickness subsequent to the application and the prebake is 0.1 to 30 μM.

It is preferable that after the negative-type photosensitive resin composition of the present invention is applied in a pattern shape to a substrate, prebake be performed. The prebake may use an oven, a hot plate, infrared rays, a flash annealing apparatus, a laser annealing apparatus, etc. It is preferable that the prebake temperature be 50 to 150° C. It is preferable that the prebake time be 30 seconds to several hours. It is also permissible to perform prebake in multiple steps of two or more steps, such as prebake at 80° C. for 2 minutes and then prebake at 120° C. for 2 minutes.

<Step of Forming Pattern by Photolithography>

The production method for a display device which uses the negative-type photosensitive resin composition of the present invention includes (2) a step of applying a chemical active ray to the resin composition via a photomask and then forming a pattern of the composition by using an alkali solution.

As the method in which the negative-type photosensitive resin composition of the present invention which has been formed as a film on a substrate is pattern-processed, for example, a method in which the negative-type photosensitive resin composition is directly pattern-processed by photolithography and a method in which the negative-type photosensitive resin composition is pattern-processed by etching can be cited. From the viewpoint of reduction of the process time and improvement in productivity due to reduction of the number of steps, a method in which the coating film is directly pattern-processed by photolithography is preferable.

After the negative-type photosensitive resin composition of the present invention is applied to a substrate and formed as a film thereon by prebake, the film is exposed by using an exposure machine such as a stepper, a mirror projection mask aligner (MPA), or a parallel light mask aligner (PLA). The chemical active rays that are applied at the time of exposure, for example, ultraviolet rays, visible light rays, electron rays, X rays, KrF (248 nm wavelength) laser, ArF (193 nm wavelength) laser, etc. can be cited. It is preferable to use a j ray (313 nm wavelength), an i ray (365 nm wavelength), an h ray (405 nm wavelength), or a g ray (436 nm wavelength) of a mercury lamp. Furthermore, the amount of exposure is usually about 100 to 40,000 J/m2 (10 to 4,000 mJ/cm2) (values from an i-ray illuminometer), and exposure can be carried out via a mask that has a desired pattern according to need.

After the exposure, post-exposure bake may be performed. By performing post-exposure bake, advantageous effects, such as improvement in post-development resolution or increase in the allowable range of development conditions, can be expected. The post-exposure bake can use an oven, a hot plate, infrared rays, a flash annealing apparatus, a laser annealing apparatus, etc. It is preferable that the post-exposure bake temperature be 50 to 180° C., and it is more preferable that the post-exposure bake temperature be 60 to 150° C. It is preferable that the post-exposure bake time be 10 seconds to several hours. When the post-exposure bake time is within the range mentioned above, reaction progresses favorably, so that the development time can sometimes be reduced.

After the exposure, development is carried out by using an automatic development device or the like. Since the negative-type photosensitive resin composition of the present invention has negative-type photosensitivity, unexposed portions, after development, are removed by the developing solution, so that a relief pattern can be obtained.

As the developing solution, an alkaline developer is commonly used. As the alkaline developer, for example, an organic alkali solution or an aqueous solution of a compound that exhibits alkalinity is preferable and, from the viewpoint of environmental aspects, an aqueous solution of a compound that exhibits alkalinity, that is, an alkali aqueous solution, is more preferable.

As the organic alkali solution or the compound that exhibits alkalinity, for example, 2-aminoethanol, 2-(dimethylamino)ethanol, 2-(diethylamino)ethanol, diethanol amine, methylamine, ethylamine, dimethylamine, diethylamine, triethylamine, (2-dimethylamino)ethyl acetate, (2-dimethylamino)ethyl (meth)acrylate, cyclohexylamine, ethylene diamine, hexamethylene diamine, ammonia, tetramethylammonium hydroxide, tetraethylammonium hydroxide, sodium hydroxide, potassium hydroxide, magnesium hydroxide, calcium hydroxide, barium hydroxide, sodium carbonate, or potassium carbonate can be cited.

As the developing solution, an organic solvent may be used. As the organic solvent, for example, the foregoing solvents, ethyl acetate, ethyl pyruvate, ethyl 3-methoxypropionate, ethyl 3-ethoxypropionate, N-methyl-2-pyrrolidone, dimethyl sulfoxide, or hexamethylphosphortriamide can be cited.

As the developing solution, a mixture solution containing both an organic solvent mentioned above and a poor solvent with respect to the negative-type photosensitive resin composition of the present invention may be used. As the poor solvent with respect to the negative-type photosensitive resin composition of the present invention, for example, water, methanol, ethanol, isopropyl alcohol, toluene, or xylene can be cited.

As the method for development, for example, methods in which a developing solution mentioned above is directly applied to the post-exposure film, or in which a developing solution mentioned above is radiated in the form of mist to the post-exposure film, or in which the post-exposure film is immersed in a developing solution mentioned above, or in which after being immersed in a developing solution mentioned above, the post-exposure film is irradiated with ultrasonic waves, etc. can be cited. It is preferable that the post-exposure film be kept in contact with the developing solution for 5 seconds to 10 minute.

After development, it is preferable that the obtained relief pattern be washed with a rinse liquid. As the rinse liquid, water is preferable in the case where an alkali aqueous solution is used as the developing solution.

As the rinse liquid, it is permissible to use, for example, an aqueous solution of alcohol, such as ethanol or isopropyl alcohol, an aqueous solution of ester, such as propylene glycol monomethyl ether acetate, or an aqueous solution of a compound that exhibits acidity, such as carbonic acid gas, hydrochloric acid, or acetic acid.

As the rinse liquid, an organic solvent may be used. From the viewpoint of affinity with the developing solution, it is preferable that the organic solvent be methanol, ethanol, isopropyl alcohol, ethyl acetate, ethyl lactate, ethyl pyruvate, propylene glycol monomethyl ether, propylene glycol monomethyl ether acetate, methyl 3-methoxypropionate, ethyl 3-ethoxypropionate, or 2-heptanone.

After a pattern of the negative-type photosensitive resin composition of the present invention is obtained by one or more kinds of methods selected from photolithography, etching, and film formation by coating in a pattern shape, bleaching exposure may be performed. By performing bleaching exposure, the post-thermosetting pattern shape can be arbitrarily controlled. Furthermore, the transparency of the cured film can be improved.

The bleaching exposure can use an exposure machine such as a stepper, a mirror projection mask aligner (MPA), or a parallel light mask aligner (PLA). As the chemical active rays applied at the time of bleaching exposure, for example, ultraviolet rays, visible light rays, electron rays, X rays, KrF (248 nm wavelength) laser, ArF (193 nm wavelength) laser, etc. can be cited. It is preferable to use a j ray (313 nm wavelength), an i ray (365 nm wavelength), an h ray (405 nm wavelength), or a g ray (436 nm wavelength) of a mercury lamp. Furthermore, the amount of exposure is usually about 500 to 500,000 J/m2 (50 to 50,000 mJ/cm2) (values from an i-ray illuminometer). Exposure can be performed via a mask that has a desired pattern as needed.

After a pattern of the negative-type photosensitive resin composition of the present invention is obtained, intermediate bake may be performed. By performing intermediate bake, the post-thermosetting resolution will improve and the post-thermosetting pattern shape can be arbitrarily controlled. The intermediate bake can use an oven, a hot plate, infrared rays, a flash annealing apparatus, or a laser annealing apparatus. It is preferable that the intermediate bake temperature be 50 to 250° C., and it is more preferable that the intermediate bake temperature be 70 to 220° C. It is preferable that the intermediate bake time be 10 seconds to several hours. It is permissible to perform intermediate bake in multiple steps of two or more steps, such as intermediate bake at 100° C. for 5 minutes and then intermediate bake at 150° C. for 5 minutes.

<Step of Obtaining Cured Pattern by Thermosetting>

The production method for a display device that uses the negative-type photosensitive resin composition of the present invention includes (3) a step of obtaining a cured pattern of the composition by heating the pattern of the composition.

The thermosetting of the pattern of the negative-type photosensitive resin composition of the present invention formed as a film on a substrate can use an oven, a hot plate, infrared rays, a flash annealing apparatus, a laser annealing apparatus, etc. By thermosetting the pattern of the negative-type photosensitive resin composition of the present invention by heating, the heat resistance of the cured film can be improved and a low-taper pattern shape can be obtained.

It is preferable that the thermosetting temperature be 150° C. or greater, and it is more preferable that the temperature be 200° C. or greater, and it is even more preferable that the temperature be 250° C. or greater. When the thermosetting temperature is within the range mentioned above, the heat resistance of the cured film can be improved and the post-thermosetting pattern shape can be made more of low taper. On the other hand, from the viewpoint of takt time reduction, it is preferable that the thermosetting temperature be 500° C. or less, and it is more preferable that the temperature be 450° C. or less, and it is even more preferable that the temperature be 400° C. or less.

It is preferable that the thermosetting time be 1 minute or longer, and it is more preferable that the time be 5 minutes or longer, and it is even more preferable that the time be 10 minutes or longer, and it is particularly preferable that the time be 30 minutes or longer. When the thermosetting time is within the range mentioned above, the post-thermosetting pattern shape can be made more of low taper. On the other hand, from the viewpoint of takt time reduction, it is preferable that the thermosetting time be 300 minutes or shorter, and it is more preferable that the time be 250 minutes or shorter, and it is even more preferable that the time be 200 minutes or shorter, and it is particularly preferable that the time be 150 minutes or shorter. It is permissible to perform thermosetting in multiple steps of two or more steps, such as thermosetting at 150° C. for 30 minutes and then thermosetting at 250° C. for 30 minute.

<Step of Pattern-Processing Transparent Electrode or Reflector Electrode>

The production method for a display device that uses the negative-type photosensitive resin composition of the present invention may include a step of pattern-processing a transparent electrode and/or a reflector electrode.

As the step of pattern-processing a transparent electrode or a reflector electrode, for example, a method in which pattern-processing is performed by etching can be cited.

After a transparent electrode or a reflector electrode is formed as a stacked structure on a substrate, photoresist is applied onto the electrode to form a film by substantially the same method as described above. It is preferable that after being applied, the photoresist film be prebaked by substantially the same method as described above.

By exposing and developing the photoresist in substantially the same method after applying and prebaking the photoresist on the transparent electrode or the reflector electrode, a pattern of the photoresist can be formed on the electrode by photolithography.

After development, it is preferable that the obtained pattern be thermoset. By thermosetting the pattern, the chemical resistance and dry etching resistance of the cured film of the photoresist will improve, so that the pattern of the photoresist can be suitably used as an etching mask. The thermosetting can use an oven, a hot plate, infrared rays, a flash annealing apparatus, a laser annealing apparatus, etc. It is preferable that the thermosetting temperature be 70 to 200° C. It is preferable that the thermosetting time be 30 seconds to several hours.

After the development and thermosetting, the transparent electrode or the reflector electrode, which is a layer below the pattern, is pattern-processed by etching with the pattern of the photoresist used as an etching mask.

As the method for etching, for example, wet etching that uses an etching liquid or dry etching that uses an etching gas can be cited. As the etching liquid, it is preferable to use an etching liquid or an organic solvent that is acid or alkaline.

<Method for Pattern-Processing by Wet Etching>

As the acid etching liquid, for example, a known etching liquid, such as a solution of a compound that exhibits acidity, such as hydrofluoric acid, hydrochloric acid, sulfuric acid, nitric acid, phosphoric acid, phosphorous acid, acetic acid, or oxalic acid, can be used.

As the alkaline etching liquid, an organic alkali solution or an aqueous solution of a compound that exhibits alkalinity is preferable.

As the organic alkali solution or the compound that exhibits alkalinity, for example, known solutions or compounds, such as 2-aminoethanol, 2-(diethylamino)ethanol, diethanol amine, triethylamine, ammonia, tetramethylammonium hydroxide, sodium hydroxide, potassium hydroxide, or potassium carbonate, can be used.

As the organic solvent, for example, known organic solvents, such as the foregoing solvents, diethylene glycol mono-n-butyl ether, ethyl 3-methoxypropionate, N-methyl-2-pyrrolidone, or isopropyl alcohol, can be used.

As the etching liquid, a mixture solution containing both an alkaline etching liquid and an organic solvent may be used.

As the method for wet etching, for example, methods in which the aforementioned etching liquid is directly applied to or the aforementioned etching liquid is radiated in the form of mist to a substrate in which a pattern of photoresist has been formed on a coating film of the photosensitive resin composition of the present invention, or in which a substrate in which a pattern of photoresist has been formed on a coating film of the photosensitive resin composition of the present invention is immersed in the aforementioned etching liquid, or in which a substrate in which a pattern of photoresist has been formed on a coating film of the photosensitive resin composition of the present invention is immersed in the aforementioned etching liquid and then irradiated with ultrasonic waves can be cited.

After wet etching, it is preferable that the transparent electrode or reflector electrode pattern-processed by wet etching be washed with a rinse liquid.

As the rinse liquid, for example, a known rinse liquid, such as water, methanol, ethanol, isopropyl alcohol, or ethyl lactate, can be used. In the case where an acidic etching liquid or an aqueous solution of a compound that exhibits alkalinity is used as the etching liquid, it is preferable that the rinse liquid be one that contains water.

<Method for Pattern-Processing by Dry Etching>

As the etching gas, for example, fluoromethane, difluoromethane, trifluoromethane, tetrafluoromethane, chlorofluoromethane, chlorodifluoromethane, chlorotrifluoromethane, dichlorofluoromethane, dichlorodifluoromethane, trichlorofluoromethane, sulfur hexafluoride, xenon difluoride, oxygen, ozone, argon, or fluorine can be cited.

As the method for dry etching, for example, reactive gas etching, in which a substrate in which a pattern of photoresist has been formed on a transparent electrode or a reflector electrode is exposed to the aforementioned etching gas, plasma etching, in which a substrate in which a pattern of photoresist has been formed on a transparent electrode or a reflector electrode is exposed to an etching gas ionized or radicalized by electromagnetic waves, reactive ion etching, in which a substrate in which a pattern of photoresist has been formed on a transparent electrode or a reflector electrode is subjected to collision with an etching gas ionized or radicalized by electromagnetic waves and accelerated by applying a bias, can be cited.

By removing the photoresist remaining on the transparent electrode or the reflector electrode after etching, a pattern of the transparent electrode or the reflector electrode can be obtained.

<Removal of Photoresist>

As the method for removing the photoresist, for example, removal with a resist stripping liquid or removal by ashing can be cited. As the resist stripping liquid, it is preferable that an organic solvent or a resist stripping liquid that is acid or alkaline be used, and known such solvents or liquids can be used. As the acidic resist stripping liquid, for example, an acidic solution or a mixture solution of an acidic solution and an oxidation agent can be cited, and known such liquids can be used. From the viewpoint of photoresist removing property, a mixture solution of an acidic solution and an oxidation agent is preferable.

As the gas for use for removal by ashing, a gas containing, as a component, one or more species selected from oxygen, ozone, argon, fluorine and chlorine can be cited. From the viewpoint of photoresist removing property, a gas containing oxygen or ozone as a component is preferable.

According to the negative-type photosensitive resin composition of the present invention, it becomes possible to prepare a coating liquid that makes it possible to obtain high sensitivity and a low-taper pattern shape and makes it possible to obtain a cured film excellent in heat resistance.

Furthermore, according to the negative-type photosensitive resin composition of the present invention, it becomes possible to obtain a cured film that can be suitably used for uses as a pixel-separating layer, a color filter, or a black matrix of a color filter in an organic EL display, a black column spacer in a liquid crystal display, a gate insulation film of a semiconductor, an interlayer insulation film of a semiconductor, a protection film for metal wiring, an insulation film for metal wiring, a planarization film for TFTs, etc. Furthermore, in the case where a coloring agent is used, because of being excellent in light blocking property, the cured film is suitable as a pixel-separating layer and a black matrix of a color filter that have light blocking property in an organic EL display or a black column spacer in a liquid crystal display. Moreover, it becomes possible to obtain an element and a display device which include the foregoing cured film for the aforementioned uses.

Furthermore, according to the production method for a display device that uses the negative-type photosensitive resin composition of the present invention, it is possible to obtain a cured film having high heat resistance which has been pattern-processed and contains polyimide and/or polybenzo-oxazole, leading to improvement in the yield of the production of organic EL displays and liquid crystal displays and performance improvement and reliability improvement thereof. Moreover, since the negative-type photosensitive resin composition of the present invention is capable of being directly pattern-processed by photolithography, the number of steps can be reduced in comparison with the processing that uses photoresist, so that it becomes possible to improve productivity, reduce the process time, and reduce the takt time.

EXAMPLES

The present invention will be described more concretely hereinafter with reference to examples and comparative example. However, the present invention is not limited to scopes thereof. Incidentally, of the compounds used, those whose abbreviations are used will be named below.

4,4'-DAE: 4,4'-diaminodiphenyl ether

6FDA: 2,2-(3,4-dicarboxyphenyl)hexafluoropropane dianhydride; 4,4'-hexafluoropropane-2,2-diyl-bis(1,2-phthalic anhydride)

APC: Argentum-Palladium-Cupper (silver-palladium-copper alloy)

BAHF: 2,2-bis(3-amino-4-hydroxyphenyl)hexafluoropropane

BAPF: 9,9-bis(3-amino-4-hydroxyphenyl)fluorene

BFE: 1,2-bis(4-formylphenyl)ethane

BHPF: 9,9-bis(4-hydroxyphenyl)fluorene

Bk-S0084: "PALIOGEN" (registered trademark) BLACK S0084 (made by BASF, a perylene based black pigment having a primary particle diameter of 50 to 100 nm)

Bk-S0100CF: "IRGAPHOR" (registered trademark) BLACK S0100CF (made by BASF, a benzofuranone based black pigment having a primary particle diameter of 40 to 80 nm)

D.BYK-167: "DISPERBYK" (registered trademark)-167 (made by BYK Japan KK, a dispersant having an amine number)

DFA: N,N-dimethylformamide dimethyl acetal

DMF: N,N-dimethylformamide

DPHA: dipentaerythritol hexaacrylate

DPHE: dipentaerythritol hexaallyl ether

DPPA: dipentaerythritol pentaacrylate

DPPE: dipentaerythritol pentaallyl ether

GMA: glycidyl methacrylate

HCl: hydrochloric acid

ICl: iodine monochloride

IGZO: indium gallium zinc oxide

ITO: indium tin oxide

KOH: potassium hydroxide

KI: potassium iodide

MAA: methacrylic acid

MAP: 3-amino phenol; meta-aminophenol

MBA: 3-methoxy-n-butyl acetate

MeTMS: methyltrimethoxysilane

MgAg: Magnesium-Argentum (magnesium-silver alloy)

NA: 5-norbornene-2,3-dicarboxylic anhydride; nadic anhydride

Na2S2O3: thiosodium sulfate

NMP: N-methyl-2-pyrrolidone

ODPA: bis(3,4-dicarboxyphenyl)ether dianhydride; oxydiphthalic dianhydride

OXE02: "IRGACURE" (registered trademark) OXE02 (made by BASF KK)

P.B.15:6: C.I. Pigment Blue 15:6

P.R.254: C.I. Pigment Red 254

P.Y.139: C.I. Pigment Yellow 139

PET: polyethylene terephthalate

PETA: pentaerythritol triacrylate

PGMEA: propylene glycol monomethyl ether acetate

PHA: phthalic anhydride

PhTMS: phenyltrimethoxysilane

PI: polyimide

S-20000: "SOLSPERSE" (registered trademark) 20000 (made by Lubrizol, a polyether based dispersant)

SiDA: 1,3-bis(3-aminopropyl)tetramethyl disiloxane

STR: styrene

TCDM: tricyclo[5.2.1.02,6]decane-8-yl methacrylate; dimethylol-tricyclodecane dimethacrylate THF: tetrahydrofuran TMSSucA: 3-trimethoxysilylpropyl succinic anhydride TetraPDA: tetrapentaerythritol decaacrylate TetraPNA: tetrapentaerythritol nonaacrylate TriPHpA: tripentaerythritol heptaacrylate TriPHxA: tripentaerythritol hexaacrylate TriPOA: tripentaerythritol octaacrylate TriPPA: tripentaerythritol pentaacrylate TrisP-PA: 1,1-bis(4-hydroxyphenyl)-1-[4-[1-(4-hydroxyphenyl)-1-methylethyl]phenyl]ethane (made by Honshu Chemical Industry Co., Ltd.)

Synthesis Example (A): Synthesis of Compound (QD-1) Having Naphthoquinone Diazide Structure In a dried nitrogen gas stream, 21.23 g (0.05 mol) of TrisP-PA and 37.62 g (0.14 mol) of 5-naphthoquinone diazide sulfonic acid chloride were weighed and dissolved in 450 g of 1,4-dioxane in a three-necked flask, and the temperature was adjusted to room temperature. A mixture solution of 50 g of 1,4-dioxane and 15.58 g (0.154 mol) of triethylamine was dropped into this while stirring was being performed so that the temperature in the system did not become 35° C. or greater. After the dropping, the mixture solution was stirred at 30° C. for 2 hours. After the stirring, the precipitated triethylamine salt was removed by filtration and then the filtrate was put into water and stirred. A precipitated solid precipitate was obtained by filtration. The obtained solid was dried by desiccation under reduced pressure to obtain a compound (QD-1) having a naphthoquinone diazide structure which was the following structure.

[CHEM. 24]

QD-1

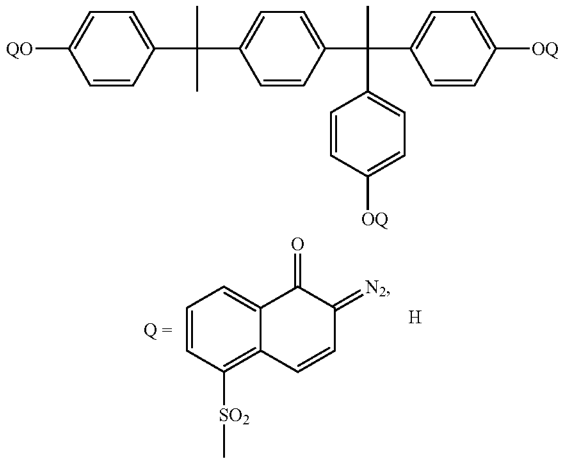

2.8:0.2

Synthesis Example 1: Synthesis of Polyimide (PI-1)

In a dried nitrogen gas stream, 21.98 g (0.060 mol, i.e., 54.5 mol % relative to the structural unit originating from the entire amines and their derivatives) of BAHF, 5.01 g (0.025 mol, i.e., 22.7 mol % relative to the structural unit originating from the entire amines and their derivatives) of 4,4'-DAE, 1.24 g (0.0050 mol, i.e., 4.5 mol % relative to the structural unit originating from the entire amines and their derivative) of SiDA, 2.18 g (0.020 mol, i.e., 18.2 mol % relative to the structural unit originating from the entire amines and their derivatives) of MAP as an end-capping agent, and 150.00 g of NMP were weighed and dissolved in a three-necked flask. Into this, a solution in which 31.02 g (0.10 mol, i.e., 100 mol % relative to the structural unit originating from the entire carboxylic acids and their derivatives) of ODPA was dissolved in 50.00 g of NMP was added. Then, stirring was performed at 20° C. for 1 hour and then stirring was performed at 50° C. for 4 hours. After that, 15 g of xylene was added, and stirring was performed at 150° C. for 5 hours while the azeotropy of water with xylene was allowed to occur. After the reaction ended, the reaction solution was put into 3L of water and precipitated solid precipitate was obtained by filtration. The obtained solid was washed with water three times and then dried for 24 hours by a vacuum dryer at 80° C. to obtain a polyimide (PI-1). The obtained polyimide had an Mw of 27,000 and an acid equivalent of 440 g/mol. Incidentally, the ratios (molar ratios) of monomers made up of ODPA, BAHF, 4,4'-DAE, SiDA, and MAP are shown in Table 1-1. Furthermore, the structural unit originating from a monomer having a fluorine atom relative to the entire structural unit was 28.6 mol %.

Synthesis Examples 2 to 4: Synthesis of Polyimides (PI-2) to (PI-4)

The ratios (molar ratios) of the monomers made up of ODPA, 6FDA, BAHF, 4,4'-DAE, SiDA, and MAP were changed to the ratios shown in Table 1-1 and polymerization was performed in substantially the same manner as in Synthesis Example 1 to obtain polyimides (PI-2) to (PI-4).

Synthesis Example 5: Synthesis of Polybenzoxazole (PBO-1)

14.65 g (0.040 mol, i.e., 40.0 mol % relative to the structural unit originating from the entire amines and their derivatives) of BAHF, 20.92 g (0.055 mol, i.e., 55.0 mol % relative to the structural unit originating from the entire amines and their derivatives) of BAPF, 1.24 g (0.0050 mol, i.e., 5.0 mol % relative to the structural unit originating from the entire amines and their derivatives) of SiDA, and 75.00 g of NMP were weighed and dissolved in a 500-mL round-bottom flask equipped with a toluene-filled Dean-Stark water separator and a cooling pipe. Into this, a solution in which 19.06 g (0.080 mol, i.e., 66.7 mol % of the structural unit originating from the entire carboxylic acids and their derivatives) of BFE and 6.57 g (0.040 mol, i.e., 33.3 mol % relative to the structural unit originating from the entire carboxylic acids and their derivatives) of NA as an end-capping agent were dissolved in 25.00 g of NMP was added. Then, stirring was performed at 20° C. for 1 hour and subsequently stirring was performed at 50° C. for 1 hour. After that, in a nitrogen atmosphere, heating and stirring was performed at 200° C. or higher for 10 hours, conducting dehydration reaction. After the reaction ended, the reaction solution was put into 3L of water, and precipitated solid precipitate was obtained by filtration. The obtained solid was washed with water three times and dried by a vacuum dryer at 80° C. for 24 hours to obtain a polybenzo-oxazole (PBO-1). The obtained polybenzo-oxazole had an Mw of 25,000 and an acid equivalent of 780 g/mol. Incidentally, the ratios (molar ratios) of the monomers made up of BFE, BAHF, BAPF, SiDA, and NA are shown in Table 1-2. Furthermore, the structural unit originating from the monomers having fluorine atoms relative to the entire structural unit was 18.2 mol %.

Synthesis Example 6: Synthesis of Polybenzoxazole (PBO-2)

The ratios (molar ratios) of monomers made up of BFE, BAHF, SiDA, and NA were changed to the ratios shown in Table 1-2, and polymerization was performed in substantially the same manner as in Synthesis Example 5 to obtain polybenzoxazole (PBO-2).

Synthesis Example 7: Synthesis of Polyimide Precursor (PIP-1)

In a dried nitrogen gas stream, 31.02 g (0.10 mol, i.e., 100 mol % relative to the structural unit originating from the entire carboxylic acids and their derivatives) of ODPA and 150 g of NMP were weighed and dissolved in a three-necked flask. Into this, a solution in which 21.98 g (0.060 mol, i.e., 54.5 mol % relative to the structural unit originating from the entire amines and their derivatives) of BAHF, 5.01 g (0.025 mol, i.e., 22.7 mol % relative to the structural unit originating from the entire amines and their derivatives) of 4,4'-DAE, and 1.24 g (0.0050 mol, i.e., 4.5 mol % relative to the structural unit originating from the entire amines and their derivatives) of SiDA were dissolved in 50 g of NMP was added. Then, stirring was performed at 20° C. for 1 hour and subsequently stirring was performed at 50° C. for 2 hours. Next, as an end-capping agent, a solution in which 2.18 g (0.020 mol, i.e., 18.2 mol % relative to the structural unit originating from the entire amines and their derivatives) of MAP was dissolved in 15 g of NMP was added. Then, stirring was performed at 50° C. for 2 hours. After that, a solution in which 23.83 g (0.20 mol) of DFA was dissolved in 15 g of NMP was dropped over a period of 10 minutes. After the dropping ended, stirring was performed at 50° C. for 3 hours. After the reaction ended, the reaction solution was cooled to room temperature. Then, the reaction solution was put into 3L of water, and precipitated solid precipitate was obtained by filtration. The obtained solid was washed with water three times and was dried by a vacuum dryer at 80° C. for 24 hours to obtain a polyimide precursor (PIP-1). The obtained polyimide precursor had an Mw of 20,000 and an acid equivalent of 330 g/mol. Incidentally, the ratios (molar ratios) of the monomers made up of ODPA, BAHF, 4,4'-DAE, SiDA, and MAP mentioned above are shown in Table 1-3. Furthermore, the structural unit originating from the monomer having fluorine atoms relative to the entire structural unit was 28.6 mol %.

Synthesis Examples 8 to 10: Synthesis of Polyimide Precursors (PIP-2) to (PIP-4)

The ratios (molar ratios) of the monomers made up of ODPA, 6FDA, BAHF, 4,4'-DAE, SiDA, and MAP were changed to the ratios shown in Table 1-3, and polymerization was performed in substantially the same manner as in Synthesis Example 7 to obtain polyimide precursors (PIP-2) to (PIP-4).

Synthesis Example 11: Synthesis of Polybenzoxazole Precursor (PBOP-1)

14.65 g (0.040 mol, i.e., 40.0 mol % relative to the structural unit originating from the entire amines and their derivatives) of BAHF, 20.92 g (0.055 mol, i.e., 55.0 mol % relative to the structural unit originating from the entire amines and their derivatives) of BAPF, 1.24 g (0.0050 mol, i.e., 5.0 mol % relative to the structural unit originating from the entire amines and their derivatives) of SiDA, and 70.00 g of NMP were weighed and dissolved in a 500-mL round-bottom flask equipped with a toluene-filled Dean-Stark water separator and a cooling pipe. Into this, a solution in which 19.06 g (0.080 mol, i.e., 66.7 mol % relative to structural unit originating from the entire carboxylic acids and their derivatives) of BFE was dissolved in 20.00 g of NMP was added. Then, stirring was performed at 20° C. for 1 hour and subsequently stirring was performed at 50° C. for 2 hours. Next, as an end-capping agent, a solution in which 6.57 g (0.040 mol, i.e., 33.3 mol % relative to the structural unit originating from the entire carboxylic acids and their derivatives) of NA was dissolved in 10 g of NMP was added. Then, stirring was performed at 50° C. for 2 hours. After that, stirring was performed at 100° C. for 2 hours in a nitrogen atmosphere. After the reaction ended, the reaction solution was put into 3L of water, and precipitated solid precipitate was obtained by filtration. The obtained solid was washed with water three times and then dried by a vacuum dryer at 80° C. for 24 hours to obtain a polybenzo-oxazole precursor (PBOP-1). The obtained polybenzo-oxazole precursor had an Mw of 20,000 and an acid equivalent of 780 g/mol. Incidentally, the ratios (molar ratios) of the monomers made up of BFE, BAHF, BAPF, SiDA, and NA mentioned above are shown in Table 1-4. Furthermore, the structural unit originating from the monomer having fluorine atoms relative to the entire structural unit was 18.2 mol %.

Synthesis Example 12: Synthesis of Polybenzoxazole Precursor (PBOP-2)

With the ratios (molar ratios) of the monomers made up of BFE, BAHF, SiDA, and NA being the ratios shown in Table 1-4, a polybenzoxazole precursor (PBOP-2) was obtained in substantially the same manner as in Synthesis Example 11.

Synthesis Example 13: Synthesis of Polysiloxane Solution (PS-1)

A three-necked flask was charged with 28.95 g (42.5 mol %) of MeTMS, 49.57 g (50 mol %) of PhTMS, and 74.01 g of PGMEA. Air was caused to flow at 0.05 L/min in the flask, and the mixture solution, while being stirred, was heated to 40° C. in an oil bath. While the mixture solution was further being stirred, a phosphoric acid aqueous solution in which 0.442 g of phosphoric acid was dissolved in 27.71 g of water was dropped thereinto over 10 minutes. After the dropping ended, stirring was performed at 40° C. for 30 minutes to hydrolyze silane compounds. After the hydrolysis ended, a solution in which 9.84 g (7.5 mol %) of TMSSucA was dissolved in 8.22 g of PGMEA was added. After that, the bath temperature was changed to 70° C. and stirring was performed for 1 hour. Subsequently, the bath temperature was raised up to 115° C. About 1 hour after the temperature rise started, the internal temperature of the solution reached 100° C. For 2 hours following that time, heating and stirring was performed (the internal temperature was 100 to 110° C.). The resin solution obtained by heating and stirring for 2 hours was cooled in an ice bath. Then, an anion exchange resin and a cation exchange resin were each added in an amount of 2 mass % relative to the resin solution, and stirring was performed for 12 hours. After the stirring, the anion exchange resin and the cation exchange resin were removed by filtration to obtain a polysiloxane solution (PS-1). The obtained polysiloxane had an Mw of 4,000 and an acid equivalent of 910 g/mol. The composition ratios are mentioned in Table 1-5. The structural unit originating from the organosilane having aromatic groups relative to the entire amount of polysiloxane was 50.0 mol %.

Synthesis Example 14: Synthesis of Cardo Based Resin (CD-1)

35.04 g (0.10 mol) of BHPF and 40.31 g of MBA were weighed and dissolved in a three-necked flask. Into this, a solution in which 27.92 g (0.090 mol) of ODPA and, as an end-capping agent, 2.96 g (0.020 mol) of PHA were dissolved in 30.00 g of MBA was added, and then stirring was performed at 20° C. for 1 hour. After that, stirring was performed at 150° C. for 5 hours in a nitrogen atmosphere. After the reaction ended, a solution in which 14.22 g (0.10 mol) of GMA, 0.135 g (0.0010 mol) of dibenzylamine, and 0.037 g (0.0003 mol) of 4-methoxyphenol were dissolved in 10.00 g of MBA was added into the obtained solution, and stirring was performed at 90° C. for 4 hours to obtain a cardo based resin solution (CD-1). The obtained cardo based resin had an Mw of 4,000, an acid equivalent of 800 g/mol, and a double bond equivalent of 800 g/mol. The composition ratios are mentioned in Table 1-6. The structural unit originating from the monomers having aromatic groups relative to the structural unit originating from the entire carboxylic acid derivatives was 100.0 mol %.

Synthesis Example 15: Synthesis of Acrylic Resin Solution (AC-1)

A three-necked flask was charged with 0.821 g (1 mol %) of 2,2'-azobis(isobutyronitrile) and 29.29 g of PGMEA. Next, 21.52 g (50 mol %) of MAA, 22.03 g (20 mol %) of TCDM, and 15.62 g (30 mol %) of STR were charged thereinto, and stirring was performed for a while at room temperature. After the inside of the flask was subjected to sufficient nitrogen substitution by bubbling, stirring was performed at 70° C. for 5 hours. Next, a solution in which 14.22 g (20 mol %) of GMA, 0.676 g (1 mol %) of dibenzylamine, and 0.186 g (0.3 mol %) of 4-methoxyphenol were dissolved in 59.47 g of PGMEA was added to the obtained solution, and stirring was performed at 90° C. for 4 hours to obtain an acrylic resin solution (AC-1). The obtained acrylic resin had an Mw of 15,000, an acid equivalent of 490 g/mol, and a double bond equivalent of 730 g/mol. The composition ratios are mentioned in Table 1-7. The structural unit originating from the monomers having aromatic groups relative to the structural unit originating from the entire copolymerization components was 30.0 mol %.

The compositions of Synthesis Examples 1 to 15 are collectively shown in Table 1-1 to Table 1-7.

TABLE 1-1

| | Polymer | Monomer [molar ratio] Tetracarboxylic acid and its derivative | | Diamine and its derivative | | | End-capping agent | Structural unit originating from monomer having fluorine atom in entire structural unit [mol %] | Structural unit originating from monomer having fluorine atom in structural unit originating from entire carboxylic acid derivative [mol %] | Structural unit originating from monomer having fluorine atom in structural unit originating from entire amine derivative [mol %] | Acid equivalent [g/mol] |
|---|---|---|---|---|---|---|---|---|---|---|---|
| Synthesis Example 1 | Polyimide (PI-1) | ODPA (100) | — | BAHF (60) | 4,4'-DAE (25) | SiDA (5) | MAP (20) | 28.6 | 0.0 | 54.5 | 440 |
| Synthesis Example 2 | Polyimide (PI-2) | ODPA (100) | — | BAHF (85) | — | SiDA (5) | MAP (20) | 40.5 | 0.0 | 77.3 | 350 |
| Synthesis Example 3 | Polyimide (PI-3) | ODPA (60) | 6FDA (40) | BAHF (60) | 4,4'-DAE (25) | SiDA (5) | MAP (20) | 47.6 | 40.0 | 54.5 | 480 |
| Synthesis Example 4 | Polyimide (PI-4) | ODPA (60) | 6FDA (40) | BAHF (85) | — | SiDA (5) | MAP (20) | 59.5 | 40.0 | 77.3 | 380 |

TABLE 1-2

| | Polymer | Monomer [molar ratio] Dicarboxylic acid and its derivative, and diformyl compound and its derivative | Bisaminophenol compound and its derivative, and dihydroxy diamine and its derivative | | | End-capping agent | Structural unit originating from monomer having fluorine atom in entire structural unit [mol %] | Structural unit originating from monomer having fluorine atom in structural unit originating from entire carboxylic acid derivative [mol %] | Structural unit originating from monomer having fluorine atom in structural unit originating from entire amine derivative [mol %] | Acid equivalent [g/mol] |
|---|---|---|---|---|---|---|---|---|---|---|
| Synthesis Example 5 | Polybenzo-oxazole (PBO-1) | BFE (80) | BAHF (40) | BAPF (55) | SiDA (5) | NA (40) | 18.2 | 0.0 | 40.0 | 780 |
| Synthesis Example 6 | Polybenzo-oxazole (PBO-2) | BFE (80) | BAHF (95) | — | SiDA (5) | NA (40) | 43.2 | 0.0 | 95.0 | 330 |

TABLE 1-3

| | Polymer | Monomer [molar ratio] Tetracarboxylic acid and its derivative | | Diamine and its derivative | | | End-capping agent | Structural unit originating from monomer having fluorine atom in entire structural unit [mol %] | Structural unit originating from monomer having fluorine atom in structural unit originating from entire carboxylic acid derivative [mol %] | Structural unit originating from monomer having fluorine atom in structural unit originating from entire amine derivative [mol %] | Acid equivalent [g/mol] |
|---|---|---|---|---|---|---|---|---|---|---|---|
| Synthesis Example 7 | Polyimide precursor (PIP-1) | ODPA (100) | — | BAHF (60) | 4,4'-DAE (25) | SiDA (5) | MAP (20) | 28.6 | 0.0 | 54.5 | 330 |
| Synthesis Example 8 | Polyimide precursor (PIP-2) | ODPA (100) | — | BAHF (85) | — | SiDA (5) | MAP (20) | 40.5 | 0.0 | 77.3 | 350 |
| Synthesis Example 9 | Polyimide precursor (PIP-3) | ODPA (60) | 6FDA (40) | BAHF (60) | 4,4'-DAE (25) | SiDA (5) | MAP (20) | 47.6 | 40.0 | 54.5 | 350 |
| Synthesis Example 10 | Polyimide precursor (PIP-4) | ODPA (60) | 6FDA (40) | BAHF (85) | — | SiDA (5) | MAP (20) | 59.5 | 40.0 | 77.3 | 380 |

TABLE 1-4

| | Polymer | Monomer [molar ratio]<br>Dicarboxylic acid and its derivative, and diformyl compound and its derivative | Bisaminophenol compound and its derivative, and dihydroxy diamine and its derivative | | | End-capping agent | Structural unit originating from monomer having fluorine atom in entire structural unit [mol %] | Structural unit originating from monomer having fluorine atom in structural unit originating from entire carboxylic acid derivative [mol %] | Structural unit originating from monomer having fluorine atom in structural unit originating from entire amine derivative [mol %] | Acid equivalent [g/mol] |
|---|---|---|---|---|---|---|---|---|---|---|
| Synthesis Example 11 | Polybenzo-oxazole precursor (PBOP-1) | BFE (80) | BAHF (40) | BAPF (55) | SiDA (5) | NA (40) | 18.2 | 0.0 | 40.0 | 780 |
| Synthesis Example 12 | Polybenzo-oxazole precursor (PBOP-2) | BFE (80) | BAHF (95) | — | SiDA (5) | NA (40) | 43.2 | 0.0 | 95.0 | 330 |

TABLE 1-5

| | Polymer | Monomer [mol %]<br>Trifunctional organosilane | | | Structural unit originating from organosilane having aromatic group in polysiloxane [mol %] | Acid equivalent [g/mol] |
|---|---|---|---|---|---|---|
| Synthesis Example 13 | Polysiloxane solution (PS-1) | MeTMS (42.5) | PhTMS (50) | TMSSucA (7.5) | 50.0 | 910 |

TABLE 1-6

| | Polymer | Monomer [molar ratio]<br>Compound having two or more aromatic groups and hydroxy group | Tetracarboxylic acid dianhydride tetracarboxylic acid | End-capping agent | Unsaturated compound having ethylenic unsaturated bond group and epoxy group | Structural unit originating from monomer having aromatic group in structural unit originating from entire carboxylic acid derivative [mol %] | Acid equivalent [g/mol] | Double bond equivalent [g/mol] |
|---|---|---|---|---|---|---|---|---|
| Synthesis Example 14 | Cardo based resin (CD-1) | BHPF (100) | ODPA (90) | PHA (20) | GMA (100) | 100.0 | 810 | 810 |

TABLE 1-7

| | Polymer | Monomer [molar ratio]<br>Copolymerization component having acidic group | Copolymerization component having aromatic group | Copolymerization component having alicyclic group | Unsaturated compound having ethylenic unsaturated bond group and epoxy group | Structural unit originating from monomer having aromatic group in structural unit originating from entire copolymerization component [mol %] | Acid equivalent [g/mol] | Double bond equivalent [g/mol] |
|---|---|---|---|---|---|---|---|---|
| Synthesis Example 15 | Acrylic resin solution (AC-1) | MAA (50) | STR (30) | TCDM (20) | GMA (20) | 30.0 | 490 | 740 |

Preparation Example 1: Preparation of Pigment Dispersion Liquid (Bk-1)

138.0 g of a 30-mass % MBA solution of the polyimide (PI-1) obtained in Synthesis Example 1 as a resin, 13.8 g of S-20000 as a dispersant, 685.4 g of MBA as a solvent, and 82.8 g of Bk-S0100CF as a coloring agent were weighed and mixed, and then stirred for 20 minutes by using a high-speed disperser (Homodisper Model 2.5, made by PRIMIX Corporation) to obtain a tentative dispersion liquid. An Ultra Apex Mill (UAM-015, made by KOTOBUKI KOGYOU CO., LTD) having a centrifugal separation separator filled 75% with a Ø0.30-mm ground zirconia ball (YTZ, made by Tosoh Corporation) as ceramic beads for pigment dispersion was supplied with the obtained tentative dispersion liquid, which was then processed at a rotor peripheral speed of 7.0 m/s for 3 hours to obtain a pigment dispersion liquid (Bk-1) with a solid content concentration of 15 mass % and a coloring agent/resin/dispersant=60/30/10 (weight ratio). The pigment in the obtained pigment dispersion liquid had a number average particle diameter of 100 nm.

Preparation Examples 2 to 9: Preparation of Pigment Dispersion Liquids (Bk-2) to (Bk-9)

Pigments were dispersed at the composition ratios mentioned in Table 2 in substantially the same manner as in Preparation Example 1 to obtain pigment dispersion liquids (Bk-2) to (Bk-9).

The compositions of Preparation Examples 1 to 9 are collectively shown in Table 2. Incidentally, in Table 2, with regard to each of the pigment dispersion liquids (Bk-1) to (Bk-9), the amounts [mass %] of the individual solid components relative to the entire solid content amount are mentioned.

TABLE 2

| | Dispersion liquid | Composition [mass %] (D) Coloring agent | | | (A) Alkali soluble resin | (E) Dispersant | Number average particle diameter of pigment in pigment dispersion liquid [nm] |
|---|---|---|---|---|---|---|---|
| Preparation Example 1 | Pigment dispersion liquid (Bk-1) | Bk-S0100CF (60) | — | — | Polyimide (PI-1) (30) | S-20000 (10) | 100 |
| Preparation Example 2 | Pigment dispersion liquid (Bk-2) | Bk-S0100CF (60) | — | — | Polybenzoxazole (PBO-1) (30) | S-20000 (10) | 100 |
| Preparation Example 3 | Pigment dispersion liquid (Bk-3) | Bk-S0100CF (60) | — | — | Polyimide precursor (PIP-1) (20) | S-20000 (20) | 100 |
| Preparation Example 4 | Pigment dispersion liquid (Bk-4) | Bk-S0100CF (60) | — | — | Polybenzoxazole precursor (PBPO-1) (20) | S-20000 (20) | 100 |
| Preparation Example 5 | Pigment dispersion liquid (Bk-5) | Bk-S0100CF (60) | — | — | Polysiloxane (PS-1) (20) | S-20000 (20) | 100 |
| Preparation Example 6 | Pigment dispersion liquid (Bk-6) | Bk-S0100CF (60) | — | — | Cardo based resin (CD-1) (20) | S-20000 (20) | 100 |
| Preparation Example 7 | Pigment dispersion liquid (Bk-7) | Bk-S0100CF (60) | — | — | Acrylic resin solution (AC-1) (20) | S-20000 (20) | 100 |
| Preparation Example 8 | Pigment dispersion liquid (Bk-8) | Bk-S0084 (60) | — | — | Polyimide (PI-1) (20) | D.BYK-167 (20) | 120 |
| Preparation Example 9 | Pigment dispersion liquid (Bk-9) | P.R.254 (21) | P.Y.139 (9) | P.B.15:6 (30) | Polyimide (PI-1) (20) | D.BYK-167 (20) | 110 |

Evaluation methods in Examples and Comparative Examples will be indicated below.

(1) Weight-Average Molecular Weight of Resin

Using a GPC analyzer apparatus (HLC-8220, made by Tosoh Corporation) and using THF or NMP as a fluid bed, the weight-average molecular weight in terms of polystyrene was measured and determined by a method near normal temperature on the basis of "JIS K7252-3(2008)".

(2) Acid Value, Acid Equivalent

Using an automatic electric potential difference titration apparatus (AT-510, made by Kyoto Electronics Manufacturing Co., Ltd.) and using a 0.1 mol/L NaOH/ethanol solution as a titration reagent and xylene/DMF=1/1 (weight ratio) as a titration solvent, an acid value (whose unit is mgKOH/g) was measured and determined by an electric potential difference titration method on the basis of "JIS K2501(2003)". From the measured numerical value of the acid value, an acid equivalent (whose unit is g/mol) was calculated.

(3) Double Bond Equivalent

Using an automatic electric potential difference titration apparatus (AT-510, made by Kyoto Electronics Manufacturing Co., Ltd.) and using an ICl solution (mixture solution of $ICl_3$=7.9 g, 12=8.9 g, and AcOH=1,000 mL) as an iodine supply source, a 100 g/L KI aqueous solution as an aqueous solution for trapping unreacted iodine, and a 0.1 mol/L $Na_2S_2O_3$ aqueous solution as a titration reagent, the iodine value of the resin was measured by a method described in "Article 6: Iodine Value" of JIS K0070:1992 "Test Methods for Acid Value, Saponification Value, Ester Value, Iodine Value, Hydroxyl Value, and Unsaponifiable Matter of Chemical Product". From the numerical value of the measured iodine value (whose unit is gl/100 g), a double bond equivalent (whose unit is g/mol) was calculated.

(4) Content Ratios of Organosilane Units in Polysiloxane

Measurement of $^{29}$Si-NMR was performed and the percentage of an integrated value of Si originating from a specific organosilane unit with respect to the integrated value of the entire Si originating from organosilane was calculated to compute the content ratios thereof. Specimens (liquid) were injected into NMR sample pipes made of "Teflon" (registered trademark) having a diameter of 10 mm, for use in measurement. $^{29}$Si-NMR measurement conditions are indicated below.

Apparatus: a nuclear magnetic resonance apparatus (JNM-GX270, made by JEOL Ltd.)
Measurement method: a gated decoupling method
Measurement nuclear frequency: 53.6693 MHz ($^{29}$Si nucleus)
Spectrum width: 20000 Hz
Pulse width: 12 μs (45° pulse)
Pulse repetition time: 30.0 seconds
Solvent: acetone-$d_6$
Reference matter: tetramethylsilane
Measurement temperature: 23° C.
Specimen rotation speed: 0.0 Hz (5) Measurement of Number Average Particle Diameter of Pigments Using a zeta potential/particle diameter/molecular weight measurement apparatus (Zeta Sizer Nano ZS, made by SYSMEX CORPORATION) and using PGMEA as a diluting solvent, a pigment dispersion liquid was diluted to a concentration of $1.0\times10^{-5}$ to 40 vol %. The refractive index of the diluting solvent was set to the PGMEA and the refractive index of the measurement subject was set to 1.8. Then, laser light of 633 nm wavelength was applied to measure a number average particle diameter of the pigment in the pigment dispersion liquid.

(6) Pre-Process of Substrate

A glass substrate in which APC (silver/palladium/copper=98.07/0.87/1.06 (weight ratio)) had been formed into a film by 10-nm sputtering on a glass sheet and, furthermore, as an upper layer on the APC layer, ITO was formed into a film of 100 nm by sputtering (made by GEOMATEC Co., Ltd., hereinafter "ITO/Ag substrate") was subjected to a pre-process of performing a UV-$O_3$ washing process for 100 seconds by using a table-top UV/Ozone Processing Unit (PL16-110, made by SEN LIGHTS Corporation) before the glass substrate was used.

(7) Film Thickness Measurement

Using a surface roughness/contour shape measuring machine (SURFCOM 1400D, made by TOKYO SEIMITSU CO., LTD.) with the measurement magnification set to 10,000 times, the measurement length set to 1.0 mm, and the measurement speed set to 0.30 mm/s, the post-prebake, post-development, and post-thermosetting film thicknesses were measured.

(8) Sensitivity

In a method described below in Example 1, a both-surface alignment one-side surface exposure apparatus (Mask Aligner PEM-6M, made by Union Optical Co., Ltd.) was used to perform patterning exposure to an i ray (365 nm wavelength), an h ray (405 nm wavelength), and a g ray (436 nm wavelength) of a super high pressure mercury lamp, via a gray scale mask for sensitivity measurement (MDRM MODEL 4000-5-FS, made by Opto-Line International). Then, development was performed by using a small-size development device for photolithography (AD-2000, made by TAKIZAWA CO., LTD.), so that a post-development film of the composition was created.

Using an FPD/LSI inspection microscope (OPTIPHOT-330, made by NIKON CORPORATION), the resolution pattern of the created post-development film was observed. An amount of exposure (value from an i-ray illuminometer) that forms a 20-μm line-and-space pattern with a 1-to-1 width was determined as the sensitivity. Determination was performed as follows. A+, A, B, and C, in which the sensitivity was 90 mJ/cm$^2$ or less, were considered as passed, and A+, A, and B, in which the sensitivity was 60 mJ/cm$^2$ or less, were considered as good in sensitivity, and A+ and A, in which a sensitivity of 45 mJ/cm$^2$ or less was achieved, were considered as excellent in sensitivity.

A+: The sensitivity was 1 to 30 mJ/cm$^2$.
A: The sensitivity was 31 to 45 mJ/cm$^2$.
B: The sensitivity was 46 to 60 mJ/cm$^2$.
C: The sensitivity was 61 to 90 mJ/cm$^2$.
D: The sensitivity was 91 to 150 mJ/cm$^2$.
E: The sensitivity was 151 to 500 mJ/cm$^2$.
F: The sensitivity was 501 to 1,000 mJ/cm$^2$.

(9) Cross-Sectional Shape of Pattern

In a method described below in Example 1, a both-surface alignment one-side surface exposure apparatus (Mask Aligner PEM-6M, made by Union Optical Co., Ltd.) was used to perform patterning exposure to an i ray (365 nm wavelength), an h ray (405 nm wavelength), and a g ray (436 nm wavelength) of a super high pressure mercury lamp, via a gray scale mask for sensitivity measurement (MDRM MODEL 4000-5-FS, made by Opto-Line International). Then, development was performed by using a small-size development device for photolithography (AD-2000, made by TAKIZAWA CO., LTD.). Then, using a High-Temperature Inert Gas Oven (INH-9CD-S, made by Koyo Thermo Systems Co., Ltd.), a cured film of the composition was created.

Using an electric field emission type scanning electron microscope (S-4800, made by Hitachi High-Technologies Corporation), cross sections of line-and-space patterns having a space measure width of 20 μm in the resolution patterns of the cured films created were observed and the taper angles of the cross sections were measured. Determination was carried out as follows. A+, A, and B, in which the taper angle of the cross section was 60° or less, were considered as passed, and A+ and A, in which the taper angle of the cross section was 45° or less, were considered as good in pattern shape, and A+, in which the taper angle of the cross section was 30° or less, was considered as excellent in pattern shape.

A+: The taper angle of the cross section was 1 to 30°.
A: The taper angle of the cross section was 31 to 45°.
B: The taper angle of the cross section was 46 to 60°.

C: The taper angle of the cross section was 61 to 70°.
D: The taper angle of the cross section was 71 to 80°.
E: The taper angle of the cross section was 81 to 179°.

(10) Heat Resistance (High-Temperature Weight Residue Ratio)

In a method described below in Example 1, a both-surface alignment one-side surface exposure apparatus (Mask Aligner PEM-6M, made by Union Optical Co., Ltd.) was used to perform patterning exposure to an i ray (365 nm wavelength), an h ray (405 nm wavelength), and a g ray (436 nm wavelength) of a super high pressure mercury lamp, via a gray scale mask (MDRM MODEL 4000-5-FS, made by Opto-Line International) for sensitivity measurement. Then, development was performed by using a small-size development device for photolithography (AD-2000, made by TAKIZAWA CO., LTD.). Then, using a High-Temperature Inert Gas Oven (INH-9CD-S, made by Koyo Thermo Systems Co., Ltd.), a cured film of the composition was created.

After being thermoset, the cured film created was scraped off from the substrate. Then, about 10 mg of the film was placed in an aluminum cell. Using a thermogravimetry apparatus (TGA-50, made by Shimadzu Corporation), this aluminum cell was subjected to thermogravimetric analysis by keeping the aluminum cell at 30° C. in a nitrogen atmosphere for 10 minutes, heating it to 150° C. at a temperature increase speed of 10° C./min, and then keeping it at 150° C. for 30 minutes, and further heating it to 500° C. at a temperature increase speed of 10° C./min. With respect to the weight subsequent to the heating at 150° C. for 30 minutes being 100 mass %, the weight residual ratio at 350° C. subsequent to further heating was denoted by (Ma) mass % and the weight residual ratio at 400° C. was denoted by (Mb) mass %, and a high-temperature weight residue ratio difference ((Ma)−(Mb)) was calculated as an indicator of heat resistance.

Determination was made as indicated below, and A+, A, and B, in which the high temperature weight residue ratio difference was 25.0 mass % or less, were considered as passing, A+ and A, in which the high temperature weight residue ratio difference was 15.0% or less, were considered as good in heat resistance, and A+, in which the high temperature weight residue ratio difference was 5.0% or less, was considered as excellent in heat resistance.

A+: The high temperature weight residue ratio difference was 0 to 5.0%.
A: The high temperature weight residue ratio difference was 5.1 to 15.0%.
B: The high temperature weight residue ratio difference was 15.1 to 25.0%.
C: The high temperature weight residue ratio difference was 25.1 to 35.0%.
D: The high temperature weight residue ratio difference was 35.1 to 45.0%.
E: The high temperature weight residue ratio difference was 45.1 to 100%.

(11) Light Blocking Property (Optical Density (Hereinafter, "OD" Value)

In a method described below in Example 1, a both-surface alignment one-side surface exposure apparatus (Mask Aligner PEM-6M, made by Union Optical Co., Ltd.) was used to perform patterning exposure to an i ray (365 nm wavelength), an h ray (405 nm wavelength), and a g ray (436 nm wavelength) of a super high pressure mercury lamp, via a gray scale mask (MDRM MODEL 4000-5-FS, made by Opto-Line International) for sensitivity measurement. Then, development was performed by using a small-size development device for photolithography (AD-2000, made by TAKIZAWA CO., LTD.). Then, using a High-Temperature Inert Gas Oven (INH-9CD-S, made by Koyo Thermo Systems Co., Ltd.), a cured film of the composition was created.

Using a transmission densitometer (X-Rite 361T(V), made by X-Rite company), the created cured film was subjected to measurement of incident light intensity ($I_0$) and of transmitted light intensity (I). As an indicator of the light blocking property, an OD value was calculated by the following expression. OD value=$\log_{10}(I_0/I)$

(12) Light Emission Characteristics of Organic EL Display Device (Manufacturing Method for Organic EL Display Device)

FIGS. 3(1) to (4) show schematic diagrams of a substrate used. First, an ITO transparent conductive coating of 10 nm is formed entirely over a non-alkali glass substrate 34 of 38×46 mm by sputtering, and etched to be a first electrode 35. A transparent electrode was thus formed. Furthermore, an auxiliary electrode 36 for extracting a second electrode was simultaneously formed (FIG. 3(1)). The obtained substrate was ultrasonically washed for 10 minutes with "Semicoclean" (registered trademark) 56 (made by Furuuchi Chemical Corporation) and washed with ultrapure water. Next, on this substrate, the negative-type photosensitive resin compositions containing pigments prepared in Examples (Comparative Examples) were applied and prebaked by the method described above. The compositions were then subjected to patterning exposure via a photomask having a predetermined pattern, developed, and rinsed, and then was heated to be thermally cured. By the method described above, an electrical insulation layer 37 having a shape in which opening portions of 70 μm in width and 260 μm in length were arranged with a pitch of 155 μm in a width direction and a pitch of 465 μm in a length direction and in which the individual opening portions exposed the first electrodes was formed exclusively in a substrate effective area (FIG. 3(2)). Incidentally, the opening portions were to eventually become light-emitting pixels of organic EL display devices. Furthermore, the substrate effective area was 16 mm squares, and the electrical insulation layer 37 was formed to have a thickness of about 1.0 μm.

Next, using the substrate with the first electrodes, the auxiliary electrodes, the electrical insulation layer formed thereon, an organic EL display device was manufactured. As a pre-process, a nitrogen plasma treatment was performed, followed by formation of an organic EL layer 38 that included a light-emitting layer by a vacuum deposition method (FIG. 3(3)). Incidentally, the degree of vacuum at the time of vapor deposition was $1\times10^{-3}$ Pa or less, and the substrate was rotated relative to a vapor deposition source during the vapor deposition. First, a compound (HT-1) was vapor deposited to 10 nm as a positive hole injection layer, and a compound (HT-2) was vapor deposited to 50 nm as a positive hole transportation layer. Next, on the light-emitting layer, a compound (GH-1) as a host material and a compound (GD-1) as a dopant material were vapor deposited to a thickness of 40 nm so that the dope concentration was 10%. After that, as electron transporting materials, a compound (ET-1) and a compound (LiQ) were stacked, with a volume ratio of 1:1, to a thickness of 40 nm. The structures of the compounds used for the organic EL layer are indicated below.

[CHEM. 25]

HT-1

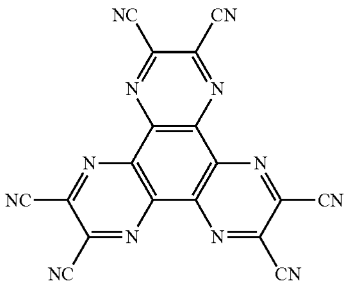

HT-2

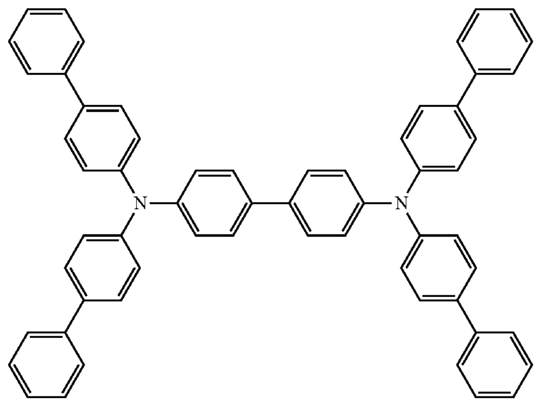

GD-1

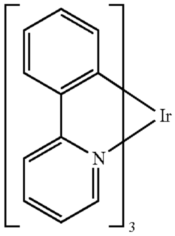

GH-1

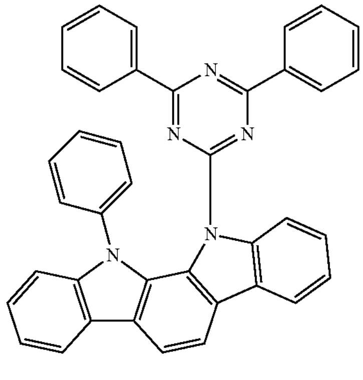

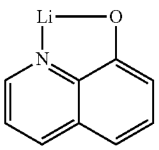

LiQ

-continued

ET-1

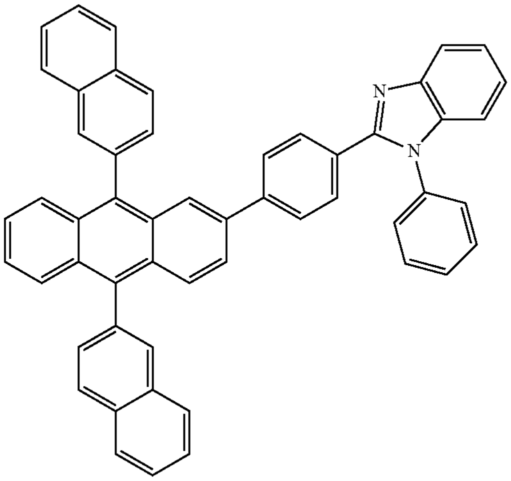

Next, a compound (LiQ) was vapor deposited to a 2 nm and then MgAg was vapor deposited, with a volume ratio of 10:1, to 100 nm to make second electrodes 39. A reflector electrode was thus formed (FIG. 3(4)). After that, in a low-humidity nitrogen atmosphere, a cap-shaped glass sheet was adhered to achieve sealing by using an epoxy resin based adhesion agent. Thus, four bottom emission type organic EL display devices of 5 mm squares were manufactured on one substrate. Incidentally, the film thicknesses mentioned herein are crystal oscillation type film thickness monitor-displayed values.

(Light Emission Characteristics Evaluation)

Organic EL display devices manufactured by the foregoing method were caused to emit light by direct-current drive at 10 $mA/cm^2$ to observe for non-light-emitting regions and luminance unevenness. Organic EL display devices manufactured were kept at 80° C. for 500 hours as a durability test. After the durability test, the organic EL display devices were caused to emit light by direct-current drive at 10 $mA/cm^2$ to observe for change in light emission characteristics.

Example 1 (Example not Using Pigment Dispersion Liquid)

Under a yellow lamp, 0.087 g of OXE02 was weighed, 12.631 g of MBA was added, and dissolution was carried out by stirring. Next, 5.825 g of a 30 mass % MBA solution of the polyimide precursor (PIP-1) obtained in Synthesis Example 7, 0.801 g of an 80 mass % MBA solution of DPPA, and 0.655 g of an 80 mass % MBA solution of PETA were added, and stirring was performed to produce a homogeneous solution. After that, the obtained solution was filtered with a 00.45 μm filter. Thus, a composition 1 was prepared.

The prepared composition 1 was applied onto an ITO/Ag substrate by spin coating at an arbitrary rotation speed, using a spin coater (MS-A100, made by Mikasa Co., Ltd.). Then, the composition 1 was prebaked at 110° C. for 120 seconds by using a hot plate (SCW-636, made by DAINIPPON SCREEN MFG. CO., LTD.) to manufacture a prebaked film having a film thickness of about 1.8 μm.

The manufactured prebaked film was subjected to patterning exposure to an i ray (365 nm wavelength), an h ray (405 nm wavelength), and a g ray (436 nm wavelength) of a super high pressure mercury lamp, by using a both-surface alignment one-side surface exposure apparatus (Mask Aligner PEM-6M, made by Union Optical Co., Ltd.), via a gray scale mask for sensitivity measurement (MDRM MODEL 4000-5-FS, made by Opto-Line International). After the exposure, a 2.38 mass % TMAH aqueous solution was applied to the prebaked film for 10 seconds and then the film was puddle developed for 50 seconds and rinsed with water for 30 seconds by using a small-size development device for photolithography (AD-2000, made by TAKIZAWA CO. LTD.).

After the development, the developed film was thermoset at 250° C. by a High-Temperature Inert Gas Oven (INH-9CD-S, made by Koyo Thermo Systems Co., Ltd.) to create a cured film having a film thickness of about 1.2 μm. As for the thermosetting conditions, the thermosetting was performed at 250° C. for 60 minutes in a nitrogen atmosphere.

Example 2 (Example Using Pigment Dispersion Liquid)

Under a yellow lamp, 0.158 g of OXE02 was weighed, 6.686 g of MBA was added, and dissolution was carried out by stirring. Next, 1.975 g of a 30 mass % MBA solution of the polyimide precursor (PIP-1) obtained in Synthesis Example 7, 0.484 g of an 80 mass % MBA solution of DPPE, and 0.396 g of an 80 mass % MBA solution of PETA were added and stirring was performed to obtain a preparation liquid as a homogeneous solution. Next, 7.725 g of the pigment dispersion liquid (Bk-1) obtained in Preparation Example 1 was weighed. To this, 7.275 g of the preparation liquid obtained as described above was added, and stirring was performed to produce a homogeneous solution. After that, the obtained solution was filtered with a 00.45 μm filter. Thus, a composition 2 was prepared.

The prepared composition 2 was applied onto an ITO/Ag substrate by spin coating at an arbitrary rotation speed, using a spin coater (MS-A100, made by Mikasa Co., Ltd.). Then, the composition 2 was prebaked at 110° C. for 120 seconds by using a hot plate (SCW-636, made by DAINIPPON SCREEN MFG. CO., LTD.) to manufacture a prebaked film having a film thickness of about 1.8 μm.

The prepared prebaked film was subjected to spray development with a 2.38 mass % TMAH aqueous solution by using a small-size development device for photolithography (AD-2000, made by TAKIZAWA CO., LTD.). The amount of time for complete dissolution of the prebaked film (unexposed portion) (breaking point, hereinafter "B. P.") was measured.

A prebaked film was prepared in substantially the same manner as described above. The prepared prebaked film was subjected to patterning exposure to an i ray (365 nm wavelength), an h ray (405 nm wavelength), and a g ray (436 nm wavelength) of a super high pressure mercury lamp, by using a both-surface alignment one-side surface exposure apparatus (Mask Aligner PEM-6M, made by Union Optical Co., Ltd.), via a gray scale mask for sensitivity measurement (MDRM MODEL 4000-5-FS, made by Opto-Line International). After the exposure, the film was subjected to development with a 2.38 mass % TMAH aqueous solution and rinsed with water for 30 seconds by using a small-size development device for photolithography (AD-2000, made by TAKIZAWA CO., LTD.). The development time was set to 1.5 times the B.P.

After the development, the film was thermoset at 250° C. by a High-Temperature Inert Gas Oven (INH-9CD-S, made by Koyo Thermo Systems Co., Ltd.) to create a cured film having a film thickness of about 1.2 μm. As for the thermosetting conditions, the thermosetting was performed at 250° C. for 60 minutes in a nitrogen atmosphere.

Examples 3 to 40 and Comparative Examples 1 to 7

In substantially the same manner as in Example 2, compositions 3 to 47 were prepared so as to have compositions mentioned in Table 3-1, Table 4-1, Table 5-1, Table 6-1, Table 7-1, Table 8-1, Table 9-1, and Table 10-1. Using the obtained compositions, films of the compositions were formed on substrates, and evaluated for photosensitivity property and properties of the cured films, in substantially the same manner as in Examples 1 and 2. Evaluation results thereof are collectively indicated in Table 3-2, Table 4-2, Table 5-2, Table 6-2, Table 7-2, Table 8-2, Table 9-2, and Table 10-2. Incidentally, to facilitate understanding, Table 5-1 and Table 5-2 remention the composition of Example 4 and the evaluations of the photosensitivity property and the characteristics of the cured film thereof. Furthermore, to facilitate understanding, Table 8-1 and Table 8-2 remention the compositions of Examples 20 and 30 and the evaluations of the photosensitivity properties and the characteristics of the cured films thereof.

TABLE 3-1

| | | Composition [mass part] | | | | | |
|---|---|---|---|---|---|---|---|
| | | | | (A) Alkali soluble resin | (B) Radical polymerizable compound | | |
| | Composition | Pigment dispersion liquid | (A) Alkali soluble resin originating from pigment dispersion liquid | originating from preparation liquid added to pigment dispersion liquid | Compound having 5 ethylenic unsaturated bond groups in (B-1) molecule | Compound having 6 to 10 ethylenic unsaturated bond groups in (B-2) molecule | (B) Radical polymerizable compound excluding (B-1) and (B-2) |
| Example 1 | 1 | — | — | PIP-1 (60.0) | DPPA (22) | — | PETA (18) |
| Example 2 | 2 | Bk-1 | PI-1 (26.3) | PIP-1 (33.7) | DPPE (22) | — | PETA (18) |
| Example 3 | 3 | Bk-1 | PI-1 (26.3) | PIP-1 (33.7) | TriPPA (22) | — | PETA (18) |
| Example 4 | 4 | Bk-1 | PI-1 (26.3) | PIP-1 (33.7) | DPPA (22) | — | PETA (18) |
| Example 5 | 5 | Bk-1 | PI-1 (26.3) | PIP-1 (33.7) | DPPA (30) | — | PETA (10) |
| Example 6 | 6 | Bk-1 | PI-1 (26.3) | PIP-1 (33.7) | DPPA (36) | — | PETA (4) |
| Example 7 | 7 | Bk-1 | PI-1 (26.3) | PIP-1 (33.7) | DPPA (39.6) | — | PETA (0.4) |

TABLE 3-1-continued

| | Composition [mass part] | | | | Content ratio of compound having 5 ethylenic unsaturated bond groups in (B-1) molecule in total of (B) radical polymerizable compound [mass %] | Content ratio of compound having 6 to 10 ethylenic unsaturated bond groups in (B-2) molecule in total of (B) radical polymerizable compound [mass %] | Content ratio of total of (A-1) to (A-6) resins in total of (A) alkali soluble resin [mass %] |
|---|---|---|---|---|---|---|---|
| | (C) Photo initiator | (D) Coloring agent originating from pigment dispersion liquid | (E) Dispersant originating from pigment dispersion liquid | Solvent | | | |
| Example 1 | OXE02 (3) | — | — | MBA | 55 | 0 | 100 |
| Example 2 | OXE02 (9) | Bk-S0100CF (52.7) | S-20000 (8.8) | MBA | 55 | 0 | 100 |
| Example 3 | OXE02 (9) | Bk-S0100CF (52.7) | S-20000 (8.8) | MBA | 55 | 0 | 100 |
| Example 4 | OXE02 (9) | Bk-S0100CF (52.7) | S-20000 (8.8) | MBA | 55 | 0 | 100 |
| Example 5 | OXE02 (9) | Bk-S0100CF (52.7) | S-20000 (8.8) | MBA | 75 | 0 | 100 |
| Example 6 | OXE02 (9) | Bk-S0100CF (52.7) | S-20000 (8.8) | MBA | 90 | 0 | 100 |
| Example 7 | OXE02 (9) | Bk-S0100CF (52.7) | S-20000 (8.8) | MBA | 99 | 0 | 100 |

TABLE 3-2

| | | Photosensitivity property and characteristics of cured film | | | | | |
|---|---|---|---|---|---|---|---|
| | | | Pattern section surface | Heat resistance high-temperature weight residue | Light blocking | Light emission characteristic of organic EL display device | |
| | Composition | Sensitivity [mJ/cm$^2$] | configuration [°] | ratio difference [mass %] | property OD value | Initial characteristics | Post-durability test characteristics |
| Example 1 | 1 | 30 A+ | 56 B | 7.1 A | 0.1 | Good | Good |
| Example 2 | 2 | 60 B | 27 A+ | 14.8 A | 1.5 | Good | Good |
| Example 3 | 3 | 60 B | 28 A+ | 14.4 A | 1.5 | Good | Good |
| Example 4 | 4 | 55 B | 28 A+ | 14.2 A | 1.5 | Good | Good |
| Example 5 | 5 | 55 B | 29 A+ | 13.9 A | 1.5 | Good | Good |
| Example 6 | 6 | 50 B | 30 A+ | 13.7 A | 1.5 | Good | Good |
| Example 7 | 7 | 50 B | 51 B | 13.6 A | 1.5 | Good | Good |

TABLE 4-1

| | | Composition [mass part] | | | | | |
|---|---|---|---|---|---|---|---|
| | | | | (A) Alkali soluble resin | (B) Radical polymerizable compound | | |
| | Composition | Pigment dispersion liquid | (A) Alkali soluble resin originating from pigment dispersion liquid | originating from preparation liquid added to pigment dispersion liquid | Compound having 5 ethylenic unsaturated bond groups in (B-1) molecule | Compound having 6 to 10 ethylenic unsaturated bond groups in (B-2) molecule | (B) Radical polymerizable compound excluding (B-1) and (B-2) |
| Example 8 | 8 | Bk-1 | PI-1 (26.3) | PIP-1 (33.7) | DPPA (22) | DPHE (18) | — |
| Example 9 | 9 | Bk-1 | PI-1 (26.3) | PIP-1 (33.7) | DPPA (22) | TriPHxA (18) | — |
| Example 10 | 10 | Bk-1 | PI-1 (26.3) | PIP-1 (33.7) | DPPA (22) | TriPHpA (18) | — |

TABLE 4-1-continued

| | | | | | | | |
|---|---|---|---|---|---|---|---|
| Example 11 | 11 | Bk-1 | PI-1 (26.3) | PIP-1 (33.7) | DPPA (22) | TriPOA (18) | — |
| Example 12 | 12 | Bk-1 | PI-1 (26.3) | PIP-1 (33.7) | DPPA (22) | TetraPNA (18) | — |
| Example 13 | 13 | Bk-1 | PI-1 (26.3) | PIP-1 (33.7) | DPPA (22) | TetraPDA (18) | — |

| | Composition [mass part] | | | | Content ratio of compound having 5 ethylenic unsaturated bond groups in (B-1) molecule in total of (B) radical polymerizable compound [mass %] | Content ratio of compound having 6 to 10 ethylenic unsaturated bond groups in (B-2) molecule in total of (B) radical polymerizable compound [mass %] | Content ratio of total of (A-1) to (A-6) resins in total of (A) alkali soluble resin [mass %] |
|---|---|---|---|---|---|---|---|
| | (C) Photo initiator | (D) Coloring agent originating from pigment dispersion liquid | (E) Dispersant originating from pigment dispersion liquid | Solvent | | | |
| Example 8 | OXE02 (9) | Bk-S0100CF (52.7) | S-20000 (8.8) | MBA | 55 | 45 | 100 |
| Example 9 | OXE02 (9) | Bk-S0100CF (52.7) | S-20000 (8.8) | MBA | 55 | 45 | 100 |
| Example 10 | OXE02 (9) | Bk-S0100CF (52.7) | S-20000 (8.8) | MBA | 55 | 45 | 100 |
| Example 11 | OXE02 (9) | Bk-S0100CF (52.7) | S-20000 (8.8) | MBA | 55 | 45 | 100 |
| Example 12 | OXE02 (9) | Bk-S0100CF (52.7) | S-20000 (8.8) | MBA | 55 | 45 | 100 |
| Example 13 | OXE02 (9) | Bk-S0100CF (52.7) | S-20000 (8.8) | MBA | 55 | 45 | 100 |

TABLE 4-2

| | | Photosensitivity property and characteristics of cured film | | | | Light emission characteristic of organic EL display device | |
|---|---|---|---|---|---|---|---|
| | Composition | Sensitivity [mJ/cm$^2$] | Pattern section surface configuration [°] | Heat resistance high-temperature weight residue ratio difference [mass %] | Light blocking property OD value | Initial characteristics | Post-durability test characteristics |
| Example 8 | 8 | 50 B | 47 B | 13.3 A | 1.5 | Good | Good |
| Example 9 | 9 | 45 A | 48 B | 12.9 A | 1.5 | Good | Good |
| Example 10 | 10 | 45 A | 49 B | 12.8 A | 1.5 | Good | Good |
| Example 11 | 11 | 40 A | 51 B | 12.7 A | 1.5 | Good | Good |
| Example 12 | 12 | 45 A | 52 B | 13.0 A | 1.5 | Good | Good |
| Example 13 | 13 | 45 A | 53 B | 12.8 A | 1.5 | Good | Good |

TABLE 5-1

| | | Composition [mass part] | | | | | |
|---|---|---|---|---|---|---|---|
| | | | | (A) Alkali soluble resin | (B) Radical polymerizable compound | | |
| | Composition | Pigment dispersion liquid | (A) Alkali soluble resin originating from pigment dispersion liquid | originating from preparation liquid added to pigment dispersion liquid | Compound having 5 ethylenic unsaturated bond groups in (B-1) molecule | Compound having 6 to 10 ethylenic unsaturated bond groups in (B-2) molecule | (B) Radical polymerizable compound excluding (B-1) and (B-2) |
| Example 4 | 4 | Bk-1 | PI-1 (26.3) | PIP-1 (33.7) | DPPA (22) | — | PETA (18) |

TABLE 5-1-continued

| | | | | | | | |
|---|---|---|---|---|---|---|---|
| Example 14 | 14 | Bk-1 | PI-1 (26.3) | PIP-1 (33.7) | DPPA (22) | DPHA (18) | — |
| Example 15 | 15 | Bk-1 | PI-1 (26.3) | PIP-1 (33.7) | DPPA (26) | DPHA (14) | — |
| Example 16 | 16 | Bk-1 | PI-1 (26.3) | PIP-1 (33.7) | DPPA (30) | DPHA (10) | — |
| Example 17 | 17 | Bk-1 | PI-1 (26.3) | PIP-1 (33.7) | DPPA (34) | DPHA (6) | — |
| Example 18 | 18 | Bk-1 | PI-1 (26.3) | PIP-1 (33.7) | DPPA (36) | DPHA (4) | — |
| Example 19 | 19 | Bk-1 | PI-1 (26.3) | PIP-1 (33.7) | DPPA (36.4) | DPHA (3.6) | — |

| | Composition [mass part] | | | | Content ratio of compound having 5 ethylenic unsaturated bond groups in (B-1) molecule in total of (B) radical polymerizable compound [mass %] | Content ratio of compound having 6 to 10 ethylenic unsaturated bond groups in (B-2) molecule in total of (B) radical polymerizable compound [mass %] | Content ratio of total of (A-1) to (A-6) resins in total of (A) alkali soluble resin [mass %] |
|---|---|---|---|---|---|---|---|
| | (C) Photo initiator | (D) Coloring agent originating from pigment dispersion liquid | (E) Dispersant originating from pigment dispersion liquid | Solvent | | | |
| Example 4 | OXE02 (9) | Bk-S0100CF (52.7) | S-20000 (8.8) | MBA | 55 | 0 | 100 |
| Example 14 | OXE02 (9) | Bk-S0100CF (52.7) | S-20000 (8.8) | MBA | 55 | 45 | 100 |
| Example 15 | OXE02 (9) | Bk-S0100CF (52.7) | S-20000 (8.8) | MBA | 65 | 35 | 100 |
| Example 16 | OXE02 (9) | Bk-S0100CF (52.7) | S-20000 (8.8) | MBA | 75 | 25 | 100 |
| Example 17 | OXE02 (9) | Bk-S0100CF (52.7) | S-20000 (8.8) | MBA | 85 | 15 | 100 |
| Example 18 | OXE02 (9) | Bk-S0100CF (52.7) | S-20000 (8.8) | MBA | 90 | 10 | 100 |
| Example 19 | OXE02 (9) | Bk-S0100CF (52.7) | S-20000 (8.8) | MBA | 91 | 9 | 100 |

TABLE 5-2

| | | Photosensitivity property and characteristics of cured film | | | | | |
|---|---|---|---|---|---|---|---|
| | | | Pattern section surface | Heat resistance high-temperature weight residue | Light blocking | Light emission characteristic of organic EL display device | |
| | Composition | Sensitivity [$mJ/cm^2$] | configuration [°] | ratio difference [mass %] | property OD value | Initial characteristics | Post-durability test characteristics |
| Example 4 | 4 | 55 B | 28 A+ | 14.2 A | 1.5 | Good | Good |
| Example 14 | 14 | 35 A | 49 B | 12.6 A | 1.5 | Good | Good |
| Example 15 | 15 | 35 A | 43 A | 12.8 A | 1.5 | Good | Good |
| Example 16 | 16 | 35 A | 38 A | 13.0 A | 1.5 | Good | Good |
| Example 17 | 17 | 40 A | 33 A | 13.1 A | 1.5 | Good | Good |
| Example 18 | 18 | 40 A | 31 A | 13.2 A | 1.5 | Good | Good |
| Example 19 | 19 | 40 A | 30 A+ | 13.2 A | 1.5 | Good | Good |

TABLE 6-1

| | Composition | Pigment dispersion liquid | Composition [mass part]<br>(A) Alkali soluble resin originating from pigment dispersion liquid | (A) Alkali soluble resin originating from preparation liquid added to pigment dispersion liquid | (B) Radical polymerizable compound<br>Compound having 5 ethylenic unsaturated bond groups in (B-1) molecule | Compound having 6 to 10 ethylenic unsaturated bond groups in (B-2) molecule | (B) Radical polymerizable compound excluding (B-1) and (B-2) |
|---|---|---|---|---|---|---|---|
| Example 20 | 20 | Bk-1 | PI-1<br>(26.3) | PIP-1<br>(33.7) | DPPA<br>(37.2) | DPHA<br>(2.8) | — |
| Example 21 | 21 | Bk-1 | PI-1<br>(26.3) | PIP-1<br>(33.7) | DPPA<br>(38) | DPHA<br>(2) | — |
| Example 22 | 22 | Bk-1 | PI-1<br>(26.3) | PIP-1<br>(33.7) | DPPA<br>(38.8) | DPHA<br>(1.2) | — |
| Example 23 | 23 | Bk-1 | PI-1<br>(26.3) | PIP-1<br>(33.7) | DPPA<br>(39.6) | DPHA<br>(0.4) | — |
| Example 24 | 24 | Bk-1 | PI-1<br>(26.3) | PI-1<br>(33.7) | DPPA<br>(37.2) | DPHA<br>(2.8) | — |
| Example 25 | 25 | Bk-1 | PI-1<br>(26.3) | PI-2<br>(33.7) | DPPA<br>(37.2) | DPHA<br>(2.8) | — |
| Example 26 | 26 | Bk-1 | PI-1<br>(26.3) | PI-3<br>(33.7) | DPPA<br>(37.2) | DPHA<br>(2.8) | — |
| Example 27 | 27 | Bk-1 | PI-1<br>(26.3) | PI-4<br>(33.7) | DPPA<br>(37.2) | DPHA<br>(2.8) | — |

| | Composition [mass part]<br>(C) Photo initiator | (D) Coloring agent originating from pigment dispersion liquid | (E) Dispersant originating from pigment dispersion liquid | Solvent | Content ratio of compound having 5 ethylenic unsaturated bond groups in (B-1) molecule in total of (B) radical polymerizable compound [mass %] | Content ratio of compound having 6 to 10 ethylenic unsaturated bond groups in (B-2) molecule in total of (B) radical polymerizable compound [mass %] | Content ratio of total of (A-1) to (A-6) resins in total of (A) alkali soluble resin [mass %] |
|---|---|---|---|---|---|---|---|
| Example 20 | OXE02<br>(9) | Bk-S0100CF<br>(52.7) | S-20000<br>(8.8) | MBA | 93 | 7 | 100 |
| Example 21 | OXE02<br>(9) | Bk-S0100CF<br>(52.7) | S-20000<br>(8.8) | MBA | 95 | 5 | 100 |
| Example 22 | OXE02<br>(9) | Bk-S0100CF<br>(52.7) | S-20000<br>(8.8) | MBA | 97 | 3 | 100 |
| Example 23 | OXE02<br>(9) | Bk-S0100CF<br>(52.7) | S-20000<br>(8.8) | MBA | 99 | 1 | 100 |
| Example 24 | OXE02<br>(9) | Bk-S0100CF<br>(52.7) | S-20000<br>(8.8) | MBA | 93 | 7 | 100 |
| Example 25 | OXE02<br>(9) | Bk-S0100CF<br>(52.7) | S-20000<br>(8.8) | MBA | 93 | 7 | 100 |
| Example 26 | OXE02<br>(9) | Bk-S0100CF<br>(52.7) | S-20000<br>(8.8) | MBA | 93 | 7 | 100 |
| Example 27 | OXE02<br>(9) | Bk-S0100CF<br>(52.7) | S-20000<br>(8.8) | MBA | 93 | 7 | 100 |

TABLE 6-2

| | Composition | Photosensitivity property and characteristics of cured film<br>Sensitivity [mJ/cm$^2$] | Pattern section surface configuration [°] | Heat resistance high-temperature weight residue ratio difference [mass %] | Light blocking property OD value | Light emission characteristic of organic EL display device<br>Initial characteristics | Post-durability test characteristics |
|---|---|---|---|---|---|---|---|
| Example 20 | 20 | 40<br>A | 29<br>A+ | 13.2<br>A | 1.5 | Good | Good |
| Example 21 | 21 | 40<br>A | 33<br>A | 13.3<br>A | 1.5 | Good | Good |

TABLE 6-2-continued

| | Composition | Photosensitivity property and characteristics of cured film: Sensitivity [mJ/cm$^2$] | Pattern section surface configuration [°] | Heat resistance high-temperature weight residue ratio difference [mass %] | Light blocking property OD value | Light emission characteristic of organic EL display device: Initial characteristics | Post-durability test characteristics |
|---|---|---|---|---|---|---|---|
| Example 22 | 22 | 40<br>A | 40<br>A | 13.3<br>A | 1.5 | Good | Good |
| Example 23 | 23 | 40<br>A | 52<br>B | 13.4<br>A | 1.5 | Good | Good |
| Example 24 | 24 | 50<br>B | 34<br>A | 11.7<br>A | 1.5 | Good | Good |
| Example 25 | 25 | 45<br>A | 32<br>A | 11.8<br>A | 1.5 | Good | Good |
| Example 26 | 26 | 45<br>A | 32<br>A | 12.0<br>A | 1.5 | Good | Good |
| Example 27 | 27 | 40<br>A | 31<br>A | 12.1<br>A | 1.5 | Good | Good |

TABLE 7-1

| | Composition | Composition [mass part]: Pigment dispersion liquid | (A) Alkali soluble resin originating from pigment dispersion liquid | (A) Alkali soluble resin: originating from preparation liquid added to pigment dispersion liquid | (B) Radical polymerizable compound: Compound having 5 ethylenic unsaturated bond groups in (B-1) molecule | Compound having 6 to 10 ethylenic unsaturated bond groups in (B-2) molecule | (B) Radical polymerizable compound excluding (B-1) and (B-2) |
|---|---|---|---|---|---|---|---|
| Example 28 | 28 | Bk-2 | PBO-1<br>(26.3) | PBO-1<br>(33.7) | DPPA<br>(37.2) | DPHA<br>(2.8) | — |
| Example 29 | 29 | Bk-2 | PBO-1<br>(26.3) | PBO-2<br>(33.7) | DPPA<br>(37.2) | DPHA<br>(2.8) | — |
| Example 30 | 30 | Bk-3 | PIP-1<br>(19.2) | PIP-1<br>(40.8) | DPPA<br>(37.2) | DPHA<br>(2.8) | — |
| Example 31 | 31 | Bk-3 | PIP-1<br>(19.2) | PIP-2<br>(40.8) | DPPA<br>(37.2) | DPHA<br>(2.8) | — |
| Example 32 | 32 | Bk-3 | PIP-1<br>(19.2) | PIP-3<br>(40.8) | DPPA<br>(37.2) | DPHA<br>(2.8) | — |
| Example 33 | 33 | Bk-3 | PIP-1<br>(19.2) | PIP-4<br>(40.8) | DPPA<br>(37.2) | DPHA<br>(2.8) | — |
| Example 34 | 34 | Bk-4 | PBOP-1<br>(19.2) | PBOP-1<br>(40.8) | DPPA<br>(37.2) | DPHA<br>(2.8) | — |
| Example 35 | 35 | Bk-4 | PBOP-1<br>(19.2) | PBOP-2<br>(40.8) | DPPA<br>(37.2) | DPHA<br>(2.8) | — |

| | Composition [mass part]: (C) Photo initiator | (D) Coloring agent originating from pigment dispersion liquid | (E) Dispersant originating from pigment dispersion liquid | Solvent | Content ratio of compound having 5 ethylenic unsaturated bond groups in (B-1) molecule in total of (B) radical polymerizable compound [mass %] | Content ratio of compound having 6 to 10 ethylenic unsaturated bond groups in (B-2) molecule in total of (B) radical polymerizable compound [mass %] | Content ratio of total of (A-1) to (A-6) resins in total of (A) alkali soluble resin [mass %] |
|---|---|---|---|---|---|---|---|
| Example 28 | OXE02<br>(9) | Bk-S0100CF<br>(52.7) | S-20000<br>(8.8) | MBA | 93 | 7 | 100 |
| Example 29 | OXE02<br>(9) | Bk-S0100CF<br>(52.7) | S-20000<br>(8.8) | MBA | 93 | 7 | 100 |
| Example 30 | OXE02<br>(9) | Bk-S0100CF<br>(57.5) | S-20000<br>(19.2) | MBA | 93 | 7 | 100 |
| Example 31 | OXE02<br>(9) | Bk-S0100CF<br>(57.5) | S-20000<br>(19.2) | MBA | 93 | 7 | 100 |
| Example 32 | OXE02<br>(9) | Bk-S0100CF<br>(57.5) | S-20000<br>(19-2) | MBA | 93 | 7 | 100 |

TABLE 7-1-continued

| | | | | | | | |
|---|---|---|---|---|---|---|---|
| Example 33 | OXE02 (9) | Bk-S0100CF (57.5) | S-20000 (19.2) | MBA | 93 | 7 | 100 |
| Example 34 | OXE02 (9) | Bk-S0100CF (57.5) | S-20000 (19.2) | MBA | 93 | 7 | 100 |
| Example 35 | OXE02 (9) | Bk-S0100CF (57.5) | S-20000 (19.2) | MBA | 93 | 7 | 100 |

TABLE 7-2

| | | Photosensitivity property and characteristics of cured film | | | | | |
|---|---|---|---|---|---|---|---|
| | | | Pattern section surface | Heat resistance high-temperature weight residue | Light blocking | Light emission characteristic of organic EL display device | |
| | Composition | Sensitivity [mJ/cm$^2$] | configuration [°] | ratio difference [mass %] | property OD value | Initial characteristics | Post-durability test characteristics |
| Example 28 | 28 | 45<br>A | 33<br>A | 12.0<br>A | 1.5 | Good | Good |
| Example 29 | 29 | 40<br>A | 31<br>A | 12.3<br>A | 1.5 | Good | Good |
| Example 30 | 30 | 45<br>A | 30<br>A+ | 13.6<br>A | 1.5 | Good | Good |
| Example 31 | 31 | 40<br>A | 29<br>A+ | 13.7<br>A | 1.5 | Good | Good |
| Example 32 | 32 | 40<br>A | 29<br>A+ | 13.9<br>A | 1.5 | Good | Good |
| Example 33 | 33 | 35<br>A | 28<br>A+ | 14.0<br>A | 1.5 | Good | Good |
| Example 34 | 34 | 40<br>A | 29<br>A+ | 14.2<br>A | 1.5 | Good | Good |
| Example 35 | 35 | 35<br>A | 28<br>A+ | 14.4<br>A | 1.5 | Good | Good |

TABLE 8-1

| | | Composition [mass part] | | | | | |
|---|---|---|---|---|---|---|---|
| | | | | (A) Alkali soluble resin | (B) Radical polymerizable compound | | |
| | Composition | Pigment dispersion liquid | (A) Alkali soluble resin originating from pigment dispersion liquid | originating from preparation liquid added to pigment dispersion liquid | Compound having 5 ethylenic unsaturated bond groups in (B-1) molecule | Compound having 6 to 10 ethylenic unsaturated bond groups in (B-2) molecule | (B) Radical polymerizable compound excluding (B-1) and (B-2) |
| Example 36 | 36 | Bk-5 | PS-1<br>(19.2) | PS-1<br>(40.8) | DPPA<br>(37.2) | DPHA<br>(2.8) | — |
| Example 37 | 37 | Bk-6 | CD-1<br>(19-2) | CD-1<br>(40.8) | DPPA<br>(37.2) | DPHA<br>(2.8) | — |
| Example 38 | 38 | Bk-7 | AC-1<br>(19.2) | PIP-1<br>(40.8) | DPPA<br>(37.2) | DPHA<br>(2.8) | — |
| Example 20 | 20 | Bk-1 | PI-1<br>(26.3) | PIP-1<br>(33.7) | DPPA<br>(37.2) | DPHA<br>(2.8) | — |
| Example 30 | 30 | Bk-3 | PIP-1<br>(19.2) | PIP-1<br>(40.8) | DPPA<br>(37.2) | DPHA<br>(2.8) | — |
| Example 39 | 39 | Bk-8 | PI-1<br>(19.2) | PIP-1<br>(40.8) | DPPA<br>(37.2) | DPHA<br>(2.8) | — |
| Example 40 | 40 | Bk-9 | PI-1<br>(19.2) | PIP-1<br>(40.8) | DPPA<br>(37.2) | DPHA<br>(2.8) | — |

TABLE 8-1-continued

| | Composition [mass part] | | | | Content ratio of compound having 5 ethylenic unsaturated bond groups in (B-1) molecule in total of (B) radical polymerizable compound [mass %] | Content ratio of compound having 6 to 10 ethylenic unsaturated bond groups in (B-2) molecule in total of (B) radical p polymerizable compound [mass %] | Content ratio of total of (A-1) to (A-6) resins in total of (A) alkali soluble resin [mass %] |
|---|---|---|---|---|---|---|---|
| | (C) Photo initiator | (D) Coloring agent originating from pigment dispersion liquid | (E) Dispersant originating from pigment dispersion liquid | Solvent | | | |
| Example 36 | OXE02 (9) | Bk-S0100CF (57.5) | S-20000 (19.2) | MBA | 93 | 7 | 100 |
| Example 37 | OXE02 (9) | Bk-S0100CF (57.5) | S-20000 (19.2) | MBA | 93 | 7 | 100 |
| Example 38 | OXE02 (9) | Bk-S0100CF (57.5) | S-20000 (19.2) | MBA | 93 | 7 | 68 |
| Example 20 | OXE02 (9) | Bk-S0100CF (52.7) | S-20000 (8.8) | MBA | 93 | 7 | 100 |
| Example 30 | OXE02 (9) | Bk-S0100CF (57.5) | S-20000 (19.2) | MBA | 93 | 7 | 100 |
| Example 39 | OXE02 (9) | Bk-S0084 (57.5) | D.BYK-167 (19.2) | MBA | 93 | 7 | 100 |
| Example 40 | OXE02 (9) | P.R.254 (20.1) P.Y.139 (8.6) P.B.15:6 (28.8) | D.BYK-167 (19.2) | MBA | 93 | 7 | 100 |

TABLE 8-2

| | | Photosensitivity property and characteristics of cured film | | | | | |
|---|---|---|---|---|---|---|---|
| | Composition | Sensitivity [mJ/cm$^2$] | Pattern section surface configuration [°] | Heat resistance high-temperature weight residue ratio difference [mass %] | Light blocking property OD value | Light emission characteristic of organic EL display device: Initial characteristics | Post-durability test characteristics |
| Example 36 | 36 | 35 A | 28 A+ | 14.7 A | 1.5 | Good | Good |
| Example 37 | 37 | 35 A | 28 A+ | 16.9 B | 1.5 | Good | Good |
| Example 38 | 38 | 40 A | 30 A+ | 17.8 B | 1.5 | Good | Good |
| Example 20 | 20 | 40 A | 29 A+ | 13.2 A | 1.5 | Good | Good |
| Example 30 | 30 | 45 A | 30 A+ | 13.6 A | 1.5 | Good | Good |
| Example 39 | 39 | 50 B | 31 A | 14.3 A | 1.4 | Good | Good |
| Example 40 | 40 | 45 A | 30 A+ | 15.5 B | 1.0 | Good | Good |

TABLE 9-1

| | | Composition [mass part] | | | | | |
|---|---|---|---|---|---|---|---|
| | | | | (A) Alkali soluble resin | (B) Radical polymerizable compound | | |
| | Composition | Pigment dispersion liquid | (A) Alkali soluble resin originating from pigment dispersion liquid | originating from preparation liquid added to pigment dispersion liquid | Compound having 5 ethylenic unsaturated bond groups in (B-1) molecule | Compound having 6 to 10 ethylenic unsaturated bond groups in (B-2) molecule | (B) Radical polymerizable compound excluding (B-1) and (B-2) |
| Comparative Example 1 | 41 | Bk-1 | PI-1 (26.3) | PIP-1 (33.7) | DPPA (18) | — | PETA (22) |

TABLE 9-1-continued

| | | | | | | | |
|---|---|---|---|---|---|---|---|
| Comparative Example 2 | 42 | Bk-1 | PI-1 (26.3) | PIP-1 (33.7) | DPPA (20) | — | PETA (20) |
| Comparative Example 3 | 43 | Bk-1 | PI-1 (26.3) | PIP-1 (33.7) | DPPA (18) | DPHA (22) | — |
| Comparative Example 4 | 44 | Bk-1 | PI-1 (26.3) | PIP-1 (33.7) | DPPA (20) | DPHA (20) | — |
| Comparative Example 5 | 45 | Bk-1 | PI-1 (26.3) | PIP-1 (33.7) | DPPA (40) | — | — |
| Comparative Example 6 | 46 | Bk-7 | AC-1 (19.2) | AC-1 (40.8) | DPPA (36) | DPHA (4) | — |

| | Composition [mass part] | | | | Content ratio of compound having 5 ethylenic unsaturated bond groups in (B-1) molecule | Content ratio of compound having 6 to 10 ethylenic unsaturated bond groups in (B-2) molecule | Content ratio of total of (A-1) to |
|---|---|---|---|---|---|---|---|
| | (C) Photo initiator | (D) Coloring agent originating from pigment dispersion liquid | (E) Dispersant originating from pigment dispersion liquid | Solvent | in total of (B) radical polymerizable compound [mass %] | in total of (B) radical polymerizable compound [mass %] | (A-6) resins in total of (A) alkali soluble resin [mass %] |
| Comparative Example 1 | OXE02 (9) | Bk-S0100CF (52.7) | S-20000 (8.8) | MBA | 45 | 55 | 100 |
| Comparative Example 2 | OXE02 (9) | Bk-S0100CF (52.7) | S-20000 (8.8) | MBA | 50 | 50 | 100 |
| Comparative Example 3 | OXE02 (9) | Bk-S0100CF (52.7) | S-20000 (8.8) | MBA | 45 | 55 | 100 |
| Comparative Example 4 | OXE02 (9) | Bk-S0100CF (52.7) | S-20000 (8.8) | MBA | 50 | 50 | 100 |
| Comparative Example 5 | OXE02 (9) | Bk-S0100CF (52.7) | S-20000 (8.8) | MBA | 100 | 0 | 100 |
| Comparative Example 6 | OXE02 (9) | Bk-S0100CF (57.5) | S-20000 (19.2) | MBA | 90 | 10 | 0 |

TABLE 9-2

| | | Photosensitivity property and characteristics of cured film | | | | Light emission characteristic of organic EL display device | |
|---|---|---|---|---|---|---|---|
| | | | Pattern section surface | Heat resistance high-temperature weight residue | Light blocking | | |
| | Composition | Sensitivity [mJ/cm$^2$] | configuration [°] | ratio difference [mass %] | property OD value | Initial characteristics | Post-durability test characteristics |
| Comparative Example 1 | 41 | 65<br>C | 27<br>A+ | 15.1<br>B | 1.5 | Good | Good |
| Comparative Example 2 | 42 | 63<br>C | 27<br>A+ | 14.8<br>A | 1.5 | Good | Good |
| Comparative Example 3 | 43 | 30<br>A+ | 63<br>C | 12.4<br>A | 1.5 | Good | Good |
| Comparative Example 4 | 44 | 33<br>A | 61<br>C | 12.5<br>A | 1.5 | Good | Good |
| Comparative Example 5 | 45 | 45<br>A | 61<br>C | 13.5<br>A | 1.5 | Good | Good |
| Comparative Example 6 | 46 | 30<br>A+ | 28<br>A+ | 31.6<br>C | 1.5 | Good | Light emitting area reduced to 30% |

TABLE 10-1

| | Composition [mass part] | | | | | |
|---|---|---|---|---|---|---|
| | Composition | Pigment dispersion liquid | (A) Alkali soluble resin originating from pigment dispersion liquid | (A) Alkali soluble resin originating from preparation liquid added to pigment dispersion liquid | Compound having naphthoquinone diazido structure | Dissolution accelerating agent |
| Comparative Example 7 | 47 | Bk-1 | PI-1 (30) | PIP-1 (70) | QD-1 (20) | TrisP-PA (10) |

| | Composition [mass part] | | | Content ratio of compound having 5 ethylenic unsaturated bond groups in (B-1) molecule in total of (B) radical polymerizable compound [mass %] | Content ratio of compound having 6 to 10 ethylenic unsaturated bond groups in (B-2) molecule in total of (B) radical polymerizable compound [mass %] | Content ratio of total of (A-1) to (A-6) resins in total of (A) alkali soluble resin [mass %] |
|---|---|---|---|---|---|---|
| | (D) Coloring agent originating from pigment dispersion liquid | (E) Dispersant originating from pigment dispersion liquid | Solvent | | | |
| Comparative Example 7 | Bk-S0100CF (60) | S-20000 (10) | MBA | — | — | 100 |

TABLE 10-2

| | Photosensitivity property and characteristics of cured film | | | | | Light emission characteristic of organic EL display device | |
|---|---|---|---|---|---|---|---|
| | Composition | Sensitivity [mJ/cm$^2$] | Pattern section surface configuration [°] | Heat resistance high-temperature weight residue ratio difference [mass %] | Light blocking property OD value | Initial characteristics | Post-durability test characteristics |
| Comparative Example 7 | 47 | 700 F | 30 A+ | 5.0 A+ | 1.5 | Good | Good |

EXPLANATION OF NUMERALS

1: Glass substrate
2: TFT
3: Cured film for TFT planarization
4: Reflector electrode
**5*a***: Prebaked film
**5*b***: Cured pattern
6: Mask
7: Chemical active ray
8: EL light-emitting layer
9: Transparent electrode
10: Cured film for planarization
11: Cover glass
12: Glass substrate
13: BLU
14: Glass substrate having BLU
15: Glass substrate
16: TFT
17: Cured film for TFT planarization
18: Transparent electrode
19: Planarization film
20: Alignment layer
**21*a***: Prebaked film
**21*b***: Cured pattern
22: Mask
23: Chemical active ray
24: Glass substrate having BCS
25: Glass substrate having BLU and BCS
26: Glass substrate
27: Color filter
28: Cured pattern
29: Cured film for planarization
30: Alignment layer
31: Color filter substrate
32: Glass substrate having BLU, BCS, and BM
33: Liquid crystal layer
34: Non-alkali glass substrate
35: First electrode
36: Auxiliary electrode
37: Insulation layer
38: Organic EL layer
39: Second electrode

The invention claimed is:

1. A negative-type photosensitive resin composition comprising an (A) alkali-soluble resin, a (B) radical polymerizable compound, and a (C) photo initiator, wherein the (A) alkali-soluble resin contains one or more species of resins selected from a (A-1) polyimide, a (A-2) polybenzoxazole, a (A-3) polyimide precursor, a (A-4) polybenzoxazole precursor, a (A-5) polysiloxane, and a (A-6) cardo based resin, and wherein the (B) radical polymerizable compound contains a compound having five ethylenic unsaturated bond groups in a (B-1) molecule, in an amount within a range of 51 to 99 mass %.

2. The negative-type photosensitive resin composition according to claim 1, further comprising a (D) coloring agent, wherein the (D) coloring agent contains a (Da) black coloring agent.

3. The negative-type photosensitive resin composition according to claim 2, wherein the (Da) black coloring agent consists of one or more species selected from a (D1a-1) black organic pigment, a (D1a-2) black inorganic pigment, and a (D1a-3) mixture of two or more coloring pigments.

4. The negative-type photosensitive resin composition according to claim 3, wherein the (Da) black coloring agent contains the (D1a-1) black organic pigment, wherein the (D1a-1) black organic pigment is a (D1a-1a) benzofuranone based black pigment and/or a (D1a-1b) perylene based black pigment, wherein the (D1a-1a) benzofuranone based black pigment contains a benzofuranone compound represented by any one of general formulas (38) to (43), its geometrical isomer, its salt, or a salt of its geometrical isomer, and wherein the (D1a-1b) perylene based black pigment contains a perylene compound represented by any one of general formulas (44) to (46), its geometrical isomer, its salt, or a salt of its geometrical isomer, (38)

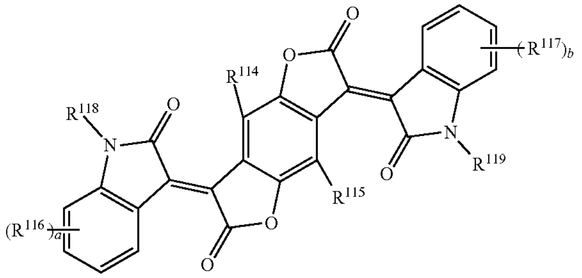

(39)

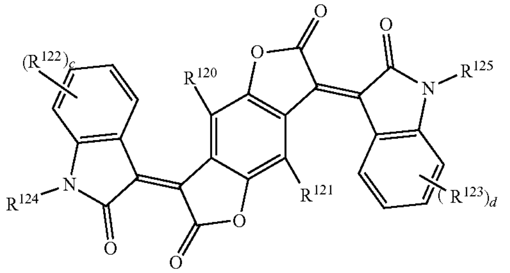

-continued (40)

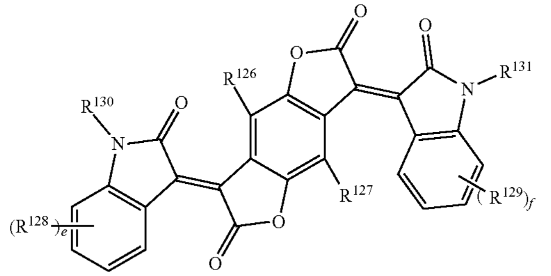

wherein in general formulas (38) to (40):

$R^{114}$, $R^{115}$, $R^{120}$, $R^{121}$, $R^{126}$ and $R^{127}$ each independently represent hydrogen, a halogen atom, an alkyl group having a carbon number of 1 to 10, or an alkyl group having a carbon number of 1 to 10 and having 1 to 20 fluorine atoms;

$R^{116}$, $R^{117}$, $R^{122}$, $R^{123}$, $R^{128}$ and $R^{129}$ each independently represent hydrogen, a halogen atom, $R^{251}$, COOH, $COOR^{251}$, $COO^-$, $CONH_2$, $CONHR^{251}$, $CONR^{251}R^{252}$, CN, OH, $OR^{251}$, $OCOR^{251}$, $OCONH_2$, $OCONHR^{251}$, $OCONR^{251}R^{252}$, $NO_2$, $NH_2$, $NHR^{251}$, $NR^{251}R^{252}$, $NHCOR^{251}$, $NR^{251}COR^{252}$, $N{=}CH_2$, $N{=}CHR^{251}$, $N{=}CR^{251}R^{252}$, SH, $SR^{251}$, $SOR^{251}$, $SO_2R^{251}$, $SO_3R^{251}$, $SO_3H$, $SO_3^-$, $SO_2NH_2$, $SO_2NHR^{251}$, or $SO_2NR^{251}R^{252}$, wherein $R^{251}$ and $R^{252}$ each independently represents an alkyl group having a carbon number of 1 to 10, a cycloalkyl group having a carbon number of 4 to 10, an alkenyl group having a carbon number of 2 to 10, a cycloalkenyl group having a carbon number of 4 to 10, or an alkynyl group having a carbon number of 2 to 10;

wherein a plurality of $R^{116}$, $R^{117}$, $R^{122}$, $R^{123}$, $R^{128}$ or $R^{129}$ optionally forms a ring by direct bonds or by an oxygen atom bridge, a sulfur atom bridge, a NH bridge, or a $NR^{251}$ bridge;

$R^{118}$, $R^{119}$, $R^{124}$, $R^{125}$, $R^{130}$ and $R^{131}$ each independently represents a hydrogen, an alkyl group having a carbon number of 1 to 10, or an aryl group having a carbon number of 6 to 15; and a, b, c, d, e and f each independently represents an integer of 0 to 4;

(41)

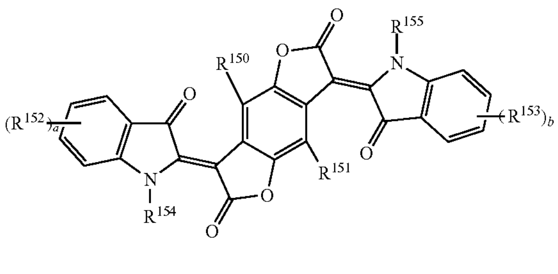

-continued (42)

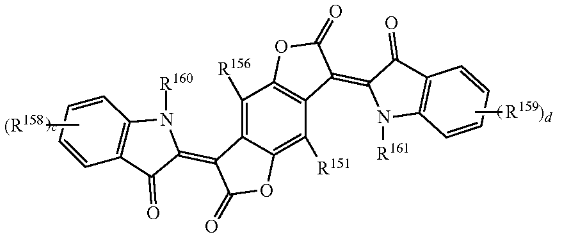

(43)

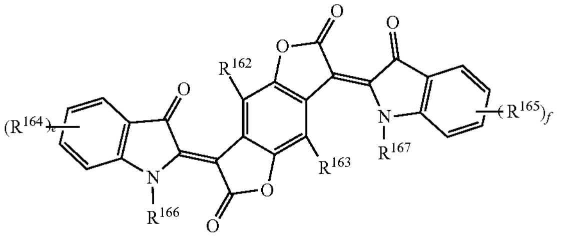

wherein in general formulas (41) to (43):

$R^{150}$, $R^{151}$, $R^{156}$, $R^{157}$, $R^{162}$ and $R^{163}$ each independently represent hydrogen, a halogen atom, an alkyl group having a carbon number of 1 to 10, or an alkyl group having a carbon number of 1 to 10 and having 1 to 20 fluorine atoms;

$R^{152}$, $R^{153}$, $R^{158}$, $R^{159}$, $R^{164}$ and $R^{165}$ each independently represent hydrogen, halogen atom, $R^{271}$, COOH, $COOR^{271}$, $COO^-$, $CONH_2$, $CONHR^{271}$, $CONR^{271}R^{272}$, CN, OH, $OR^{271}$, $OCOR^{271}$, $OCONH_2$, $OCONHR^{271}$, $OCONR^{271}R^{272}$, $NO_2$, $NH_2$, $NHR^{271}$, $NR^{271}R^{272}$, $NHCOR^{271}$, $NR^{271}COR^{272}$, $N{=}CH_2$, $N{=}CHR^{271}$, $N{=}CR^{271}R^{272}$, SH, $SR^{271}$, $SOR^{271}$, $SO_2R^{271}$, $SO_3R^{271}$, $SO_3H$, $SO_3^-$, $SO_2NH_2$, $SO_2NHR^{271}$, or $SO_2NR^{271}R^{272}$;

wherein $R^{271}$ and $R^{272}$ each independently represents an alkyl group having a carbon number of 1 to 10, a cycloalkyl group having a carbon number of 4 to 10, an alkenyl group having a carbon number of 2 to 10, a cycloalkenyl group having a carbon number of 4 to 10, or an alkynyl group having a carbon number of 2 to 10; and wherein a plurality of $R^{152}$, $R^{153}$, $R^{158}$, $R^{159}$, $R^{164}$ and $R^{165}$ optionally forms a ring by direct bonds or by an oxygen atom bridge, a sulfur atom bridge, an NH bridge, or an $NR^{271}$ bridge;

$R^{154}$, $R^{155}$, $R^{160}$, $R^{161}$, $R^{166}$, $R^{167}$ each independently represents a hydrogen, an alkyl group having a carbon number of 1 to 10, or an aryl group having a carbon number of 6 to 15; and a, b, c, d, e and f each independently represents an integer or 0 to 4;

(44)

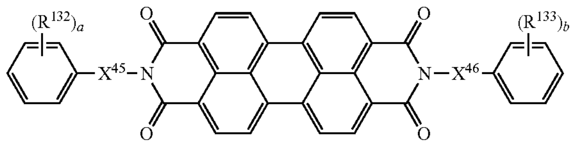

-continued (45)

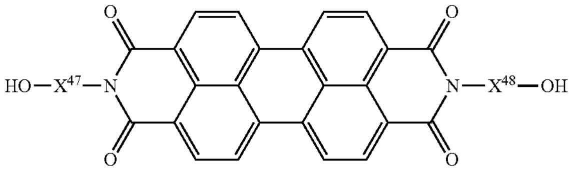

(46)

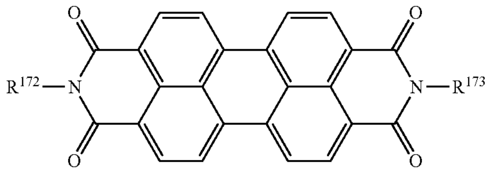

wherein in general formulas (44) to (46):

$X^{45}$, $X^{46}$, $X^{47}$ and $X^{48}$ each independently represents an alkylene chain having a carbon number of 1 to 10;

$R^{132}$ and $R^{133}$ each independently represents a hydrogen, a hydroxy group, an alkoxy group having a carbon number of 1 to 6, and an acyl group having a carbon number of 2 to 6;

$R^{172}$ and $R^{173}$ each independently represents a hydrogen or an alkyl group having a carbon number of 1 to 10; and a and b each independently represents an integer of 0 to 5.

5. The negative-type photosensitive resin composition according to claim 4, wherein the (D1a-1) black organic pigment is a (D1a-1a) benzofuranone based black pigment.

6. The negative-type photosensitive resin composition according to claim 1, wherein a content ratio of a total of, one or more species of resins selected from the (A-1) polyimide, (A-2) polybenzoxazole, (A-3) polyimide precursor, (A-4) polybenzoxazole precursor, (A-5) polysiloxane, and (A-6) cardo based resin in a total of 100 mass % of the (A) alkali-soluble resin is within a range of 50 to 100 mass %.

7. The negative-type photosensitive resin composition according to claim 1, wherein the (B) radical polymerizable compound farther contains a compound having 6 to 10 ethylenic unsaturated bond groups in a (B-2) molecule, in, an amount within a range of 1 to 49 mass %.

8. The negative-type photosensitive resin composition according to claim 7, wherein the compound having five ethylenic unsaturated bond groups in the (B-1) molecule is a compound represented by general formula (5) below, and wherein the compound having 6 to 10 ethylenic unsaturated bond groups in the (B-2) molecule is a compound represented by general formula (7) below:

(5)

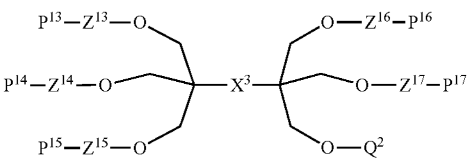

-continued (6)

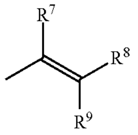

wherein in general formula (5), $X^3$ represents a bivalent organic group; $Z^{13}$ to $Z^{17}$ each independently represent a direct bond, a carbonyl group, an alkylene group halting a carbon number of 1 to 10, or an arylene group having a carbon number of 6 to 15; $P^{13}$ to $P^{17}$ each independently represent a substituent represented by general formula (6) mentioned below; $Q^2$ represents hydrogen, an alkyl group having a carbon number of 1 to 10, or an aryl group having a carbon number of 6 to 15;

wherein in general formula (6), $R^7$ to $R^9$ each independently represent hydrogen, an alkyl group having a carbon number of 1 to 10, or, an aryl group having a carbon number of 6 to 15;

(7)

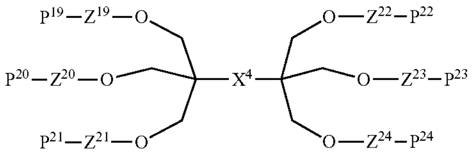

(8)

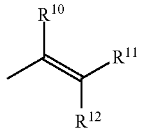

wherein in general formula (7), $X^4$ represents a bivalent organic group; $Z^{19}$ to $Z^{24}$ each independently represent a direct bond, a carbonyl group, an alkylene group having a carbon number of 1 to 10, or an arylene group having a carbon number of 6 to 15; $P^{19}$ to $P^{24}$ each independently represent a substituent represented by general formula (8);

wherein in general formula (8), $R^{10}$ to $R^{12}$ each independently represent hydrogen, an alkyl group having a carbon number of 1 to 10, or an aryl group having a carbon number of 6 to 15.

9. The negative-type photosensitive resin composition according to claim 1, wherein the (B) radical polymerizable compound contains the compound having five ethylenic unsaturated bond groups in the (B-1) molecule, in an amount within a range of 71 to 99 mass %.

10. A cured film obtained by curing the negative-type photosensitive resin composition according to claim 1.

11. A display device comprising the cured film according to claim 10.

12. The display device according to claim 11, comprising a display unit having a curved surface, wherein a radius of curvature of the curved surface is within a range of 0.1 to 10 mm; and wherein an optical density per 1 μm of the cured film thickness is within a range of 0.3 to 5.0; and wherein a taper angle of an inclined side of a cross section of the cured pattern is within a range of 1 to 60°.

13. A production method for a display device, comprising:

(1) a step of forming a film of the negative-type photosensitive resin composition according claim 1 on a substrate;

(2) a step of irradiating the negative-type photosensitive resin composition formed as the film with a chemical active ray via a photomask and then forming a pattern by using an alkali solution; and (3) a step of forming a cured pattern by heating the pattern.

14. The negative-type photosensitive resin composition according to claim 1, wherein the (A) alkali-soluble resin contains one or more species of resins selected from a (A-1) polyimide, a (A-2) polybenzoxazole, a (A-3) polyimide precursor, a (A-4) polybenzoxazole precursor, and a (A-6) cardo based resin.

15. The negative-type photosensitive resin composition according to claim 14, wherein a content ratio of a total of one or more species of resins selected from the (A-1) polyimide, (A-2) polybenzoxazole, (A-3) polyimide precursor, (A-4) polybenzoxazole precursor, and (A-6) cardo based resin in a total of 100 mass % of the (A) alkali-soluble resin is within a range of 50 to 100 mass %.

16. The negative-type photosensitive resin composition according to claim 1, wherein the (B) radical polymerizable compound contains the compound having five ethylenic unsaturated bond groups in the (B-1) molecule, in an amount within a range of 61 to 99 mass %.

17. The negative-type photosensitive resin composition according to claim 1, wherein the (B) radical polymerizable compound further contains a compound having 2 to 4 ethylenic unsaturated bond groups in a (B-3) molecule in an amount within a range of 1 to 49 mass %.

18. The negative-type photosensitive resin composition according to claim 1, wherein the (A) alkali-soluble resin contains one or more species of resins selected from a (A-1) polyimide, a (A-2) polybenzoxazole, a (A-3) polyimide precursor, and a (A-4) polybenzoxazole precursor.

19. The negative-type photosensitive resin composition according to claim 18, wherein the (A-1) polyimide, the (A-2) polybenzoxazole, the (A-3) polyimide precursor, and the (A-4) polybenzoxazole precursor in the (A) alkali-soluble resin contain a structural unit having a fluorine atom, in an amount of 30 to 100 mol % of entire structural units.

20. The negative-type photosensitive resin composition according to claim 1, further comprising a (D) coloring agent, wherein the (D) coloring agent contains a (Da) black coloring agent, wherein the (Da) black coloring agent consists of one or more species selected from a (D1a-1) black organic pigment, a (D1a-2) black inorganic pigment, and a (D1a-3) mixture of two or more coloring pigments, wherein further contains an (E) dispersant and a solvent, wherein the (E) dispersant contains any one of a dispersant having an amine value alone, a dispersant having an amine value and an acid value, a dispersant having a structure in which an amino group and/or an acidic group form a salt together with an acid and/or a base, wherein the solvent contains a solvent having a carbonyl group or an ester bond, and wherein the solvent having a carbonyl group or an ester bond contains a solvent having an acetate bond.

* * * * *